United States Patent [19]
Borras et al.

[11] 4,403,342
[45] Sep. 6, 1983

[54] ZONE SWITCHING SYSTEM FOR A FREQUENCY SYNTHESIZED TRANSCEIVER

[75] Inventors: Jaime A. Borras, Hialeah; Ruben J. Gonzalez, Miami, both of Fla.; Daniel M. Smith, Schaumburg, Ill.; Alfred B. Wieczorek, Plantation, Fla.

[73] Assignee: Motorola, Inc., Schaumburg, Ill.

[21] Appl. No.: 251,644

[22] Filed: Apr. 6, 1981

[51] Int. Cl.³ .............................................. H04B 1/40
[52] U.S. Cl. ...................................... 455/76; 455/33; 455/77; 455/186
[58] Field of Search ...................... 455/33, 76, 77, 185, 455/186, 183

[56] References Cited
U.S. PATENT DOCUMENTS

| | | | |
|---|---|---|---|
| 4,070,626 | 1/1978 | Binder et al. | 455/76 |
| 4,236,251 | 11/1980 | Ohgishi et al. | 455/186 |
| 4,254,504 | 3/1981 | Lewis et al. | 455/76 |

Primary Examiner—Jin F. Ng
Attorney, Agent, or Firm—Joseph T. Downey; James W. Gillman; Edward M. Roney

[57] ABSTRACT

A frequency synthesized transceiver capable of tuning to a plurality of communication channels is disclosed. The transceiver includes a receiver section and a transmitter section which are coupled to the synthesizer which generates the appropriate injection signals to achieve tuning. The frequency synthesizer includes a multiposition switch which accesses various addressable memory locations in a programmable read-only memory where the appropriate divisors are stored to cause tuning of the synthesizer to the appropriate communication channel. A zone selector switch enables grouping and easy retrievability of channels. The divisors are supplied to a single synchronous binary swallow counter which works in conjunction with a dual modulus prescaler to monitor the frequency output of the voltage controlled oscillator. A programmable divider coupled to a reference oscillator source is compared with the output of the synchronous counter in a digital and analog phase detector. The phase detector supplies signals through a loop filter to apply the appropriate voltage to the voltage controlled oscillator. The phase detector includes means to rapid advance the voltage controlled oscillator to cause frequency tuning.

7 Claims, 52 Drawing Figures

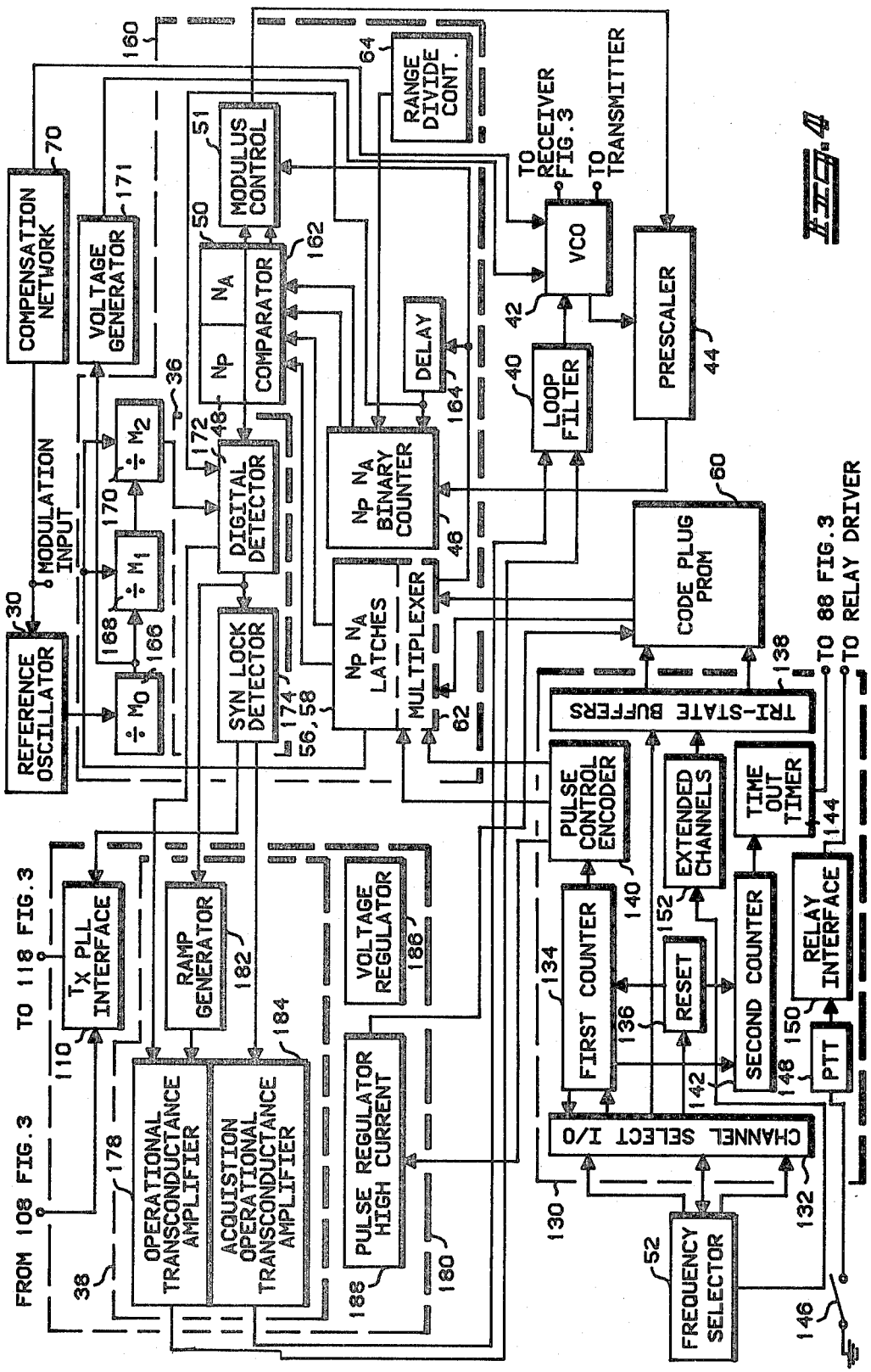

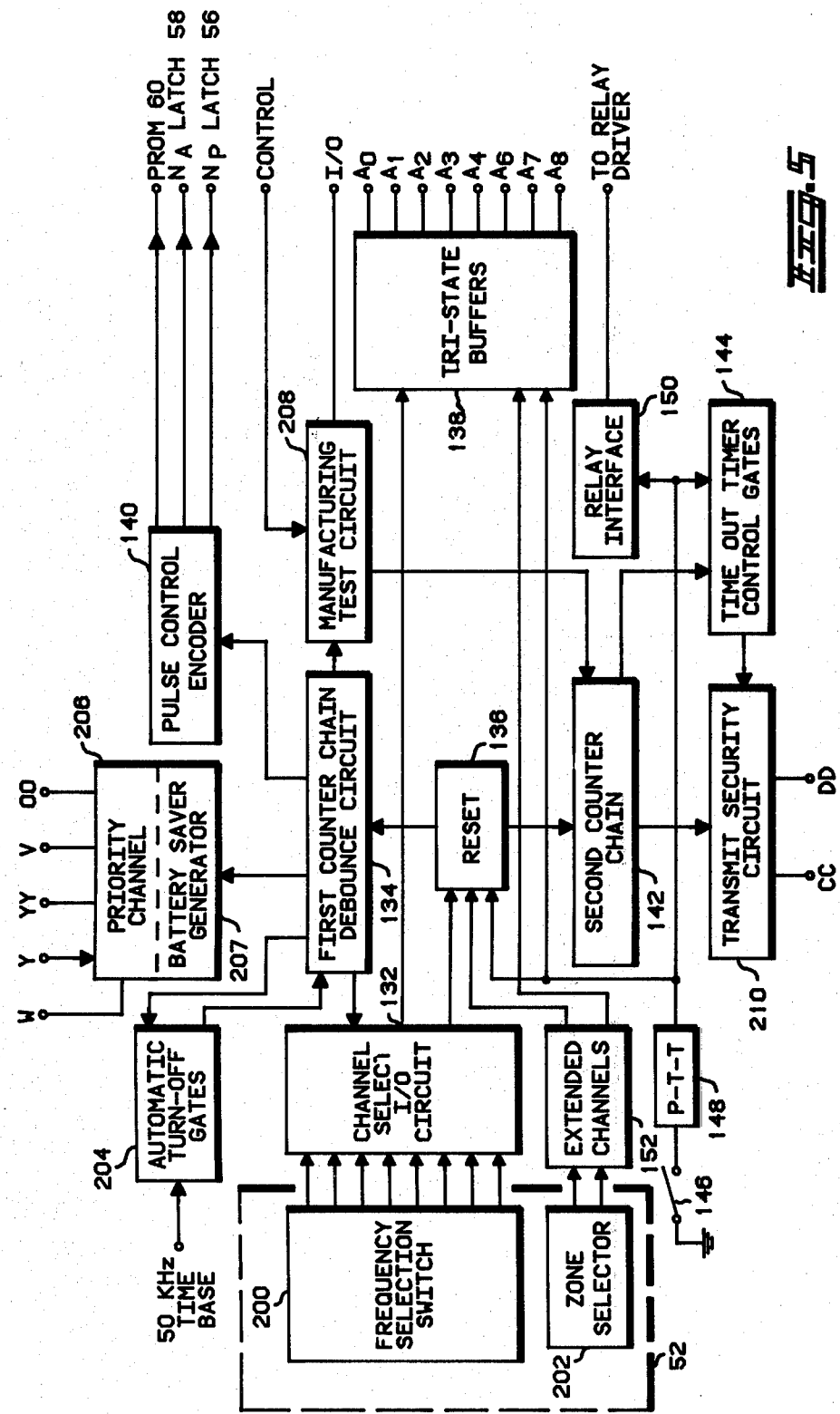

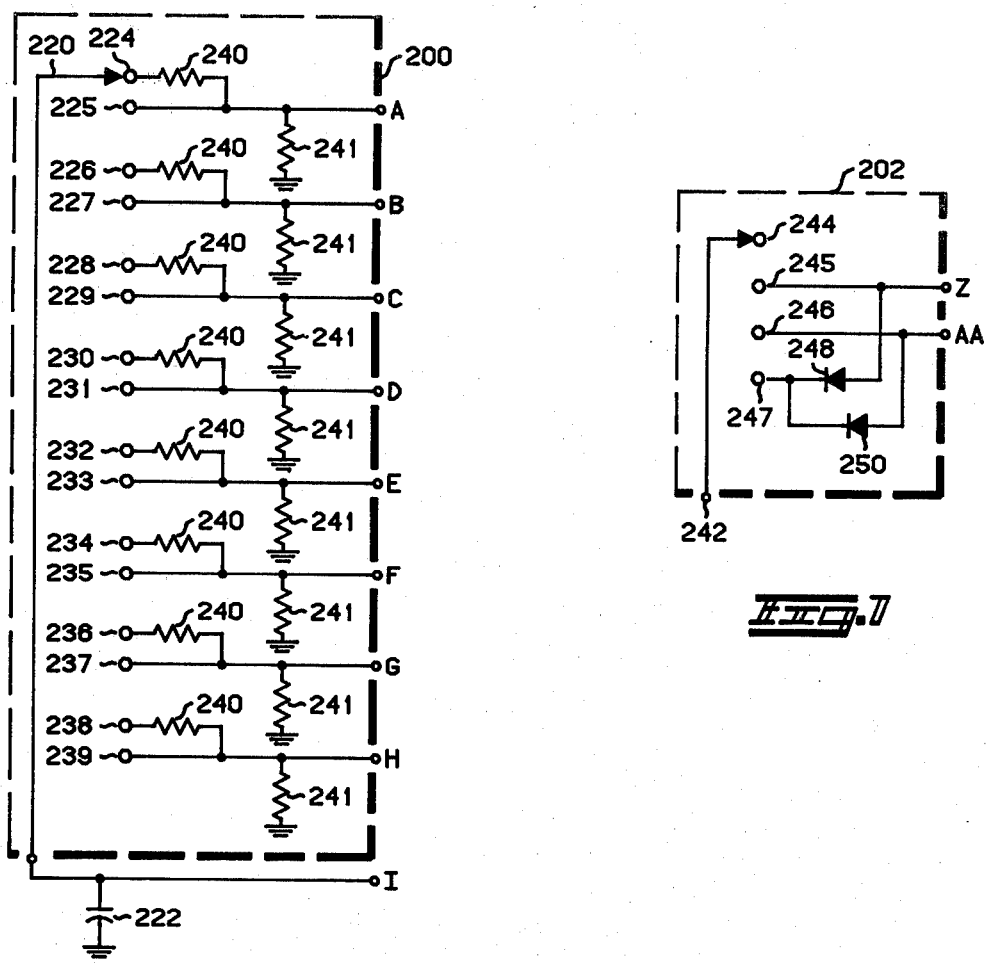
Fig.6A
Fig.7
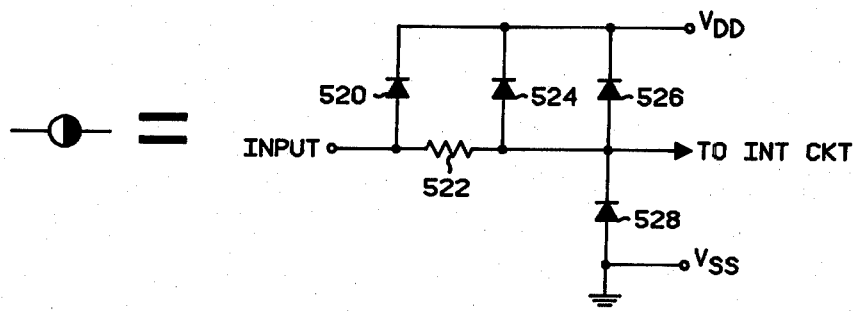
Fig.10

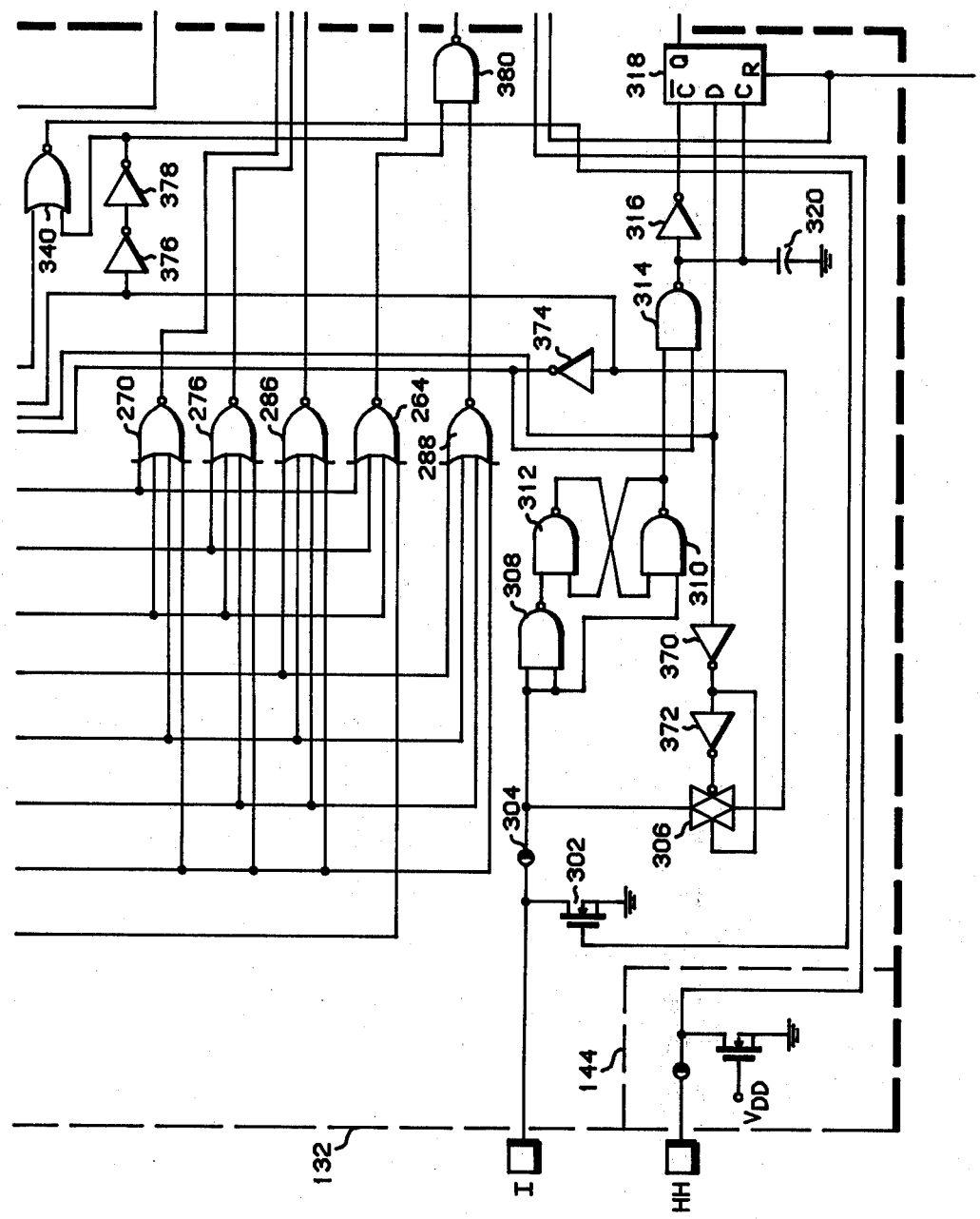

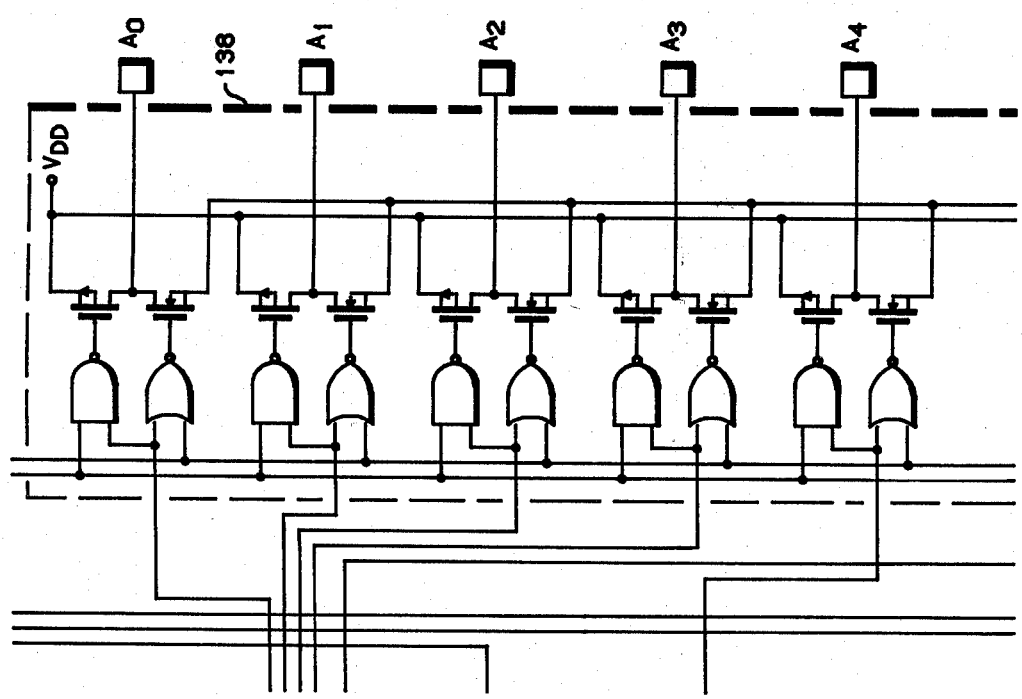

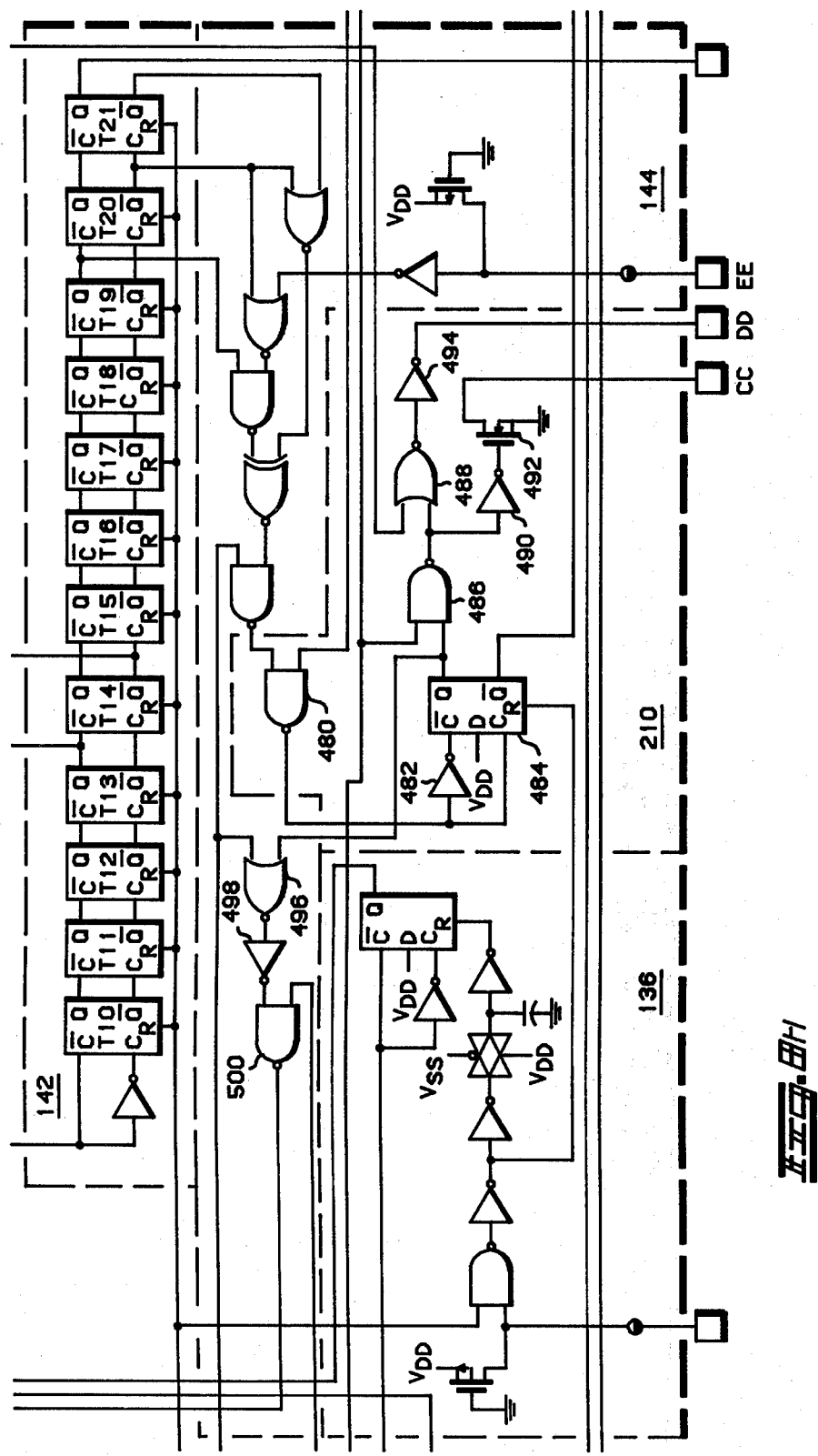

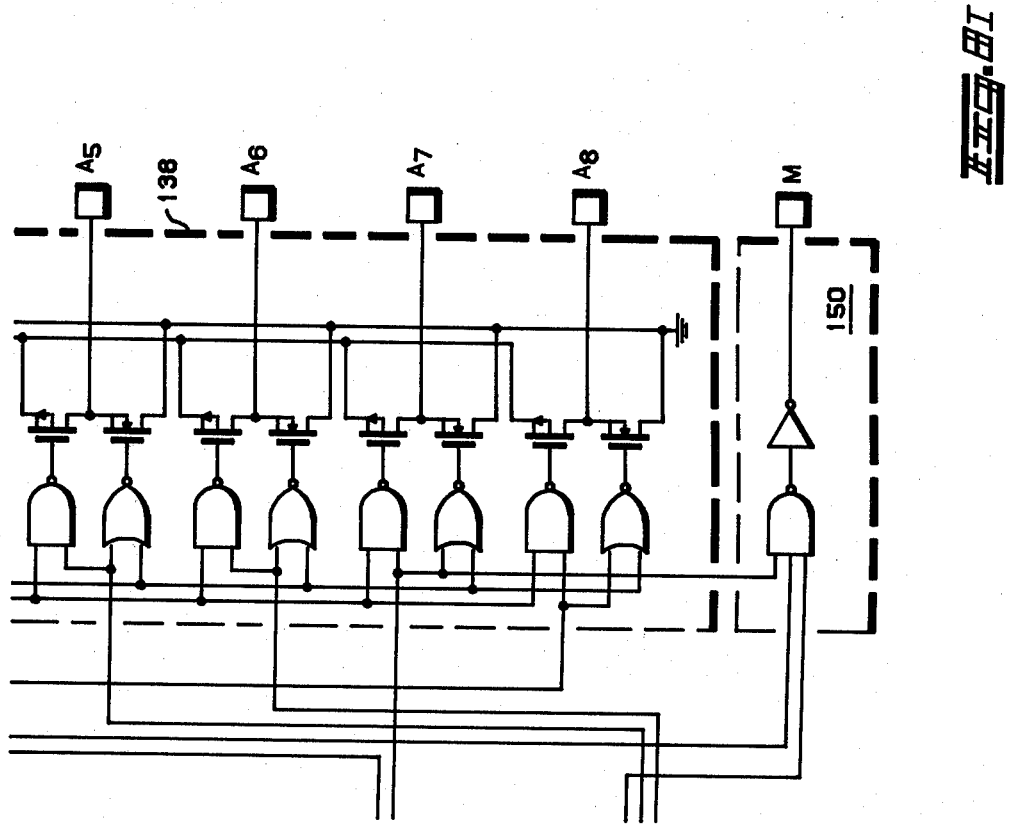

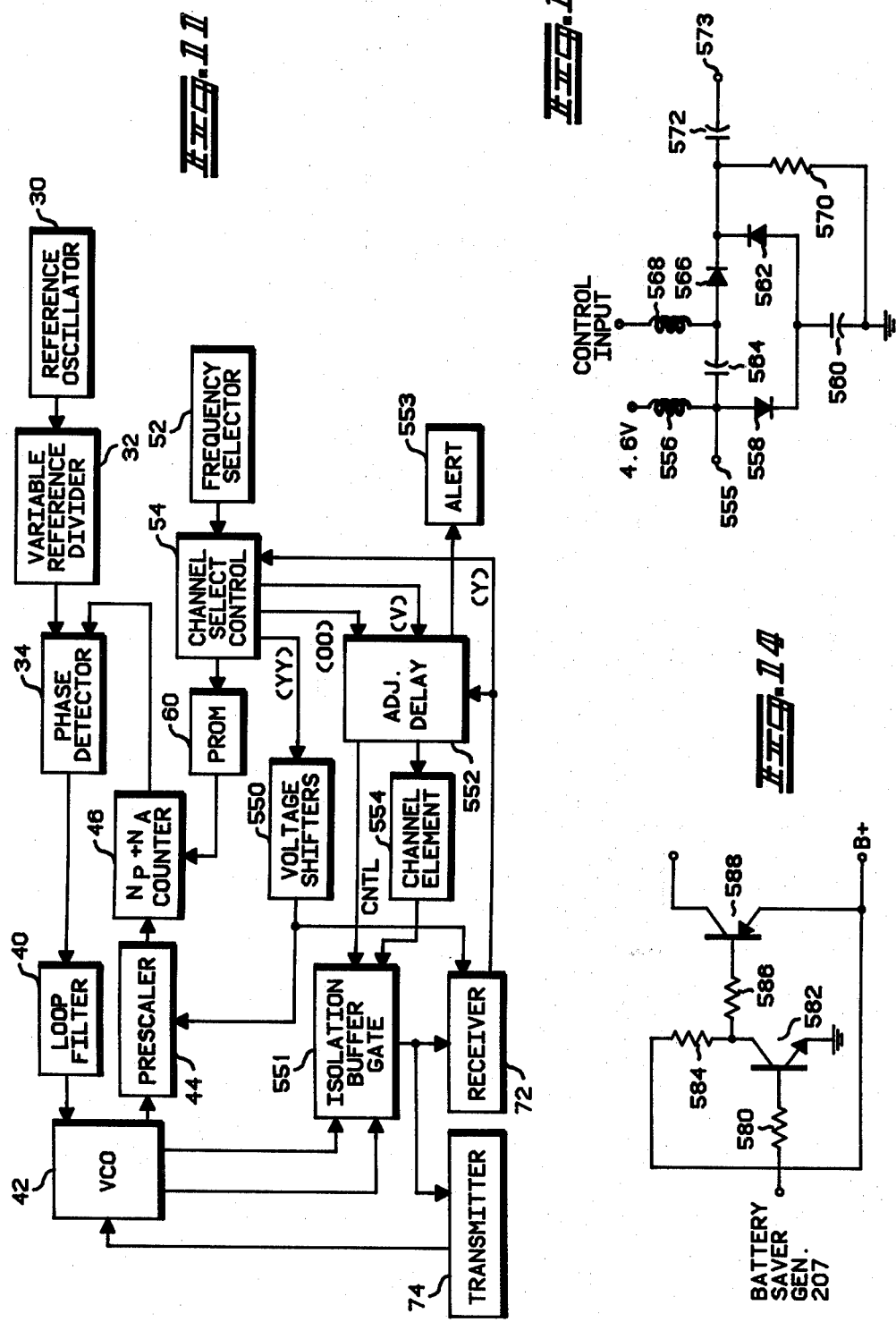

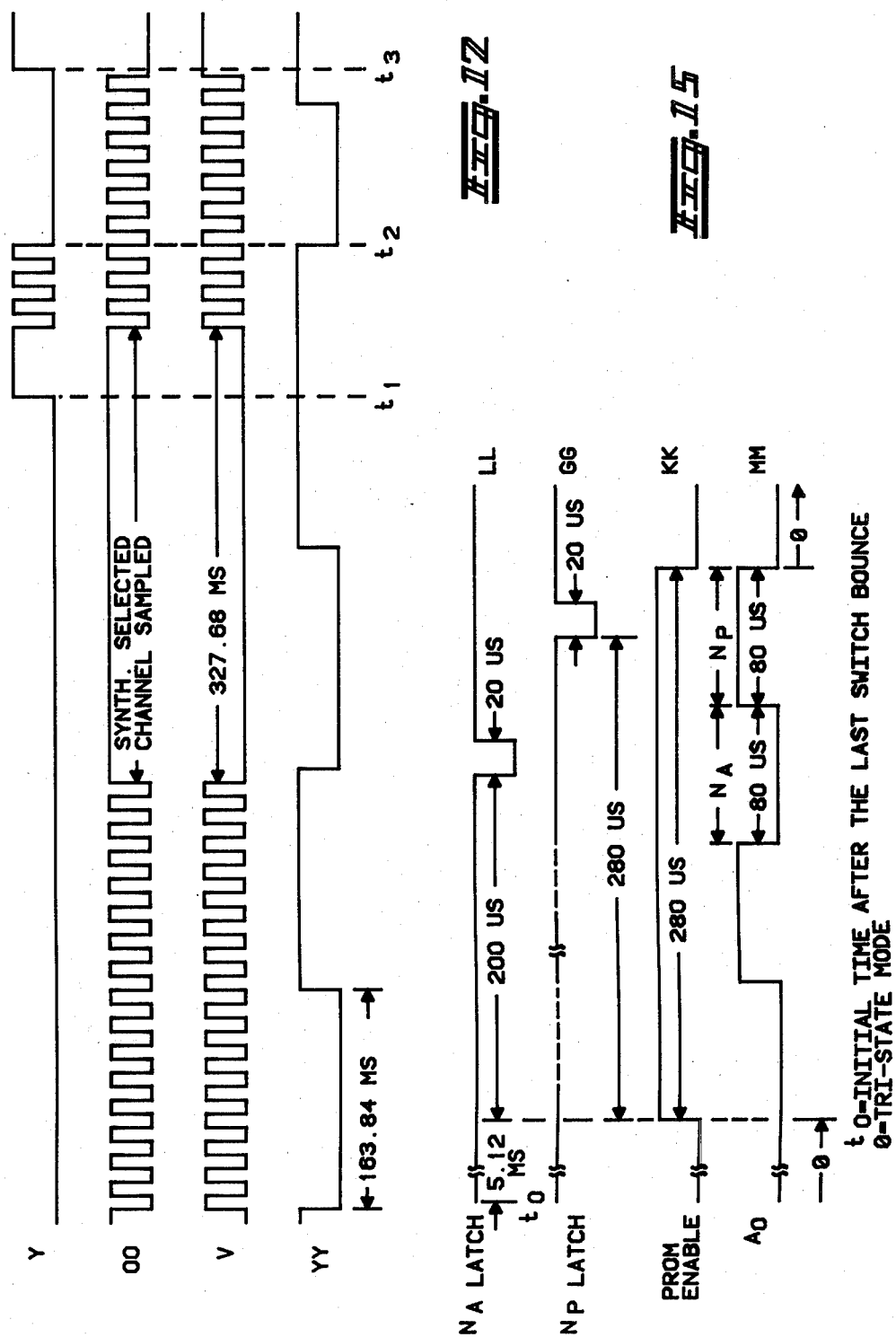

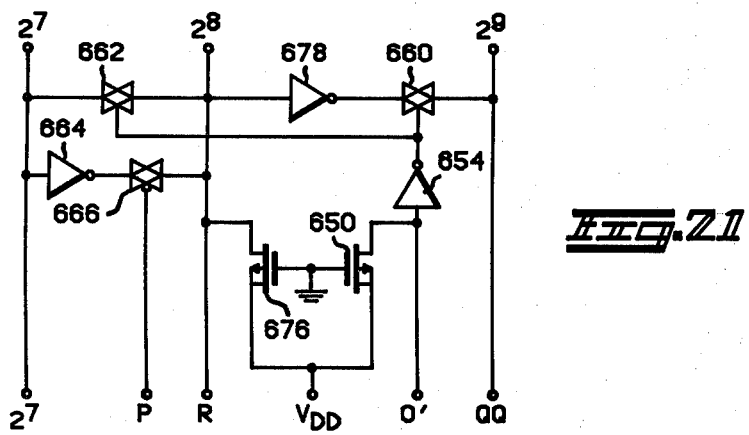

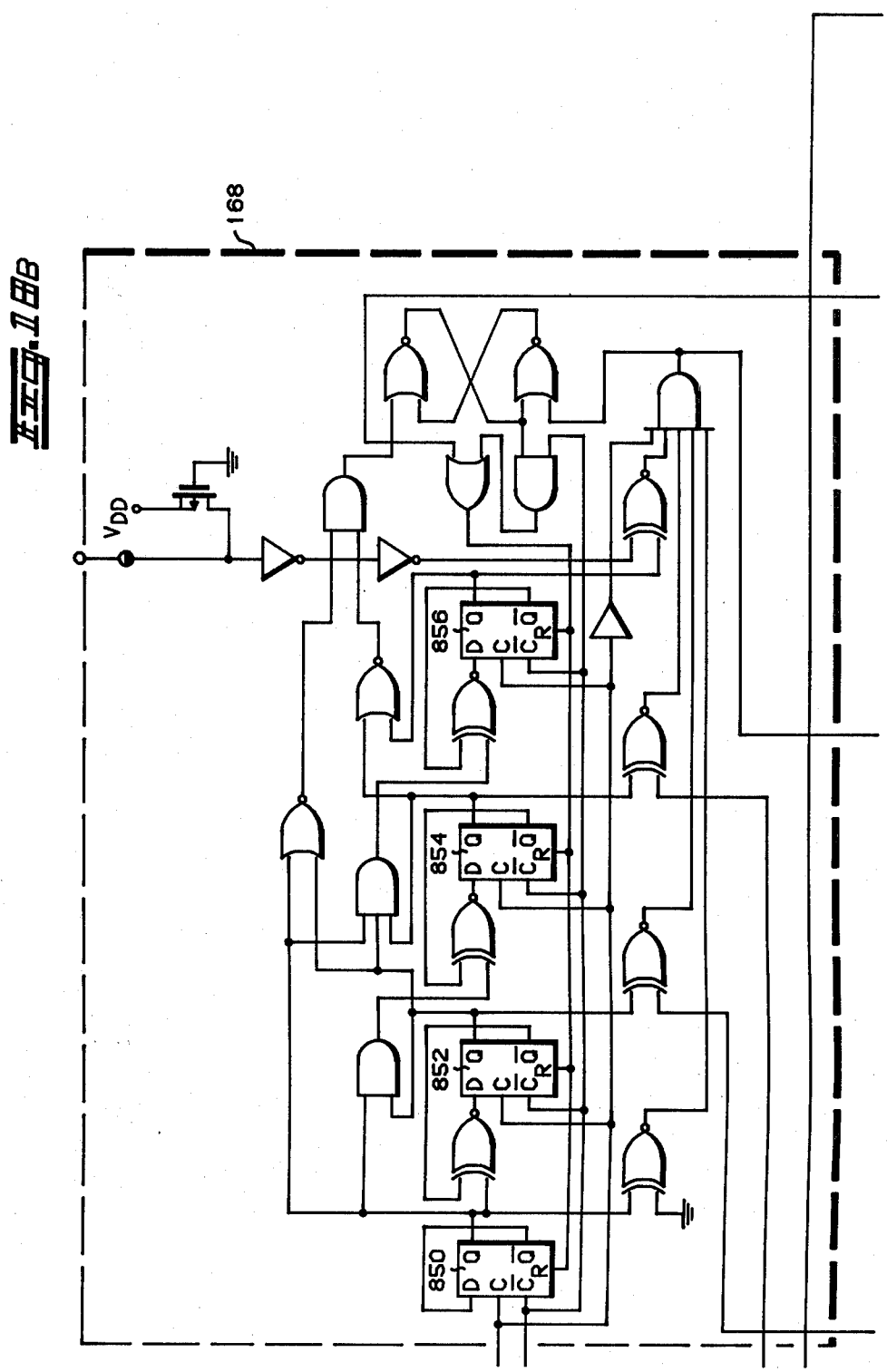

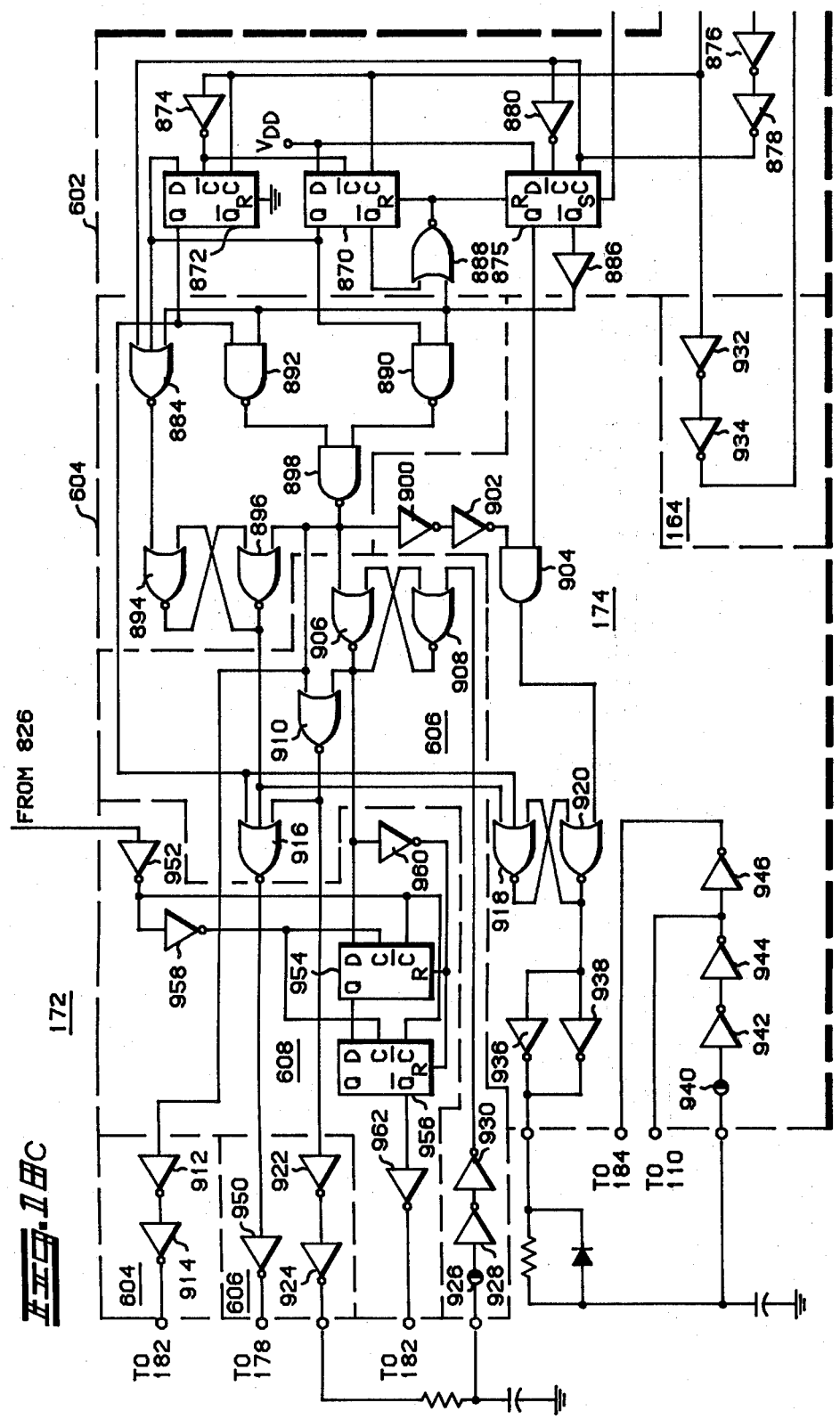

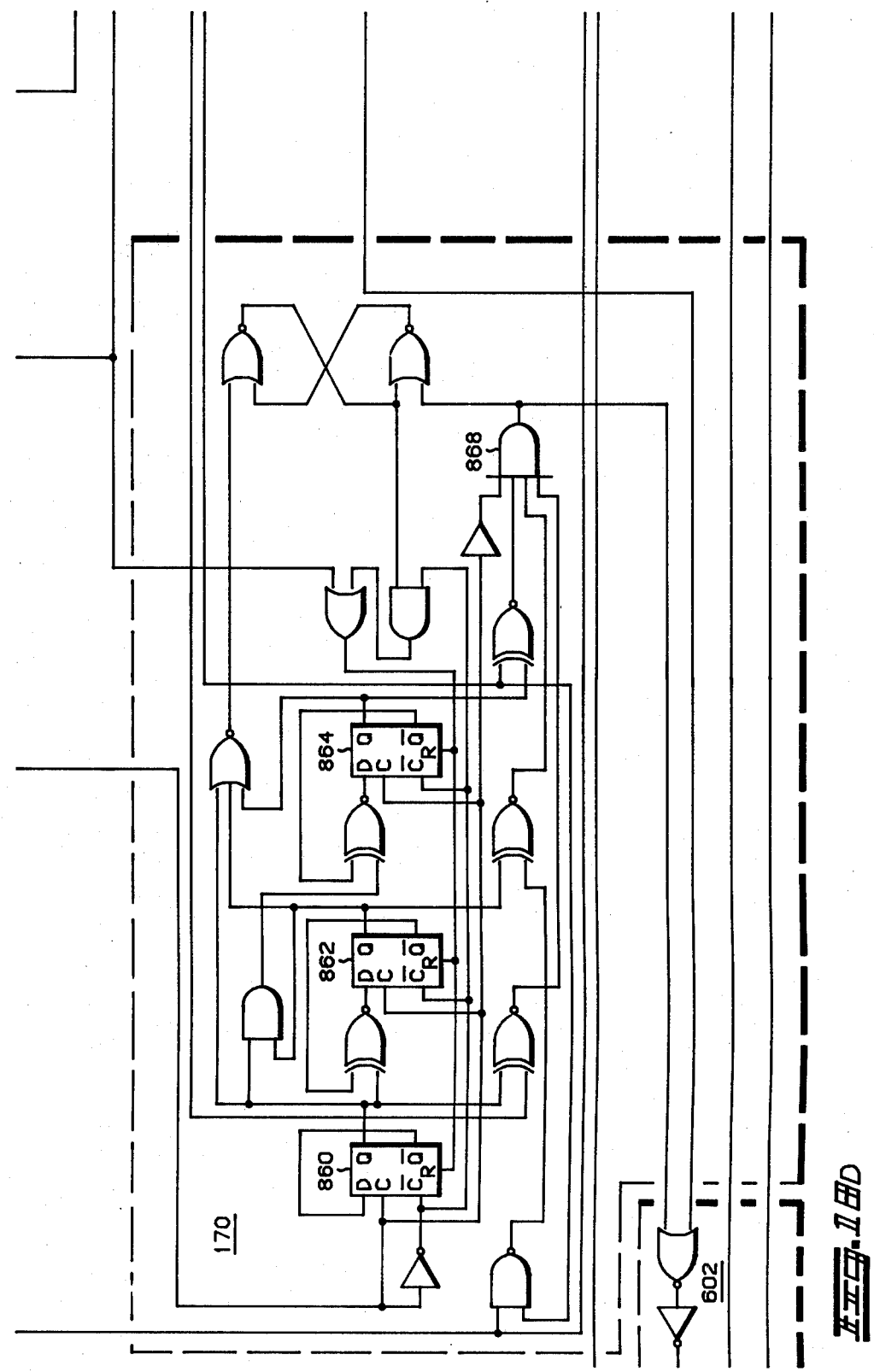

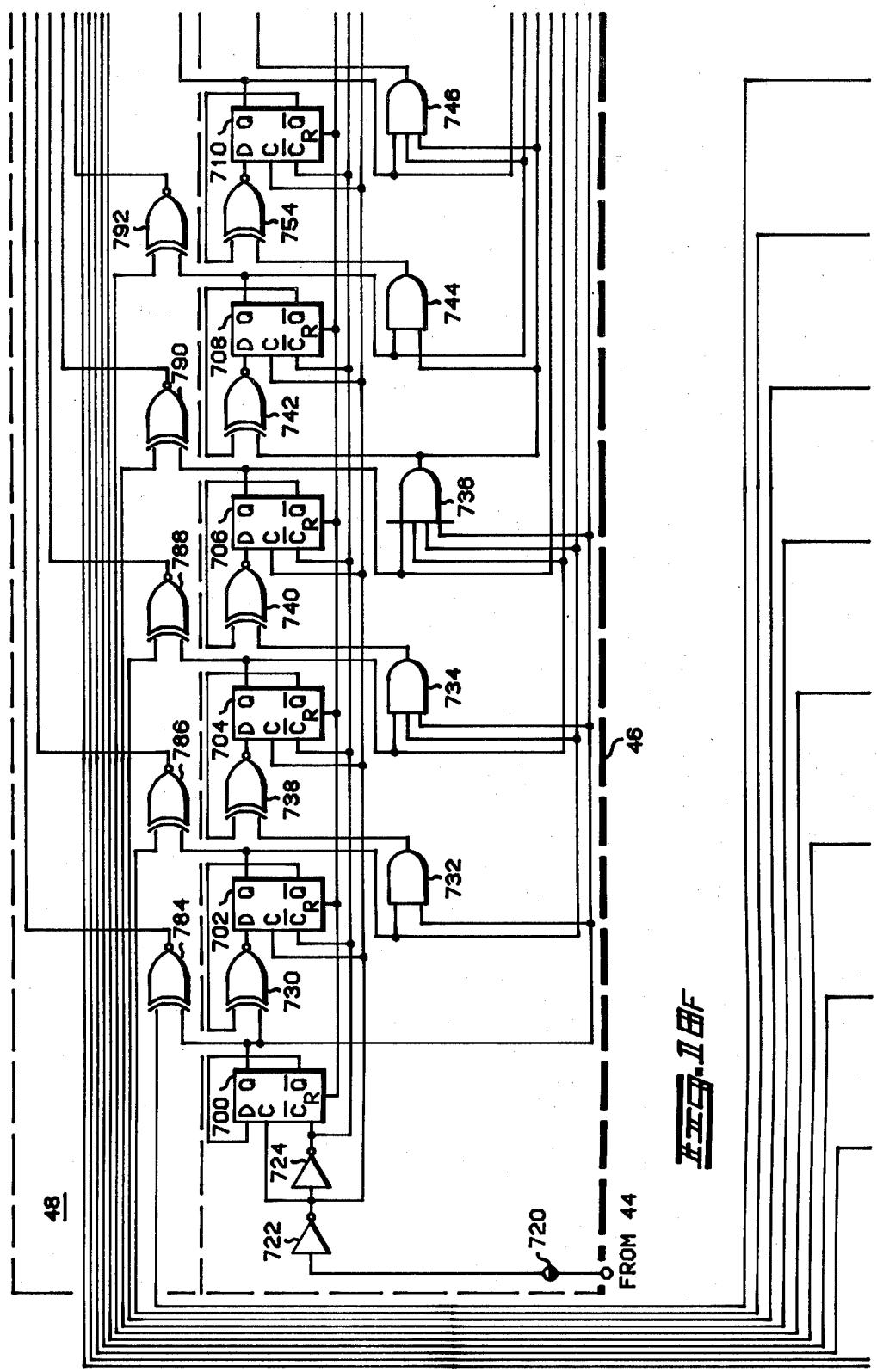

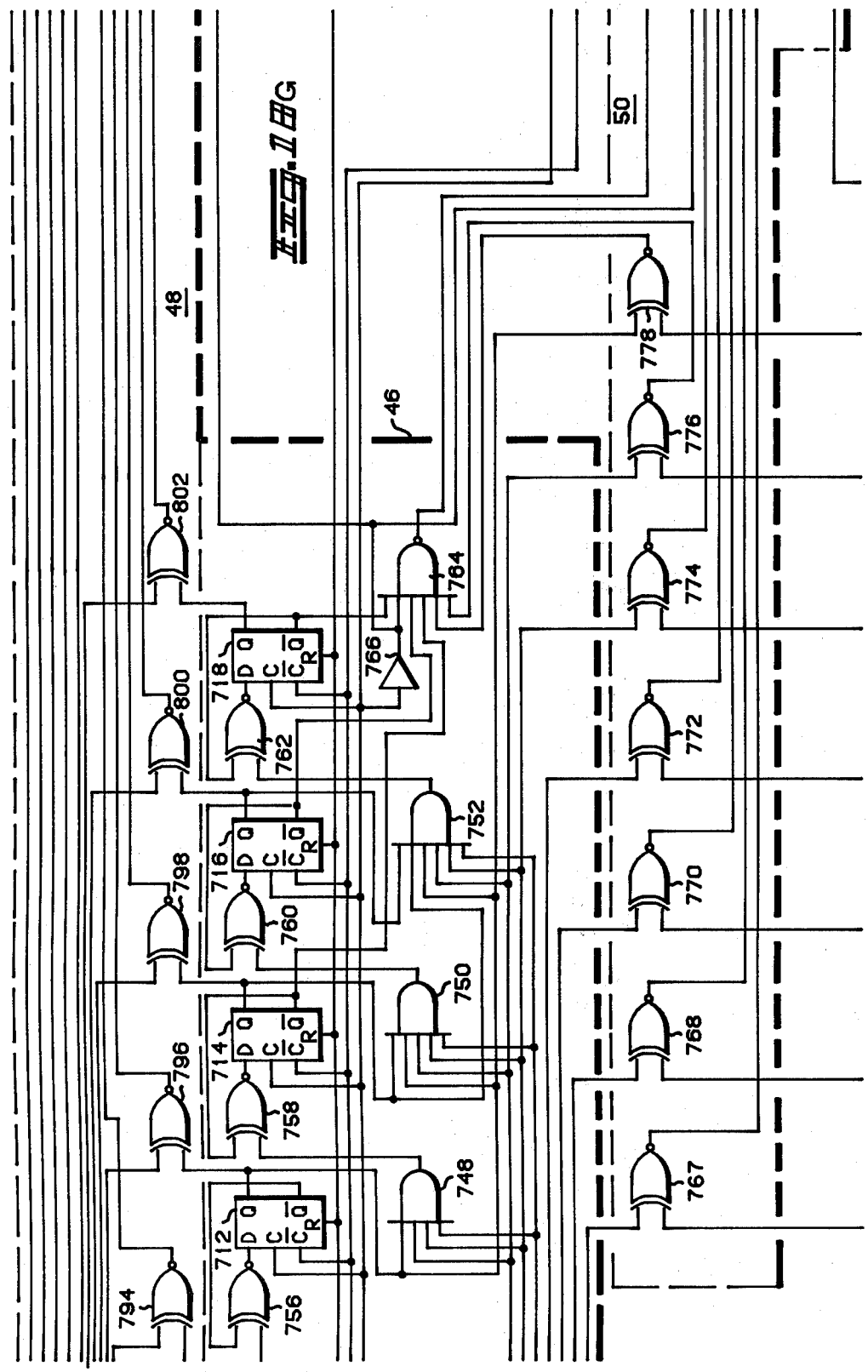

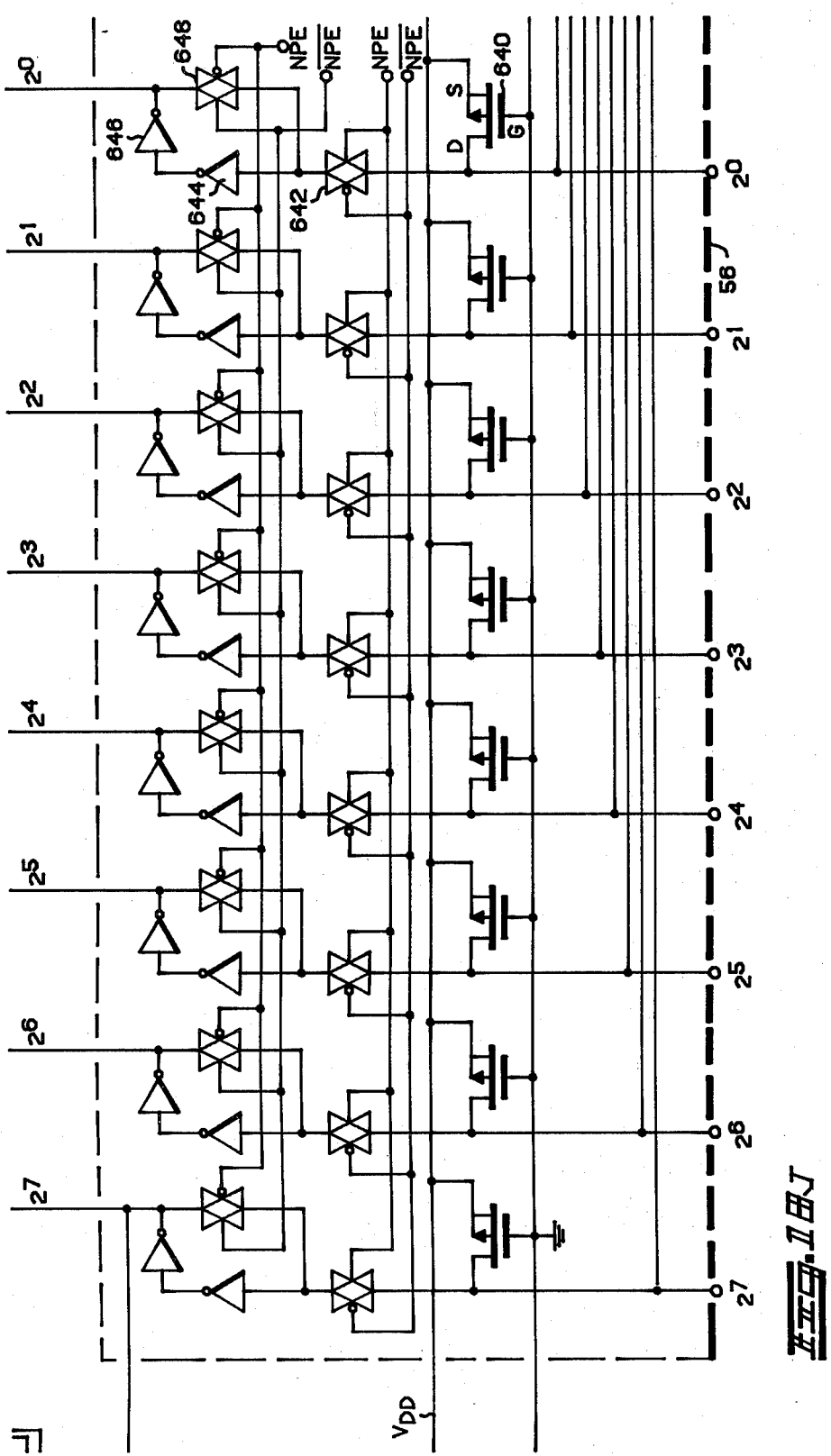

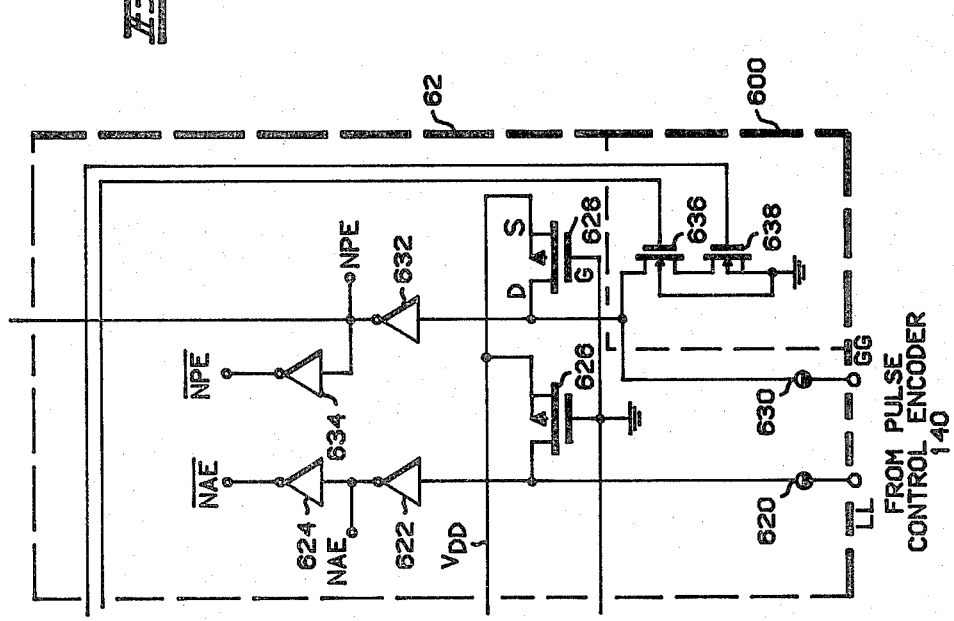

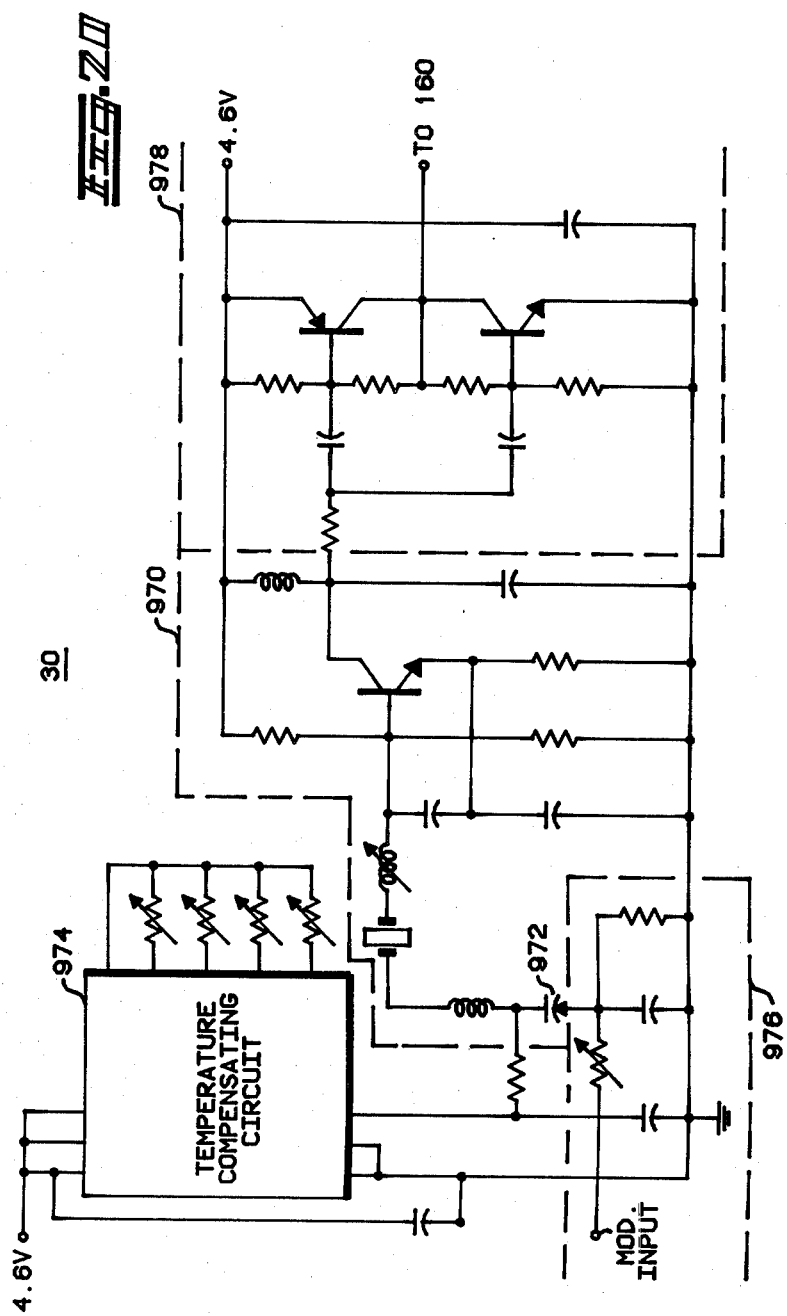

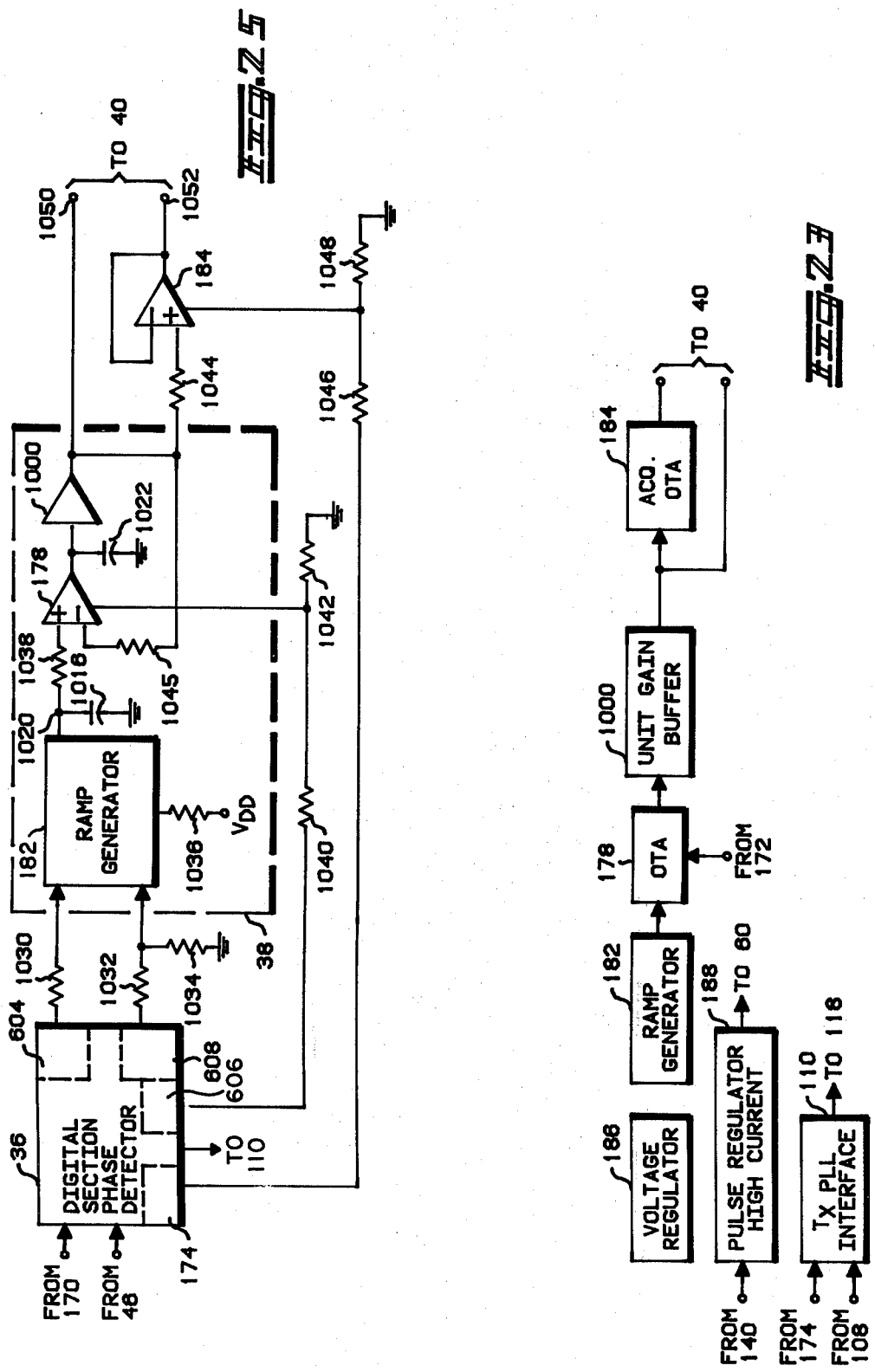

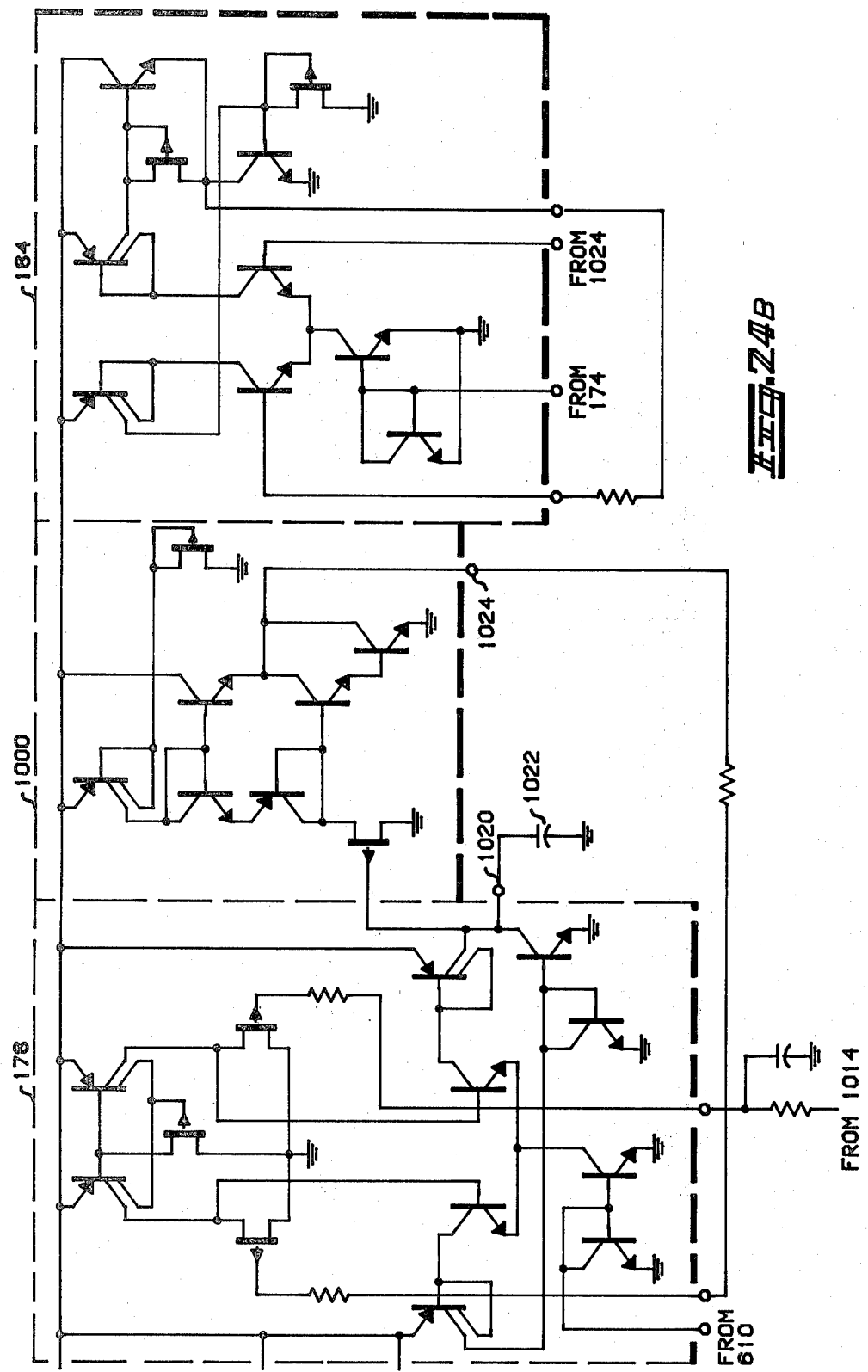

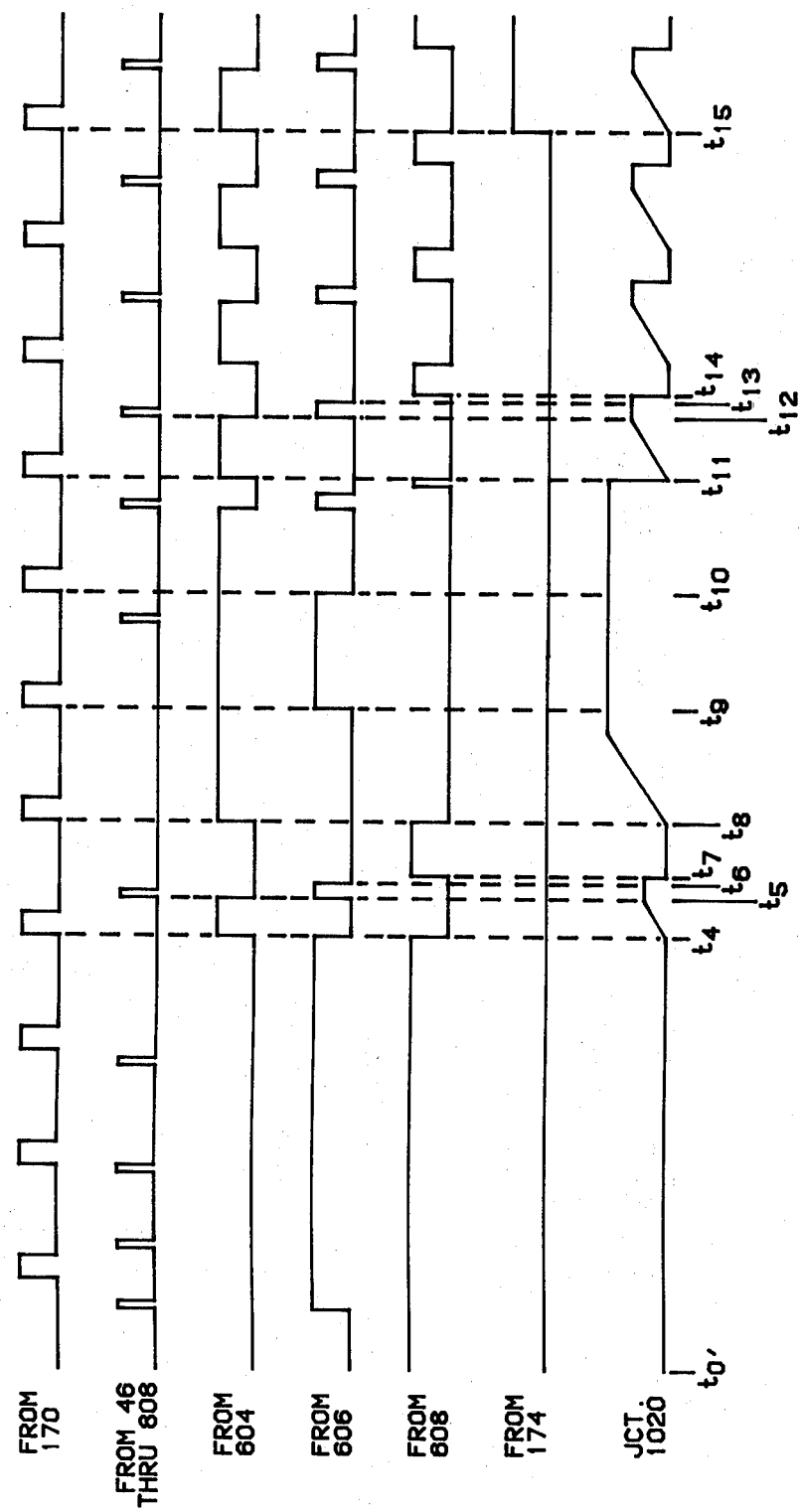

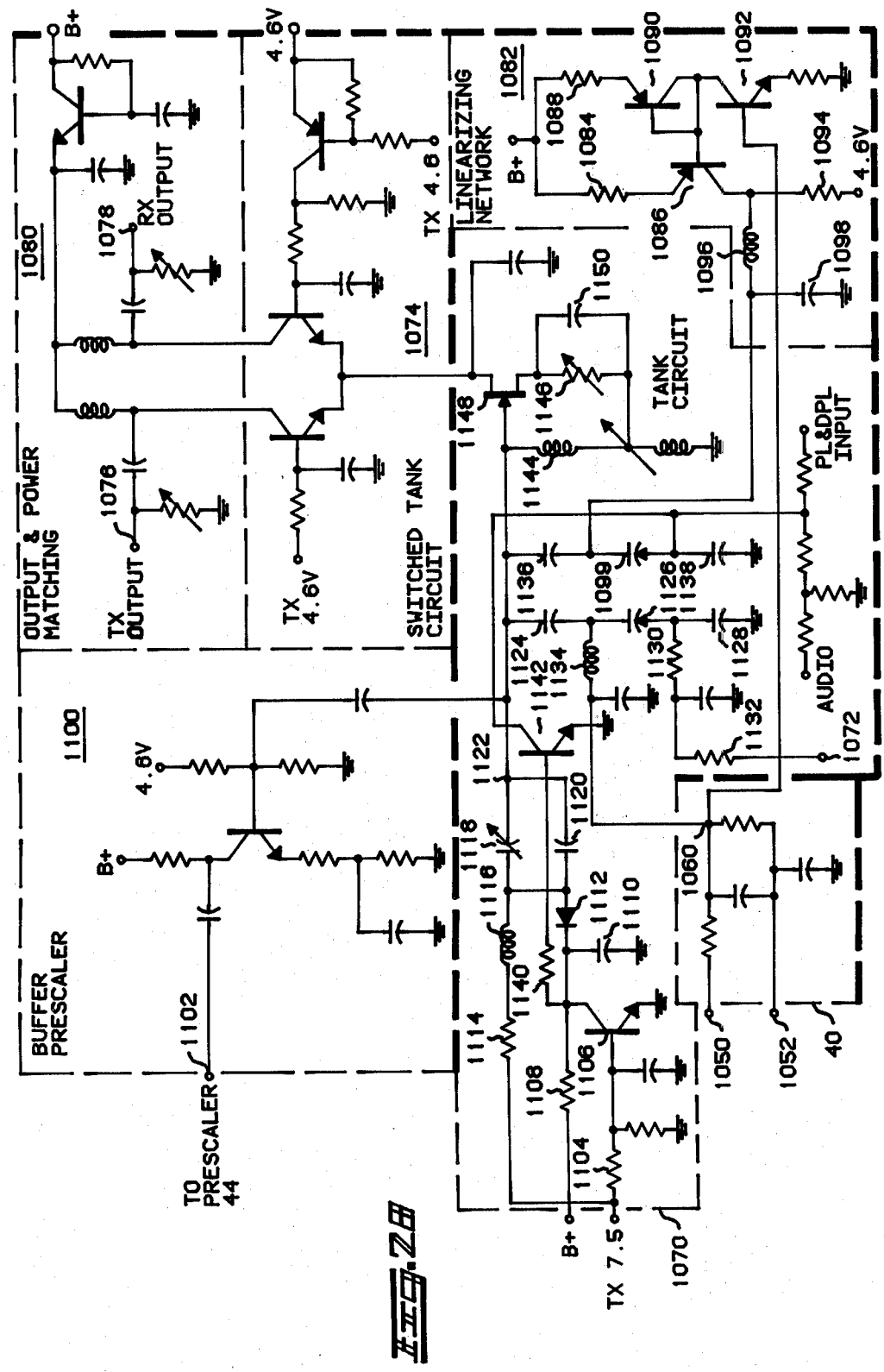

ZONE SWITCHING SYSTEM FOR A FREQUENCY SYNTHESIZED TRANSCEIVER

BACKGROUND OF THE INVENTION

1. Field of the Invention

This invention relates generally to the field of frequency synthesizer systems and more particularly to such systems for use in communication transceivers. It further relates to a zone switching system for synthesized transceivers.

2. Description of the Prior Art

It is recognized that for many years there has been an ever increasing demand for FM two-way portable radios. This stems from the increasing use of portable radio communications in business, industry and government. The level of sophistication of the communication networks utilized by various institutions has constantly risen and many networks utilize some frequencies for local communications and other frequencies for longer range communications to a central location.

With the increasing use by many institutions of more sophisticated communications systems has come the demand for the capability of the portable transceivers to operate over a much larger number of frequencies. The majority of two-way FM portable radios currently in use today are those which employ conventional crystal controlled frequency channel elements. Thus, as each portable radio is required to either transmit or receive on more than one frequency an additional crystal controlled channel element must be included and electrically actuated so that both transmission and/or reception can occur.

As is the case with the several networks or systems, many different frequency combinations are grouped into communication channels from the available frequencies within a given area. Thus, any portable transceiver customer must specify to the manufacturer the desired pairs of receive and transmit frequencies for the several communication channels which are required in portable transceivers for a selected area. With such an order, the corresponding crystals to enable two-way communication on those channels must be manufactured and inserted into the transceiver. Frequently, design modifications must be made to accomodate the additional channel elements resulting in an increased size and weight of unit and a greatly increased cost.

The required long lead time for the manufacture of multifrequency transceivers to meet the market demand has caused a general trend toward the use of frequency synthesis in the design of FM two-way portable radios. A high order of accuracy of frequency control for a transceiver may be achieved by crystal control of the conversion oscillator. However, the multiple-frequency operation of the transceiver would call for a large number of crystals which is especially true where the transmit and receive frequencies are not identical. This difficulty may be reduced for certain frequency combinations by the use of a switched crystal frequency generator, a device in which the harmonics and subharmonics of one or more oscillators are mixed to provide a multiplicity of output frequencies. All of the resulting output frequencies are harmonically related to a subharmonic of the one or more master oscillators. The combination of a master oscillator signal with a secondary signal in a suitable mixer can provide the choice of a number of controlled frequencies. This reduces the number of crystals necessary to achieve several controlled frequencies.

However, there remains the difficulty of having only a restricted set of possible frequency combinations, whereas the customer may require unique combinations for his communication network. If a stable variable-frequency oscillator is substituted for a fixed crystal oscillator and a digital frequency synthesis technique is employed, a virtually unlimited number of discrete frequencies directly related to the frequency of the master oscillator are available. Instead of providing a plurality of individual channel elements suitable for each individual user's purpose, a manufacturer can provide one or more crystal controlled oscillators and a programmable memory which can be modified at the factory to conform to an individual user's required frequencies. This enables a manufacturer to assemble virtually all of his transceiver units in the same way and near the last step in the manufacturing process insert the memory programmed to the individual user's frequency requirements.

As will be described in greater detail, the programmable memory provides a series of numerical divisors which modify an output signal from a voltage controlled oscillator to cause tuning to any of a number of various frequencies. The use of digital frequency synthesizers is known in the art of radio transmitters and receivers but it has only recently been incorporated into the operation for two-way portable radios.

One of the basic problems with the use of frequency synthesized portable radios is the limited power available for the portable hand-held units. Thus, any frequency synthesis system must not be wasteful of the limited battery capacity available in the portable units. In addition, it has been found that various design implementations of digital frequency synthesizers do not meet the rigid specifications which are applied to radios which employ crystal controlled channel elements. It is well recognized in the art that crystal controlled channel elements produce extremely well defined frequencies. Digital frequency synthesizers can provide the same degree of accurate tuning as can the crystal controlled channel elements. But, the replacement of crystal controlled channel elements by a frequency synthesis system might ordinarily result in some degradation in the performance specification as, for example, adjacent channel selectivity.

The problem is therefore to find a digital frequency synthesized transceiver system for portable transceivers which will provide the size reduction, cost efficiency, power conservation and programmability that a multitude of users require yet can stay within the rigid performance specifications that apply to the use of crystal controlled elements.

Although too general and therefore not suitable to solve the problem, a block diagram of a known digital frequency synthesizer is shown in FIG. 1. A basic element of frequency synthesis systems is the phase-lock loop circuit in which the output of a voltage-controlled oscillator (VCO) is constantly compared with the frequency of the master crystal oscillator. Any unwanted change or drift in frequency of the variable controlled oscillator with respect to the master oscillator is detected by the phase comparator. When such a phase difference exists, the phase detector generates a control voltage which returns the VCO to the correct frequency.

Normally, the output signal of the master crystal oscillator is applied to a frequency divider that divides that signal by a fixed integer M and provides a square-wave output reference signal at 1/Mth the frequency of the master oscillator. Similarly, the output signal of the voltage-controlled oscillator is divided by a variable divider in which produces a signal at 1/Nth the frequency of the VCO. This signal is compared with a reference signal which may be a square wave from the fixed M divider in a phase comparator. Any phase difference is detected and applied through an integrating circuit and a low-pass filter to the voltage-controlled oscillator. This phase difference signal, after being processed and filtered provides a DC control voltage that is highest when the phase difference is greatest. When the signals are equal and in phase in the comparator, the loop is said to be "locked."

The output frequency of the synthesizer can be changed by varying the divide ratio of the variable divider N. When a new frequency is within the capture range of the phase-locked loop, the control voltage will change to bring the frequency of the VCO to the new value demanded by the setting of the variable divider. If a new frequency is outside the capture range of the circuit, the VCO will be swept through its entire operating range, and as the VCO frequency then enters the capture range of the phase-locked loop, the loop will take over frequency control and lock on the desired frequency.

SUMMARY OF THE INVENTION

It is an object of the present invention to provide a convenient human interface for a synthesized transceiver.

It is another object of the present invention to provide a system which enables the classification of communication channels in easily accessible locations.

In a frequency synthesized transceiver including a multiposition switch addressing frequency information contained in a memory for causing the frequency synthesizer to tune to various communication channels, a zone switching apparatus comprises a zone selector switch coupled to the memory means causing the multiposition switch to access a different portion of the memory thereby altering the correspondence between positions of the multiposition switch and the frequency to which the frequency synthesized transceiver may be tuned.

BRIEF DESCRIPTION OF THE DRAWINGS

FIG. 4 is a detailed functional block diagram of the frequency synthesizer system of the present invention including the subdivision of the several functions onto several integrated circuits.

FIG. 5 is a functional block diagram of the user interfaced frequency selection and control portion of the frequency synthesizer system.

FIG. 7 is an electrical schematic for the zone selection switch for the frequency synthesizer.

FIGS. 8A-I show an electrical schematic of the frequency selection and control portion of the frequency synthesizer.

FIG. 9 shows the correct arrangement for FIGS. 6A-I.

FIG. 10 is an electrical schematic of a protection circuit used in FIGS. 6A-I.

FIG. 11 is a functional block diagram of a synthesized transceiver showing the interconnection of the priority channel and battery saver generator systems.

FIG. 12 shows a diagram of waveforms for various control signals for priority channel and battery saver generator systems.

FIG. 13 is an electrical schematic for an isolation buffer gate for the priority channel systems.

FIG. 14 is an electrical schematic for a voltage shifting circuit of the battery saver generator system.

FIG. 15 shows a diagram of waveforms for various control signals of the pulse control encoder systems.

FIG. 16 shows the location of the binary representations of the numerical divisors for the frequency synthesizer in the PROM.

FIGS. 18A-L show a detailed electrical schematic for the frequency divisional circuitry of the frequency synthesizer.

FIG. 19 shows the correct arrangement of FIGS. 18A-L.

FIG. 20 is an electrical schematic of the reference oscillator for the frequency synthesizer of the present invention.

FIG. 21 is an isolated electrical schematic of a range divider circuit shown in FIGS. 18A-L.

FIG. 22 is a table showing the range divider logic for the division loading apparatus for frequency counting and dividing operation of the frequency synthesizer shown in FIGS. 18A-L.

FIG. 23 is a functional block diagram of the analog portion of the frequency synthesis system of the present invention.

FIG. 25 is a combined block diagram and electrical schematic of the digital and analog sample and hold circuit of the frequency synthesizer.

FIG. 26 shows a diagram of waveforms for the sample and hold circuit of the frequency synthesizer.

FIG. 28 is an electrical schematic of a VHF voltage control oscillator for the frequency synthesizer invention.

DESCRIPTION OF THE PREFERRED EMBODIMENT

Figure 2:
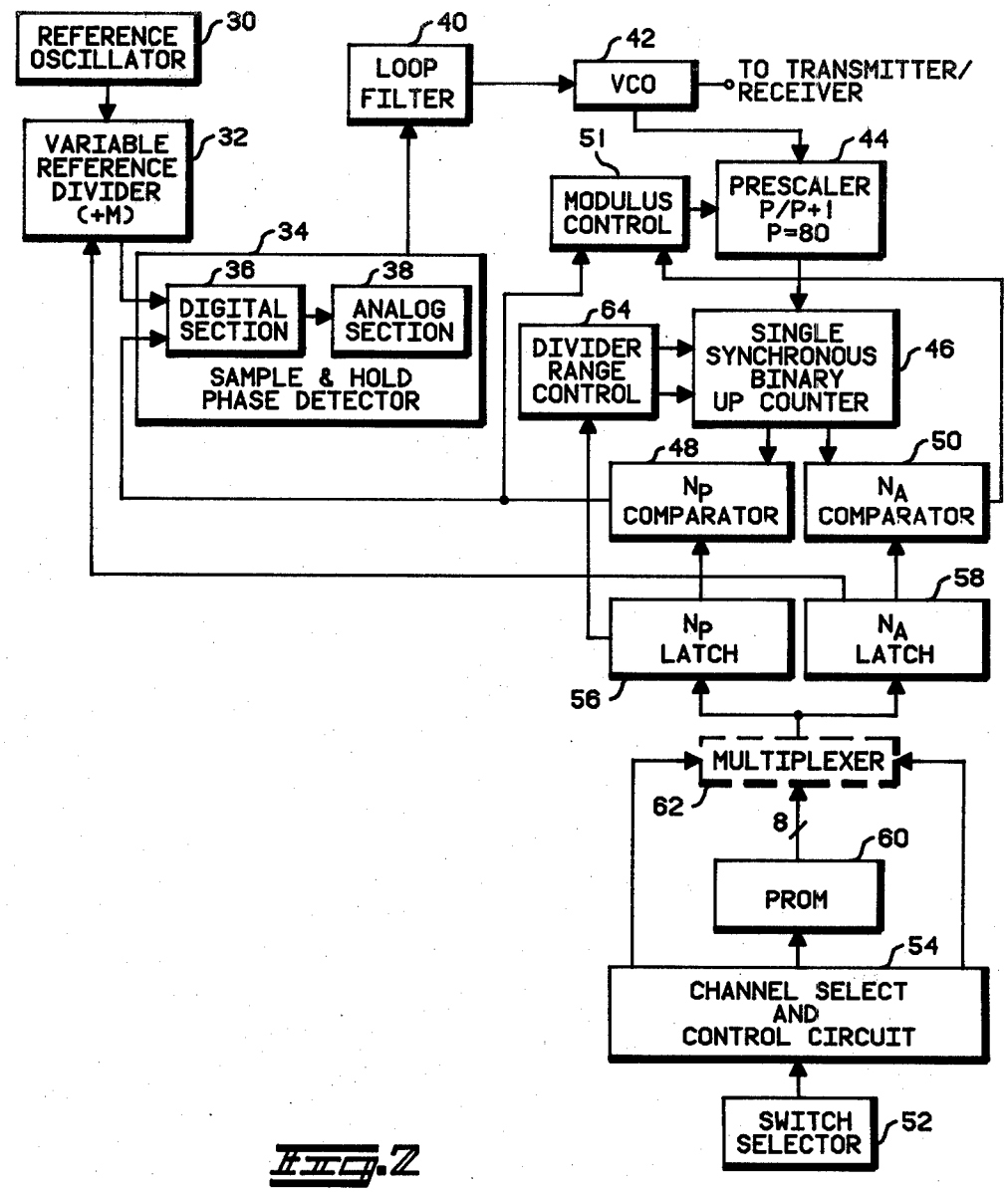
FIG. 2 is a functional block diagram of the digital frequency synthesizer system for the present invention.

FIG. 2 is a functional block diagram of the digital frequency synthesizer of the present invention. A reference oscillator 30 supplies an output signal to a variable reference divider 32 which is coupled to a sample and hold phase detector 34. Sample and hold phase detector 34 is shown to include a digital section 36 and an analog section 38. The output of phase detector 34 is supplied to a loop filter 40. Loop filter 40 is connected to a voltage controlled oscillator 42 which has a first output coupled to either a transmitter or a receiver and a second output coupled to a prescaler circuit 44. The output of prescaler circuit 44 is supplied to a synchronous binary up counter 46. Two signal outputs of counter 46 are applied to an $N_P$ comparator 48 and an $N_A$ comparator 50. An output of $N_P$ comparator 48 and an output of $N_A$ comparator 50 are coupled to a modulus control circuit 51. The output of modulus control circuit 51 is coupled to prescaler 44. The output of $N_P$ comparator 48 is also coupled to digital section 36 of phase detector 34.

A frequency switch selector 52 is coupled to a channel select and control circuit 54 which supplies signals to an $N_P$ latch circuit 56 and an $N_A$ latch circuit 58. An output of channel selected control circuit 54 is also supplied to a programmable read-only memory PROM 60. The output of PROM 60 is coupled to a multiplexer 62 shown in phantom which in response to enable signals from channel select and control circuit 54 alternately supplies information to $N_P$ latch 56 and $N_A$ latch 58. Multiplexer 62 is not a physical device but rather represents the operation of transferring information from PROM 60 to the latches. $N_P$ latch 56 is coupled to a range divider control 64 which is coupled to synchronous binary counter 46. $N_P$ latch 56 is also coupled to $N_P$ comparator 48. An output from $N_A$ latch 58 is coupled to variable reference divider 32. $N_A$ latch 58 is also coupled to $N_A$ comparator 50.

In normal operation, switch selector 52 is actuated by the portable tranceiver operator to select a desired communication channel and supplies information to channel selected control circuit 54 which in turn accesses PROM 60 to address a specific location which contain the $N_A$ and $N_P$ numerical divisors in their binary number configurations. The binary number configurations of the two divisors are supplied through multiplexer 62 and loaded into the appropriate $N_P$ latch 56 and $N_A$ latch 58. The purpose of the latches is to allow the information for subsequent comparisons to be available so that comparisons can be made at any time during the sampling operation even though power to the programmable read-only memory is terminated to reduce battery drain.

Figure 1:
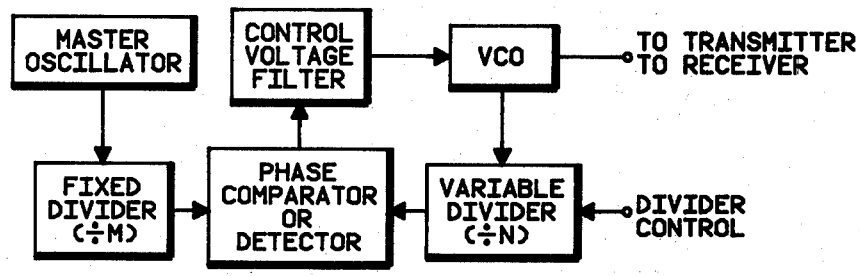
FIG. 1 is a functional block diagram of a prior art digital frequency synthesizer system.

In a manner which is quite similar to the description for the digital frequency synthesizer shown in FIG. 1, reference oscillator 30 supplies a stable fixed frequency signal to variable reference divider 32. A portion of the binary configuration of the $N_A$ numerical divider as stored in $N_A$ latch 58 is supplied to variable reference divider 32 to establish the desired channel spacing for the portable transceiver. The sample and hold phase detector operates in both a digital and analog manner to provide a fast response and precise phase comparison for the loop operation. The output of phase detector 34 is supplied through a loop filter to the voltage control oscillator 42. The voltage control oscillator 42 is coupled in a normal manner alternatively to the transmitter or receiver to cause tuning of the transceiver and is also supplied to prescaler circuit 44. A portion of the binary configuration for numerical divisor $N_P$ as stored in $N_P$ latch 56 is utilized by divider range control circuit 64 and synchronous binary counter 46 to enable counting in the correct range for the desired tuning.

An output of $N_A$ comparator 50 is supplied to modulus control 51 and then to prescaler 44 to control the selection of the modulus for the prescaler operation. The prescaler begins its operation at one modulus and when the $N_A$ comparator indicates that a comparison has been reached, the modulus is then charged to another integer value. This change in cooperation with divider range control 64, allows the single synchronous binary counter 46 to correctly determine the frequency and supply appropriate signals to $N_A$ comparator 50 and $N_P$ comparator 48. While the operation of the $N_A$ comparator serves principally to change the prescaler modulus value at a crucial time, the operation of the $N_P$ comparator is fed back through the digital section 36 of the phase detector 34 and provides completion of the phase lock loop circuit. As will be described in more detail later, the combination of the $N_A$ and $N_P$ comparators along with the divider range control and the selectable prescaler allow the operation of a single synchronous counter to provide all of the division ratios necessary in the phase locked loop to achieve correct tuning.

Normally, the synchronous binary counting would be done with two separate binary down counters, and the predetermined numbers would be loaded into each to determine when change of the modulus of the prescaler should occur so that the digital analysis of the incoming signal could be completed to determine frequency correspondence within the phase locked loop circuit. However, in one aspect of the present invention the system is designed to operate with a single synchronous binary counter to achieve all of the necessary counting and dividing functions for precise synthesis of the desired frequencies.

The phase locked loop circuit of the present invention compares a divided down reference frequency from stable reference oscillator 30 to a sub-multiple of the voltage controlled oscillator frequency and makes corrections of VCO 42 in order to force the frequencies to be equal. The variable reference divider ratio is derived from information contained in the binary equivalent of the $N_A$ numerical divider as loaded in $N_A$ latch 58. The function of prescaler 44, synchronous counter 46, range divider control 64 and comparators 48 and 50 are to provide a "divide by a variable number" function which may be called $N_T$. For tuning, the M divider ratio is programmed to correspond to the appropriate reference frequency, and $N_T$ is varied in order to move the voltage controlled output frequency in increments equal to the reference frequency. The reference value may be determined by considering both the minimum channel spacing and the transceiver multiplier.

The tuning is achieved by programming the appropriate reference frequency through a chain of dividers which may be summed up as dividing by an integer M. Once the reference frequency is established, the phase detector circuit compares the reference frequency to a sub-multiple of the VCO frequency. As will be described in greater detail later, sample and hold phase detector 34 operates much like a standard phase detector when the reference and VCO submultiple signals are not at the same frequency. However, a distinguishing phase mode of operation is established when the reference and the VCO submultiple signals are at the same frequency and the reference signal is leading in phase. Digitally this corresponds to a condition in which the variable VCO pulse is interleaved in one period of the reference pulse. A voltage proportioned to the phase difference between these signals is applied to loop filter 40 to steer VCO 42 and thus correct for any variations in the VCO frequency. For the dual modulus prescaler, the VCO output frequency is divided down by first P plus one and then P. For every P plus one pulse entering the programmable counter, both the $N_A$ count and the $N_P$ count are incremented by one. The dual modulus prescaler divides by P plus one until the count reaches the $N_A$ program state, then the modulus of prescaler 44 is changed to P. The prescaler divides by P a total of $N_P-N_A$ pulses until the $N_P$ program stage is achieved. Once the $N_p$ count is detected, the system resets and the cycle repeats by operating through modulus control 51.

To understand the operation of the frequency synthesizers and its dividing relationship for various frequencies, it is convenient to consider an example so that the various elements of the system may be understood completely at the outset. The preferred embodiment for the present invention includes the digital frequency synthesizer modifying a standard transceiver. An example of such a standard transceiver is one manufactured by Motorola and designated as MX-300. There are several models of the MX300 which may be characterized by their range of operating frequencies. For example, there are VHF, UHF and 800 MHZ models which can operate only within each designated frequency range. A feature of the Motorola MX300 VHF system which must be described is that in receive mode the receiver portion of the circuit includes a frequency doubler, that is, the frequency from the voltage control oscillator is doubled prior to injection. In addition, for the transmit mode, the phase locked loop itself includes a multiplication factor of three so that the VCO frequency is tripled before injection. The operation of the phase locked loop transmitter system of the preferred embodiment is described in U.S. Pat. No. 3,958,186 to Jesse et al., and assigned to the assignee of the present invention which is hereby incorporated by reference. Thus, the transceiver system embodiment has different multiplication factors for both transmit and receive modes.

It is most convenient to consider the operation in the receive mode. For simplicity, the VHF band is selected and encompasses frequencies in the range of 136-174 MHz. A common spacing specified by the FCC or equivalent foreign communication agencies would be a multiple of either 5 kHz or 6.25 kHz for the various communication channels. Choosing the 5 kHz spacing, any frequency channel which satisfies the relationship 136 MHZ+some multiple times 5 kHz may be tuned. The spacing corresponds to an output frequency of variable reference divider 32 of 2.5 kHz.

It has been found convenient to use a standard 3.6 MHz crystal for reference oscillator 30 and to produce the 5 kHz spacing, variable reference divider 32 must divide down by a ratio equal 1,440. The simple calculation will confirm that 3.6 MHz divided by 1,440 equals 2.5 kHz and when one includes the doubling factor present in the MX300 series receiver this corresponds to the specified 5 kHz smallest increment of frequency change. Therefore, the divide by M operation of variable reference divider 32 would correspond to division by 1,440. As will be recalled, for the description of FIG. 1, the M divider ratio is normally fixed and generally the second divider ratio which in the case for the present embodiment will be referred to as $N_T$ is varied in order to move the voltage control oscillator output frequency in 5 kHz increments. In the present invention the divide by M ratio is fully programmable.

The reference incremental frequency is determined by selecting minimum channel spacing and the output multiplier for the frequency to be synthesized. Knowing this divided down reference frequency, one can determine what the range of the total variable division must be for the end points of the total tuning frequency range. Thus, if one takes the low end point of the VHF region 136 MHz subtracting off the IF which, will be considered to be 21.4 MHz and dividing by the multiplier 2 the resulting voltage control oscillator frequency is 57.3 MHz. Similarly the high end point is 76.3 mHz.

To understand the total numerical division ratio necessary to achieve these end point frequencies, one takes the end point VCO frequencies and divides by 2.5 kHz whch is the smallest incremental change that is provided by variable reference divider 32 and determines that the total numerical range of $N_T$ corresponding to the designated VHF range is from 22,920-30,520. Thus, if the voltage control oscillator frequency is divided by either of these two numbers and phase compared to the reference the receiver will be tuned to the end points of the VHF tuning region.

It is necessary to compute the $N_P$ and $N_A$ values so that they might be understood in conjunction with the total numerical divisor operating on the voltage control oscillator frequency in the phase locked loop. Because dual modulus counting is used, the equation which relates the $N_P$'s and $N_A$'s to the total $N_T$ as calculated is the following: $N_T=(N_P-N_A)\times P+N_A\times(P+1)$ where P is the value of the modulus of prescaler 44. This relationship using a dual modulus prescaler which in the case of the VHF region chosen operates at a division of either 81 or 80 for the prescaler operation, provides the counting relationship so that with a suitable combination of $N_P$'s and $N_A$'s the total division may be achieved to tune the voltage control oscillator to the appropriate frequency. While the mechanics of the precise operation of division to determine the integer and decimal equivalents of dual modulus counting need not be detailed here, it will be obvious to those skilled in the art that the total $N_T$ of 22,920 correspond to an $N_P$ of 286 and an $N_A$ of 40, while the larger total numerical divisor $N_T$ of 30,520 correspond to an $N_P$ of 381 and an $N_A$ of 40. The $N_P$ number may also contain in the most significant bit, information to specify the range of operation for the synthesize tuning to divider ranger control 64. The $2^7$ position of $N_P$ at 0 will indicate to the divider range control that the $N_P$ will lie in the range of 256-383, that is well within the required 286-381 range for tuning the required VHF frequencies. Thus, the binary configuration of $N_P$ need only contain the difference between the range low end point and the calculated $N_P$. The binary configurations of the required $N_P$'s and $N_A$'s with the most significant bit (MSB) on the left are:

| 256 to 383 | | $2^7$ | $2^6$ | $2^5$ | $2^4$ | $2^3$ | $2^2$ | $2^1$ | $2^0$ | |
|---|---|---|---|---|---|---|---|---|---|---|
| 286−256=30 | $N_P$: | 0 | 0 | 0 | 1 | 1 | 1 | 1 | 0 | $(30)_2$ |
| | $N_A$: | 0 | 0 | 1 | 0 | 1 | 0 | 0 | 0 | $(40)_2$; |
| 381−256=125 | $N_P$: | 0 | 1 | 1 | 1 | 1 | 1 | 0 | 1 | $(125)_2$ |
| | $N_A$: | 0 | 0 | 1 | 0 | 1 | 0 | 0 | 0 | $(40)_2$ |

Similarly, the highest order bit in the $N_A$ binary representation may be used to designate to the variable divider 32 a change in the value of M that may be required for the operation of different channel spacings. This is why a control line is shown in FIG. 2 connecting $N_A$ latch 58 and variable reference divider 32. However, in the case of the receive and transmit frequencies at the 5 kHz spacing it is the actuation of the push-to-talk (PTT) switch which resets the value of the M numerical to modify the reference frequency. It should be recalled that for the operation of a Motorola MX300 VHF transceiver which utilizes a multiplication factor of 3 in the transmit mode but a factor of two in the receive mode, the reference frequency of the synthesizer must be different in the two modes.

If, however, the system in which the device were to operate had different spacings for transmit and receive, then the highest order $N_A$ bit would be coded appropriately to indicate this and thereby change the divider ratio so that the correct tuning would be achieved. Similar examples could be worked out for both the UHF and 800 MHz bands for which there is a market demand. The modifications for such examples would include those directly attributable to the receiver embodiment as well as the customary transmission and reception frequencies for those bands.

Figure 3:
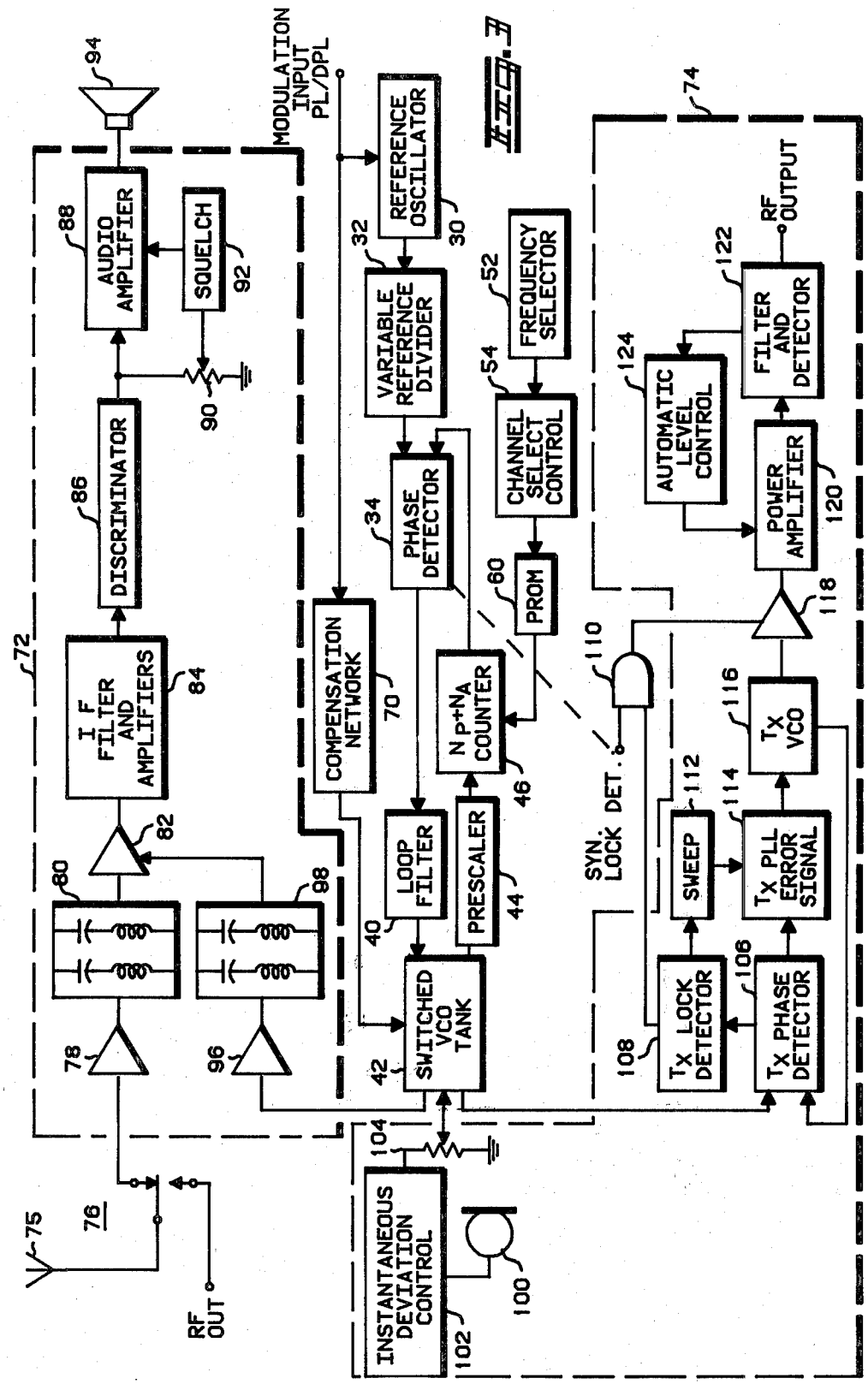
FIG. 3 is a functional block diagram of a VHF transceiver employing the present digital frequency synthesizer invention.

FIG. 3 is a functional block diagram of a complete VHF transceiver employing the present disclosed digital frequency synthesizer. Consistent with the description in FIG. 2, frequency selector 52 is coupled to channel select control 54 which is coupled to PROM 60 which supplies programmed information to $N_P$ and $N_A$ counter 46. The digital synthesizer employs reference oscillator 30 coupled through variable frequency divider 32 to phase detector 34 which also receives an input from counter 46. The output of phase detector 34 is coupled to loop filter 40 which is also coupled to VCO 42. VCO 42 is further described as a switched tank VCO. VCO 42 is connected through prescaler 44 to $N_P$ and $N_A$ counter 46. An input signal designated modulation input is applied to reference oscillator 30 and through a compensation network 70 to VCO 42. This collection of functional blocks represents the frequency synthesizer system more completely described in FIG. 2.

To understand the operation of the transceiver it is necessary to distinguish the separate receiver and transmitter sections functions with respect to the digital frequency synthesizer. FIG. 3 is segregated into two distinct circuit sections, each of which is enclosed by a broken line. In particular, the receiver section is designated 72 while the transmitter section is designated 74.

An antenna 75 is coupled through antenna switch 76 to an RF amplifier and filter 78 in receiver section 72. The output of amplifier 78 is coupled to a four pole filter 80 which is coupled to mixer 82. The output of mixer 82 is coupled to IF filter and amplifier 84 whose output is coupled to discriminator 86. The output of discriminator 86 is directly coupled to audio amplifier 88 and through potentiometer 90 to ground. A squelch control circuit 92 is connected to a variable tap of potentiometer 90 and to audio amplifier 88. The output of audio amplifier 88 is connected to a speaker 94. An output of VCO 42 from the frequency synthesizer section is coupled through a times two multiplier 96 and a three pole filter 98 to mixer 82.

For transmitter section 74, a microphone 100 is coupled through an instantaneous deviation control circuit 102 to a potentiometer 104. The variable tap of potentiometer 104 is coupled to switch tank VCO 42. The second output of VCO 42 is coupled to a transmitter phase detector 106 to provide a synthesized reference frequency source for the transmitter phase locked loop.

The output of transmitter phase detector 106 is coupled to a transmitter lock detector 108 which has a first output coupled to PLL interface gate 110 and a second output coupled to sweep control 112. The output of sweep control 112 is coupled to error signal circuit 114, which also receives an input directly from phase detector 106. The output of error signal circuit 114 is coupled to a transmitter VCO 116 which has a first output coupled back to phase detector 106. A second output of transmitter VCO 116 is coupled to RF gate 118. A signal from synthesizer phase detector 34 is applied to a second input of PLL interface gate 110.

The output of gate 110 is applied to a control input of RF gate 118. The output of RF gate 118 is coupled to a power amplifier 120 whose output is coupled to a filter and detector 122. The output of filter and detector 122 is coupled back through an automatic level control 124 to a control input of power amplifier 120. A second output of filter and detector 122 is designated RF output which is connected to the second terminal of antenna switch 76.

In operation, for the receiver section, antenna 75 provides a signal to RF amplifier 78 which both amplifies and filters it and supplies the amplified and filtered signal through four pole filters 80 to mixer 82. The output of the digital synthesizer controlled VCO 42 is coupled through a times two multiplier 96 and through a three pole filter 98 to mixer 82. In a standard method, the two signals are combined in the mixer using a superheterodyning technique to produce an intermediate frequency signal which is supplied through IF filter and amplifier 84 to a discriminator which detects carrier encoded information. The detected information is supplied to audio amplifier 88. In a manner consistant with normal operation squelch control 92, which has an adjustable threshold level is coupled to the audio amplifier. At the output of the audio amplifier is a standard speaker through which the decoded information is converted to an acoustical signal so that the transceiver operator may receive communications.

In a similar manner to prior radios, microphone 100 operates through the instantaneous deviation control 102 which is adjustable through potentiometer 104 to supply a signal which is modulated by the voltage control oscillator 42 and supplied to transmitter circuitry 74. The modulated information is supplied to transmitter phase detector 106 which, supplies information both to transmitter error signal detector 114 and transmitter lock detector 108. Lock detector 108 controls sweep control 112 which supplies its output to transmitter error signal 114. The output of transmitter error signal 114 is coupled to transmitter VCO 116 which also supplies a signal back to transmitter phase detector 106. The transmitter section operates to modulate the synthesizer VCO 42 through microphone 100 and IDC 102 and the resulting signal is supplied to the transmitter phase locked loop.

Transmitter PLL interface gate 110 ensures that no transmission can occur unless the frequency synthesizer is locked onto a fixed correct frequency. Thus, the phase lock loop interface circuit is disabled during the frequency selection operation of the digital frequency synthesizer but this gate is enabled when that frequency is locked.

In a normal manner, the RF gate 118 supplies the RF modulated information to power amplifier 120 and then to a filter and detector network which includes automatic level control 124. The output of the RF filter and detector circuit 122 is supplied to antenna switch 76 which, during transmit operation, would be disconnected from receiver circuitry 72 and connected directly to transmitter circuitry 74. The voice signal information would then be transmitted through antenna 75 in a normal manner.

FIG. 3 has shown the interconnection of the digital frequency synthesizer system of the present invention connected to known receiver and transmitter circuitry thus providing the complete transceiver embodiment for the present invention. Prior art methods show combining phase locked loops through frequency mixers to obtain final tuning frequencies. This is done to provide coarse and fine tuning but can cause many subsequent filtering problems due to the production of supurious signals. These problems are eliminated for the preferred embodiment. The output of the digital frequency synthesizer of the present invention is coupled to provide a reference frequency source for the transmitter phase locked loop. Thus no spurious signals due to mixing are produced.

FIG. 4 shows a more detailed functional block diagram of the digital frequency synthesizer of the present invention emphasizing the arrangement of the various functional blocks onto several distinct integrated circuits which are shown enclosed by broken lines. In particular, frequency selector 52 is shown interconnected with an integrated circuit 130 which includes several interconnected functional blocks. A channel select input/output circuit 132 is interconnected with a first counter 134. Channel select I/O 132 also interconnects a reset circuit 136 and tristate buffers 138. An output of first counter 134 is coupled to a pulse control encoder 140. First counter 134 and reset 136 are each coupled to a second counter 142. The output of second counter 142 is coupled to a time-out timer 144 which has an output coupled to audio amplifier 88 in FIG. 3. A push-to-talk switch 146 is coupled to push-to-talk circuitry 148 which is coupled to a relay interface 150. The output of relay interface 150 is coupled to a relay driver circuit, which causes the actuation of antenna switch 76 as shown in FIG. 3. Also shown within integrated circuit 130 is an extended channels module 152 coupled to frequency selector 52 and tristate buffers 138. The output of tristate buffers 138 are directly connected to code plug PROM 60.

The inclusion of the several elements into integrated circuit 130 may be seen from the functional description to be closely related by their function within the operation of the digital frequency synthesizer. It is not imperative that they be located on the same integrated circuit, however, it has been found convenient to combine them appropriately.

The output of code plug PROM 60 is coupled to multiplexer 62 which is contained within a second integrated circuit 160 shown enclosed by a broken line. Multiplexer 62 is coupled to $N_P$ and $N_A$ latches 56 and 58 whose outputs are appropriately coupled to $N_P$ and $N_A$ comparators 48 and 50, respectively. Pulse control encoder 140 in IC 130 is coupled to multiplexer 62, and through multiplexer 62 to a delay circuit 164 contained within IC 160. Outputs from $N_P$ comparator 48 and $N_A$ comparator 50 are coupled to modulus control 51. An output from modulus control 51 is coupled back to prescaler 44. Integrated circuit 160 contains the digital frequency dividing and counting section of the digital frequency synthesizer and shows a more detailed description of the arrangement of the various components of the digital frequency synthesizer. As is the case for FIG. 2, the $N_P$ and $N_A$ binary counter 46 is coupled directly to $N_P$ and $N_A$ comparators 48 and 50 respectively. Delay circuit 164 is coupled to the $N_P$ and $N_A$ binary counter 46. This is the same single synchronous binary up counter as shown in FIG. 2.

Reference oscillator 30 is coupled to a sequence of three serially connected dividing circuits designated $M_0$, $M_1$ and $M_2$ which carry the corresponding referenced numerals 166, 168, and 170. An output of divider 166 is also coupled through a negative voltage generator 171 to VCO 42. The output of divider 170 is coupled to a digital detector 172 which is coupled to a synthesizer lock detector 174. Digital detector 172 and synthesizer lock detector 174 are shown enclosed by a broken line designated as 36 which corresponds to the digital section of the sample and hold phase detector 34 as shown in FIG. 2.

An output of $N_P$ comparator 48 is coupled to digital detector 172. An output from delay circuit 164 is coupled back to a second input of digital detector 172. Range divider control 64 is coupled to $N_A$ and $N_P$ divider 46. An output from $N_A$ latch 58 is coupled to dividers 168 and 170. Dividers 166, 168 and 170 function to serially divide the output signal from reference oscillator 30 to provide a programmed reference frequency to digital detector 172. An input signal designated modulation input is supplied to reference oscillator 30 and through compensation network 70 to VCO 42. This is the same signal path as in FIG. 3.

An output of digital detector 172 is connected to an operational transconductance amplifier 178 which is contained within a third integrated circuit 180 shown enclosed by a broken line. A second output from digital detector 172 is coupled to a ramp generator 182 also contained in integrated circuit 180. An output from synthesizer lock detector 174 is coupled to an acquisition operational transconductance amplifier 184 also contained within integrated circuit 180. A second output of synthesizer lock detector 174 is directly coupled to TX PLL interface 110. The TX PLL interface 110 also has an input signal from the transmitter lock detect circuit of FIG. 3 and provides an output to the transmitter RF gate 118 as shown in FIG. 3.

The combination of operational transconductance amplifier 178, acquisition OTA 184 and ramp generator 182 are shown additionally enclosed by a broken line designated 38 which corresponds to the analog section of the sample and hold phase detector 34. In addition, IC circuit 180 contains a voltage regulator circuit 186 which supplies regulated voltage to the several IC's and its many interconnections have been omitted to reduce the complexity. IC 180 further contains a pulse regulator high current circuit 188 which supplies power to PROM 60. Pulse regulator 188 also receives a signal from pulse control encoder 140 contained within integrated circuit 130.

The output of OTA 178 and acquisition OTA 184 are applied to loop filter 40. Loop filter 40, is coupled directly to VCO 42 which in turn provides output signals to the receiver and transmitter sections as shown in FIG. 3 and has an additional output supplied to prescaler 44. An output of prescaler 44 is coupled to the combination $N_P$ and $N_A$ counter 46 within integrated circuit 160.

The basic operation of the block diagram shown in FIG. 4 is the same as in FIG. 2. However, within each of the integrated circuits, additional detail is included for the function of the control and signal path within the several integrated circuits. Each of integrated circuits 130, 160 and 180 will be described in greater detail with additional block diagrams showing the group structure of the various circuit elements. FIG. 4 is intended rather than a detailed description of the individual function of the various integrated circuits to show the arrangement of the several functions constituting the digital frequency synthesizer into several integrated circuits, which are grouped by function. Thus, the digital counting and digital section of the sample and hold phase detector are all located on integrated circuit 160. The analog section of sample and hold phase detector 34 is located on integrated circuit 180 which further contains other analog circuitry to provide other analog functions. Thus, the segregation of the various submodules of the block diagram of FIG. 2 are implemented using different technologies combined with the grouping of similar functions within the digital frequency synthesizer system to optimize the design.

Similarly, the integrated circuit 130 contains all of the channel selection and debounce circuitry along with all of the operational control features of the digital frequency synthesizer system. It is convenient to include all of these on a single integrated circuit so that the various control monitoring functions can be grouped together for ease of manufacture and subsequent macroscopic analysis. Integrated circuit 130 is the detailed circuit implementation of channel select control 54 as shown in FIG. 3. The other modules shown in FIG. 4 are precisely the same functional blocks as shown in FIG. 2.

The succeeding figures will each be described in greater detail for the operation of the circuits for the digital frequency synthesizer. FIG. 4 shows in one diagram, the basic interconnection of the rather complex circuits as described by their functional blocks and segregated onto several distinct integrated circuits.

FIG. 5 is a functional block diagram of the frequency selection and control portion of the digital frequency synthesizer system. In particular, the block diagram covers those controls and functions located on integrated circuit 130 shown in FIG. 4. Frequency selection switch 200 is coupled to channel select input/output circuit 132. Zone selector 202 is coupled to extended channel circuit 152. Frequency selection switch 200 and zone selector 202 are shown enclosed by a broken line designated 52 which is the frequency selector block in previous figures. Channel select input/output circuit 132 is coupled to reset circuit 136 and tristate buffers 138. Extended channel circuit 152 is coupled to reset circuit 136 and to tristate buffers 138. Push-to-talk switch 146 is coupled to push-to-talk circuit 148 which is coupled to reset circuitry 136, tristate buffers 138, time-out timer control 144 and relay interface 150. Reset circuit 136 is coupled to first counter 134 and second counter 142.

A source of 50 kHz time base is coupled to an automatic turn-off gate circuit 204 which is coupled to first counter 134. First counter 134 is coupled to a priority channel circuit 206, a battery saver generator 207, and to pulse control encoder 140. Priority channel circuit 206 and battery saver generator 207 are shown to share a series of input and output terminals designated as W, Y, YY, V, and OO. These designations are consistent with the more detailed schematic of the integrated circuit which will be later described.

Pulse control encoder 140 has three outputs designated as going to PROM 60 and the multiplexers controlling $N_A$ latch 58 and $N_P$ latch 56. An output of first counter 134 is coupled back to channel select I/O circuit 132; a second output is coupled to a manufacturing test circuit 208; and a third output is coupled back to automatic turn off gate 204. Manufacturing test circuit 208 also receives an external control input and supplies a first output to second counter chain 142 and a second output designated as I/O. Second counter chain 142 is coupled to a transmit security circuit 210 and to time-out timer control 144. Relay interface 150 has an output which was designated "to relay driver" in FIG. 4. Tristate buffers 138 have a series of output terminals labelled $A_0$ through $A_8$ that address PROM 60.

Frequency selection switch 200 is, in the preferred embodiment, composed of a 16 position channel selection switch which is interfaced with the digital frequency synthesizer by means of the control integrated circuit 130. It may not be necessary to utilize all 16 positions for many communication systems. Integrated circuit 130 contains a debouncing network that resets the internal counters every time that an appropriate logic level is sensed on the input terminals from the frequency selection switch 200. The debouncing circuit which counts some 256 clock pulses from the 50 kHz source to provide an approximately 5 millisecond delay beyond the debounce interval. Zone selector 202 is used in conjunction with frequency selection switch 200 to provide an extension of the number of communication channels up to a factor of four times the number available with the frequency selection switch 200 alone. Thus in the case of a fully utilized sixteen position switch for frequency switch 200, the maximum number of programmable channels which could be accessed would be 64.

Also connected to and responding to first counter 134 and its associated debounce circuitry is pulse control encoder 140. The output signals from pulse control encoder 140 generate the proper timing sequence to power PROM 60 and to enable the multiplexing latches of integrated circuit 160.

Push-to-talk switch 146 is interconnected with push-to-talk circuit 148 and operates in a manner that is normal for transmitters. When the push-to-talk control is actuated or when it is released, a reset sequence is generated to cause loading of the proper frequency information from PROM 60 into integrated circuit 160. Thus, the relay is not actuated until after the frequency information has been loaded into the appropriate portions of integrated circuit 160. This feature is included in the system to avoid the loading of erroneous information due to transients caused by the switching relay and RF interference. The time-out timer circuit 144 is enabled through the push-to-talk switch. A principle function of the time-out timer circuit is to dekey the radio transmitter after approximately 30 or 60 seconds of continuous RF transmission.

The function of the priority channel circuit 206 is to provide logic to allow alternatively enabling a channel element for priority channel communication and simultaneously enabling a high isolation RF gate to disable the synthesizer injection to the multiplier. During the priority channel operation, the synthesizer maintains its frequency. Combined with this feature is a battery saver circuit which generates a sampling waveform within a predetermined time period and over a specified duty cycle. During the sampling on time, the radio receiver modules are turned on and integrated circuit 130 monitors the squelch line through pad Y. This allows the receiver to continuously monitor the channel while there is a carrier present. As soon as the carrier drops out, the sampling routine is continued.

The transmitter security circuit 210 works in conjunction with the integrated circuit 160. A particular channel may be selected as a receive only channel by programming a particular binary sequence in the PROM location for the appropriate portion of an $N_A$ word. Once this predetermined $N_A$ word is latched into integrated circuit 160, an audible alert tone will be generated from integrated circuit 130 to warn the transceiver operator when the push-to-talk switch is actuated on a receive only channel and no RF power is radiated.

The automatic turn off gates 204 are operational during the receive mode when the priority channel and/or battery saver options are inhibited. The purpose of this circuit is to disable the 50 kHz clock from clocking the internal counters of integrated circuit 130. This reduces the power consumption for integrated circuit 130.

Manufacturing test circuit 208 is included to decrease the cost of testing the IC function by allowing separate testing of various functions. The inclusion of block 208 is not necessary to the operation of the digital frequency synthesizer but only enhances the manufacturability of the final IC implementation of this portion of the circuit.

FIG. 6A shows frequency selector switch 200 as comprising a first variable selector terminal 220 which is coupled to a terminal I and through a capacitor 222 to ground. This variable selector 220 or wiper may connect alternately to one of a series of pairs of terminals with the first one of each pair containing a resistor. All of the pairs of terminals ultimately connect to either output terminals designated A-H. These output terminals will be shown to correspond to the input pads A-H in the detailed electrical schematic for integrated circuit 130 and, in particular, for the channel selection input-/output circuit 132.

The function of the variable selector of frequency switch 200 is to interconnect with the 16 possible terminals allowing selection of any of 16 transmit and receive communication channels. The 16 terminals are designated 224, 225, 226, 227, 228, 229, 230, 231, 232, 233, 234, 235, 236, 237, 238, and 239. As may be seen in FIG. 6A, the ordering of the switches is interleved so that terminal 224 couples through a resistor 240 to terminal A whereas switch terminal 225 couples directly to terminal A. Similarly, terminal 226 couples through an identical resistor 240 to output terminal B whereas terminal 227 couples directly to B. In terminals 224 to 239 the even numbered terminals are connected through separate resistors 240 of identical value to an output terminal while the odd numbered terminals are connected directly to the output terminal for the corresponding pair. Each output terminal is connected to ground through separate resistors 241 of identical value. The purpose of the inclusion of the 16 terminals containing alternate identical resistors in every other position is to allow the 16 position switch to differentiate between the 16 possible combinations of frequencies while using only nine interconnect lines with the channel select I/O circuit 132. Thus, when variable selector 220 of frequency switch 200 is in contact with terminal 224, it operates through one of the resistors 240 to connect to terminal A. Whereas, when the variable selector 220 of frequency switch 200 is in contact with terminal 225 it is in direct contact with terminal A. As will be described later the function of resistors 240 in combination with capacitor 222 produce a RC time delay in channel select I/O circuit 132. This will be detected through one of nine terminals of channel select I/O 132 and it will determine which of 16 possible combinations frequencies has been selected.

Figure 6B:
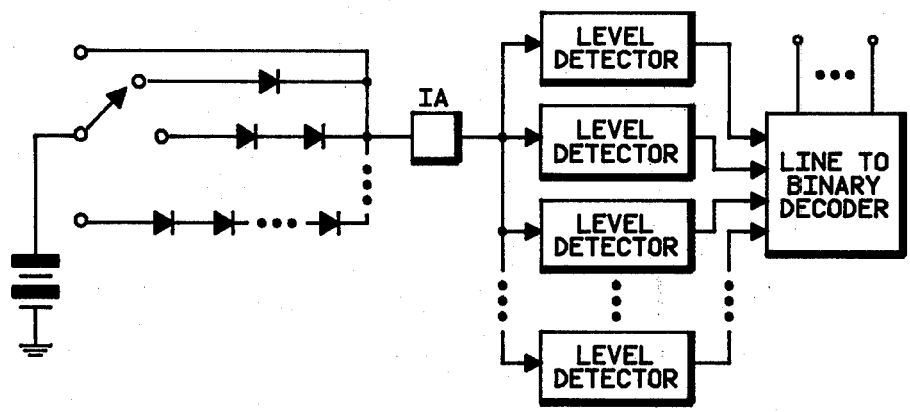
FIGS. 6 A, B and C are electrical schematics of alternative frequency selection switches for the frequency synthesizer.

While FIG. 6A shows the frequency selector switch 200 for the preferred embodiment, is should be emphasized that this switch arrangement was chosen to provide a minimum number of interconnections between the multiposition switch and the IC which requires a binary encoded of the selected switch position. There are several alternative arrangements for such minimum interconnection multiposition switches and although they need not be described in detail, FIGS. 6B and C show alternative switch arrangements which can provide the multiposition frequency selection operation in combination with the binary encoding of the selected position which is required by IC 130. The specific arrangement in FIG. 6A has a number of interconnection pads which is itself a number representable as an integer power of two. This arrangement provides for a much simpler decoding and encoding scheme for the integrated circuit and therefore this arrangement is utilized in the preferred embodiment. It should be observed, however, that either of the alternative embodiments shown in FIG. 6B and C may be utilized and that there are additional modifications of the three embodiments which may also provide suitable frequency selection for integrated circuit 130.

FIG. 6B shows a multi-position switch having electrical power applied at the variable wiper. Each of the positions contains an increased number of diodes. The interconnection pad between the switch and the circuit is shown as a pad designated IA which is connected to a series of level detector devices corresponding in number to the number of positions on the multiposition switch. The output of each of the level detectors is connected to a line to binary decoder.

In operation, the selector switch couples power through its variable wiper to a terminal containing one or more diodes which are connected to the circuit through interconnection pad IA. The level detectors operate to determine which voltage has been applied to the circuit through IA and when that voltage level has been detected, all of the several level detectors are then appropriately decoded by a line to binary decoder and a binary output corresponding to the selected position of the switch may be determined.

Figure 6C:
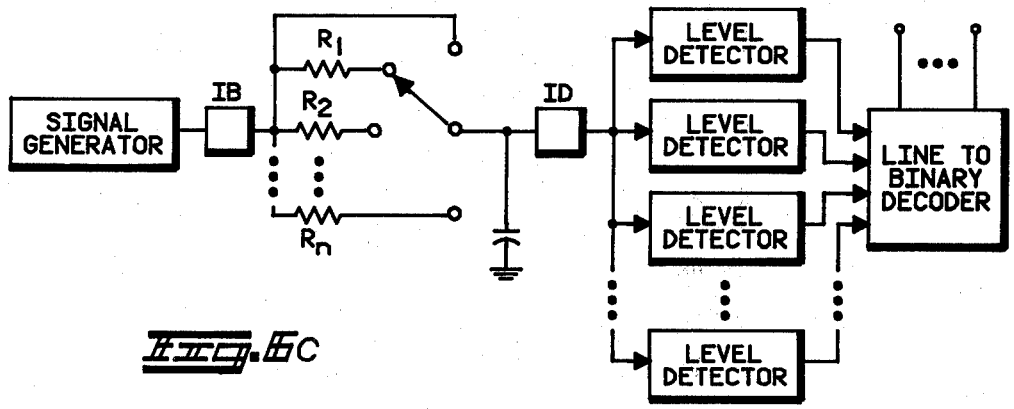

As a second alternative, FIG. 6C shows an additional variation on the multiposition switch which may be interconnected with IC 130. A variable position switch is shown having the variable wiper terminal coupled to an interconnection pad designated ID. Pad ID is interconnected with a capacitor coupled to ground and it is further connected to the several level detectors. The circuit itself contains a signal generator which supplies power through interconnection pad IB to a common connection of the plurality of different value resistors, each one of which being connected to one of the several terminals of the multiposition switch. Through interconnection pad ID a signal is supplied to the plurality of voltage level detectors and the output of each voltage level detector is supplied to a line to binary decoder so that when a switch position is selected, a binary output may be determined which clearly indicates which position of the switch has been selected.

In operation, the circuit itself, supplies a signal from a signal generator device through interconnection pad IB to power the multiposition switch. The combination of the individual resistors having different values coupled to the capacitor to ground provide an integration network which is dependent upon the selection of resistors by the position of the multiposition switch. Thus, after a suitable time has elapsed, the integration of the voltage may be monitored by the plurality of voltage level detectors in order to determine which of the several resistors has been selected and thus clearly identify which of the positions of the multiposition switch has been selected.

In a manner similar to FIG. 6B, a line to binary decoder is connected to the various outputs of the plurality of voltage level detectors to produce a binary output representing the selection of the position of the multiposition switch. It will be clear to those skilled in the art that the inclusion of the modifications of 6B and 6C require some minor circuit modifications in integrated circuit 130, however they are various alternative switch arrangements which may be used to provide the frequency selection.

FIG. 7 shows zone selector 202 which comprises a variable selector terminal 242 which may interconnect one of four terminals 244, 245, 246 and 247 to provide an output signal at two output terminals which are designated Z and AA. These will later be shown to correspond to input pads for extended channel circuit 152. It may be seen that when the variable selector terminal 242 of zone selector 202 is in contact with terminal 244, there is no connection through pads Z and AA. Terminal 245 is connected directly to output terminal Z and through the anode of a diode 248 to terminal 247. Terminal 246 is connected directly to output terminal AA and through the anode of a diode 250 to terminal 247. Thus, the cathodes of diodes 248 and 250 are connected together at terminal 247. It may be seen that the binary representation of the two line output from terminals Z and AA corresponds to the selection of one of the four positions of zone selector 202.

The combination of frequency selection switch 200 and zone selector 202 provide for a minimum number of interconnect lines to the frequency selection and control portion of the digital frequency synthesizer. This is also an additional advantage in that the concept of zones while providing a reduction in electrical connection complexity is closely related to the operation of some of the more complex communication systems. The concept of zones may be applied geographically with respect to the portable transceiver location or by designating services such as police, fire or other emergency service. As will be described in more detail with the description of the code plug PROM 60 or memory module which contains the frequency information the zone selector may be made to have a physical representation in that it directs access to specific addressable locations of the memory module.

The combination of frequency selection switch 200 with 16 positions and zone selector 202 with 4 positions yields a total combination of 64 transmit or receive frequencies. It should be clear to those skilled in the art that additional positions may be added to either selector with corresponding modifications to IC 130 to increase the number of possible frequencies. An alternative design may be achieved by maintaining both the capacities of the present switches and the design of IC 130. This could be achieved by adding an additional control to cause accessing of added memory for the addressable locations of code plug PROM 60 to greatly increase the number of possible frequency combinations by accessing additional segments of memory.

FIGS. 8A–I show the electrical schematic of the integrated circuit 130 for the frequency selection and control portion of the frequency synthesizer. As may be seen by inspection of the functional block diagram of FIG. 5 for this integrated circuit, the interconnections are quite complex. FIGS. 8A–I have been segregated into modules corresponding to the functional block diagram as shown in FIG. 5.

It may be appreciated that it is difficult to choose a signal starting point for the description of such a complex integrated circuit. However, some of the more basic operations will be connected and described and then the relationship to the overall integrated circuit will be treated in detail. First counter 134 is shown enclosed by a broken line in FIG. 8E. First counter 134 comprises a ten stage binary counter each stage of which is comprised of a toggle flip-flop designated $T_0$ to $T_9$ respectively. The Q output of each toggle flip-flop is coupled to the inverse clock terminal of the succeeding stage; and the Q output terminal of each toggle flip-flop is connected to the normal clock terminal of the succeeding stage. The reset terminals of each of the ten flip-flops are connected in parallel to a common point so that all stages of the counter may be simultaneously reset.

Figure 8A:
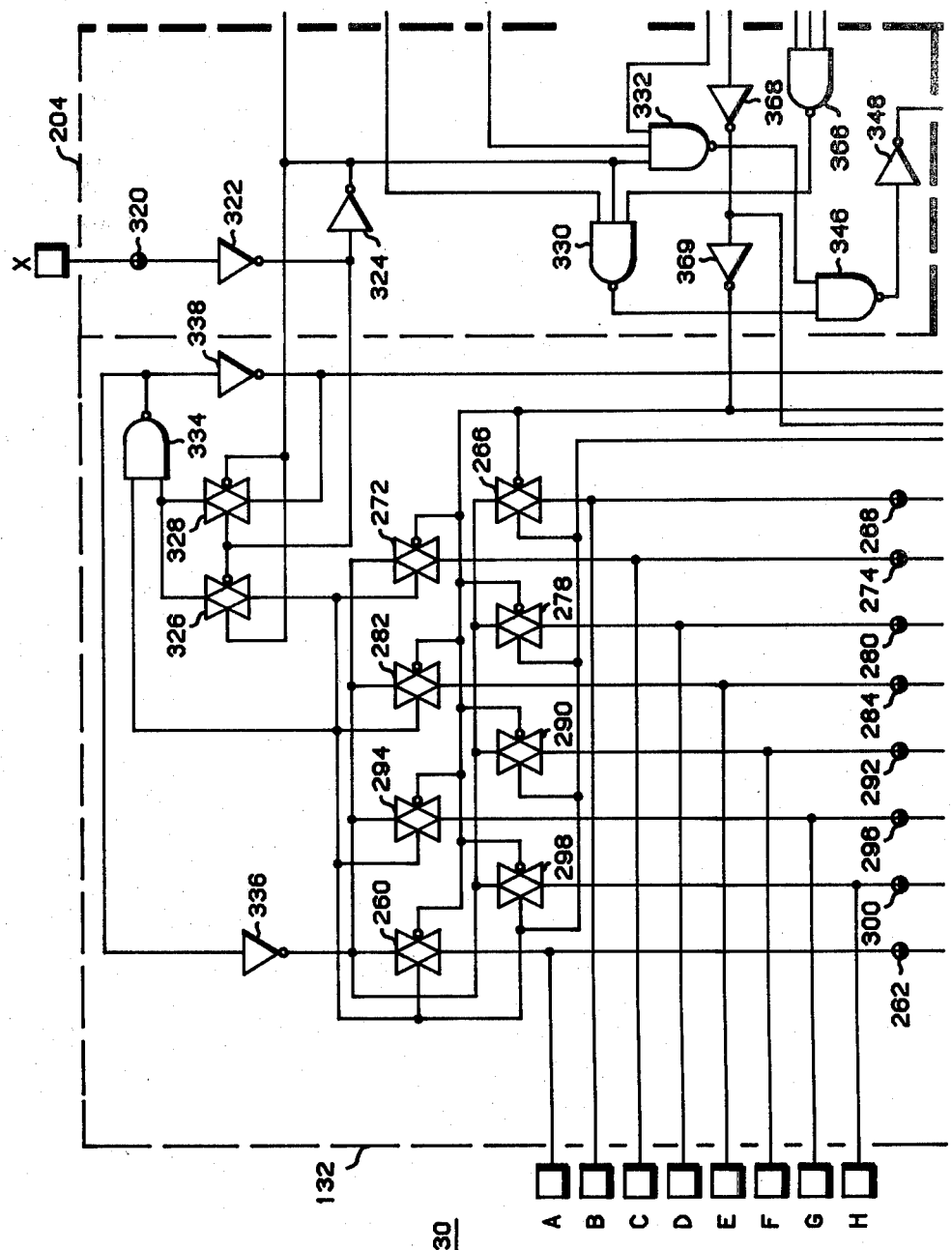
Figure 8B:
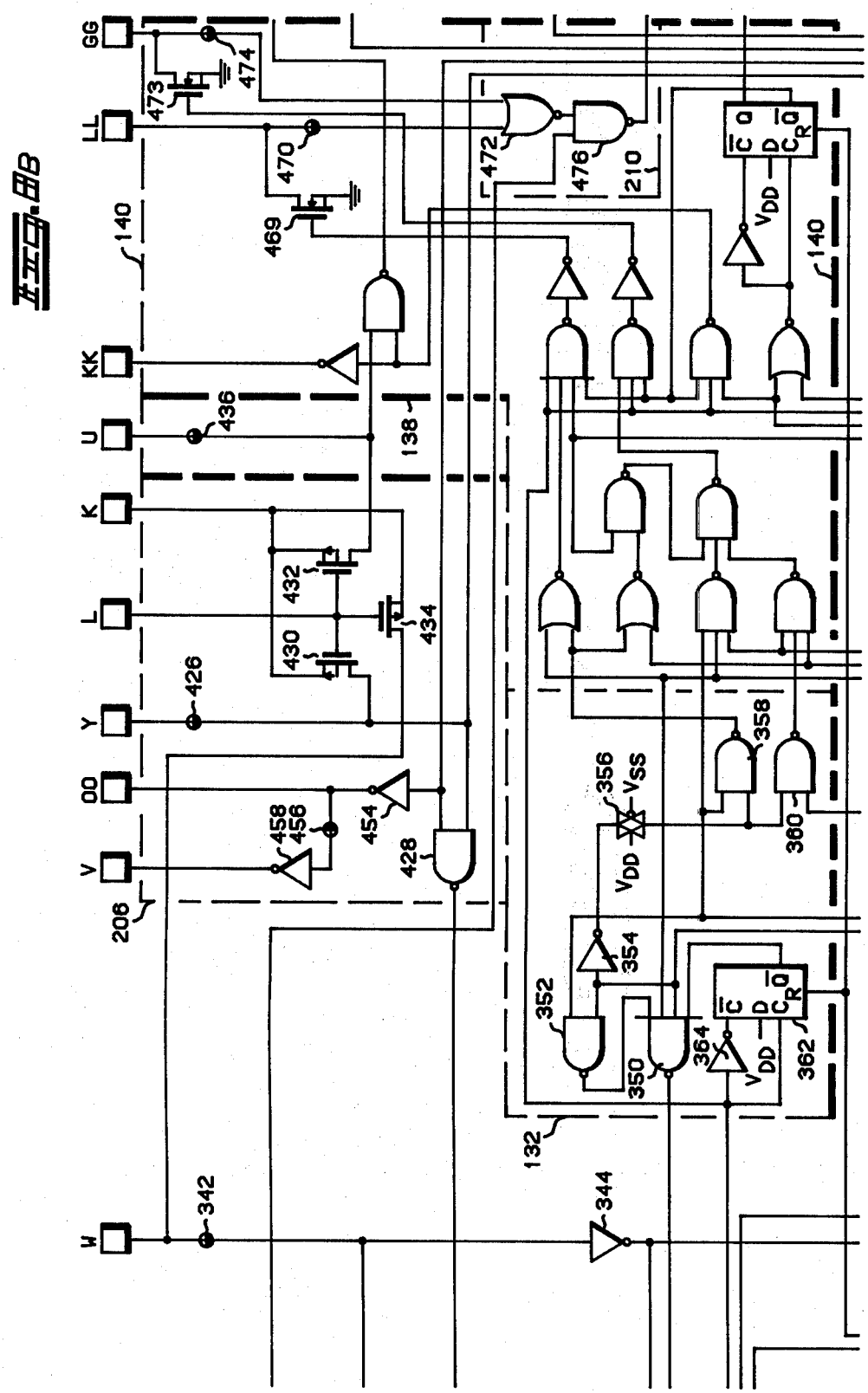
Figure 8E:
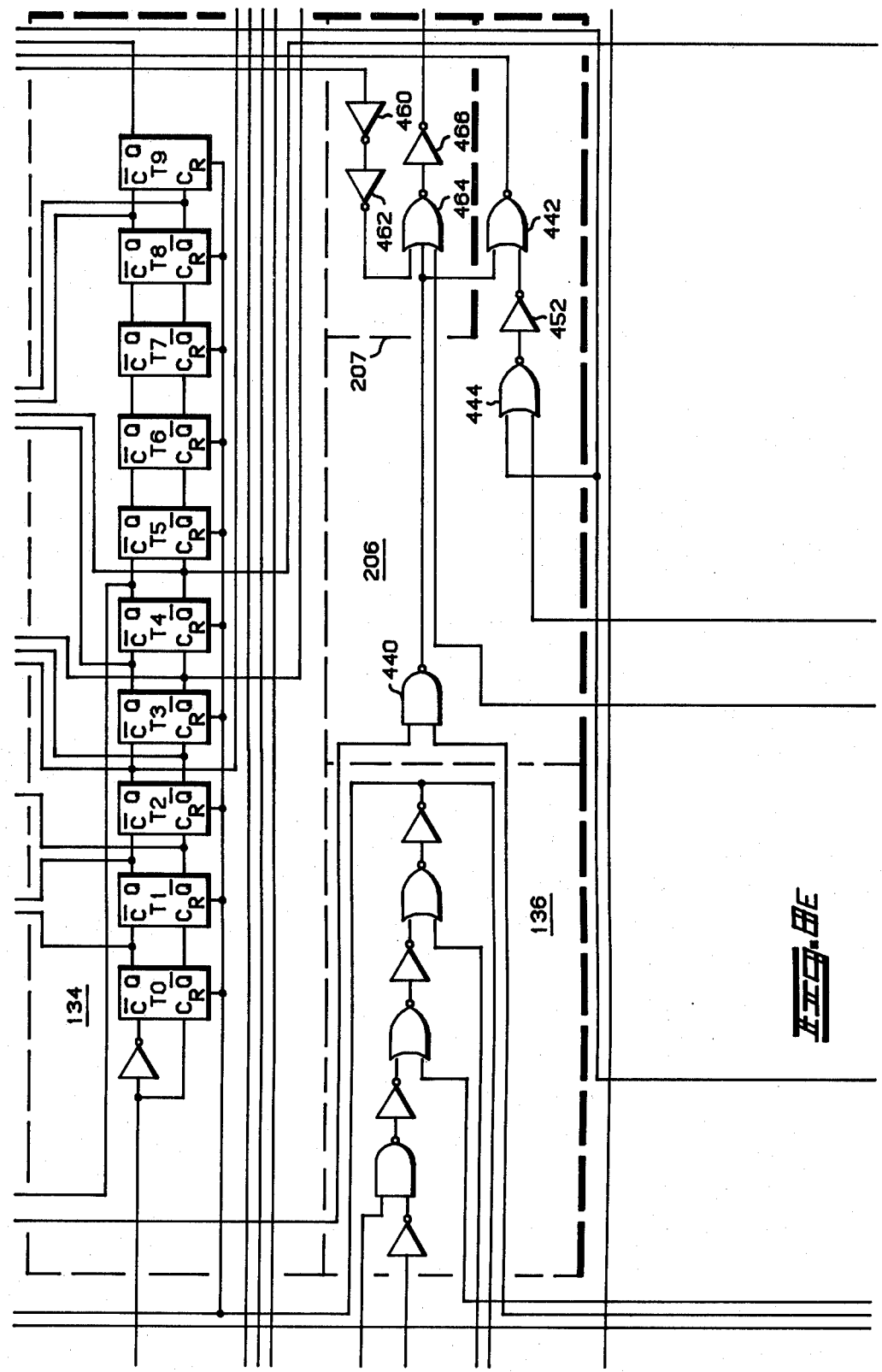

As may be seen in the arrangement of FIG. 8E, the outputs at various stages are connected to other portions of the circuit. This is to provide various time sequences in the operation of the integrated circuit. The overall operation of first counter 134 is precisely that of a ten stage binary counter having a time base signal which is applied simultaneously to the clock terminals of the first counter to the sequence of ten toggle flip-flops and a final output signal at the Q output terminal of the tenth flip-flop $T_9$. The time base signal is the 50 kHz signal shown in FIG. 5 which is applied to counter 134 through IC pad X and various logic gates of automatic turn-off gates 204 as will be described in greater detail later.

Similarly, FIG. 8H shows second counter 142 which is also enclosed by a broken line. Second counter 142 operates in a manner that is similar to first counter 132 and comprises twelve toggle flop-flips $T_{10}$ and $T_{21}$ coupled together in an identical manner as are the toggle flip-flops for first counter 134. An input signal from the 10th stage output of first counter 134 is normally applied to the clock terminals of the first in the sequence of twelve interconnected toggle flip-flops $T_{10}$. As before, all of the reset terminals of the twelve toggle flip-flops of second counter 142 are connected in parallel to a common point. This allows for resetting of all of the stages of this counter simultaneously. As before, output signals from various stages of second counter 142 are interconnected to provide shorter timed intervals requiring less than the full twelve stage binary counting operation of second counter 142.

FIGS. 8A–I show in detail the electrical schematic of the frequendy selection and control portion of the frequency synthesizer. As shown in FIGS. 8A, B and D channel select I/O circuit 132 is shown in portions and enclosed by broken lines. Integrated circuit input pad A is coupled to the output terminal of a transmission gate 260 and through protection circuit 262 (for which a circuit symbol of a one half filled circle is employed) as to the first input of a NOR gate 264. Pad B is coupled to the output terminal of a transmission gate 266 and through protection circuit 268 as the first input of a NOR 270 and the second input of NOR 264. Pad C is coupled to the output terminal of transmission gate 272 and through protection circuit 274 as the first input of a NOR 276 and the third input of NOR 264. Pad D is coupled to the output terminal of a transmission gate 278 and through protection circuit 280 as the second input of NOR 270, the second input of NOR 276 and the fourth input of NOR 264.

Pad E is coupled to the output terminal of a transmission gage 282 and through protection circuit 284 as the first input of NOR 286 and the first input of NOR 288. Pad F is coupled to the output terminal of transmission gate 290 and through protection circuit 292 as the second input of NOR 286 and the second input of NOR 288. Pad G is coupled to the output terminal of a transmission gate 294 and through protection circuit 296 to the third input of NOR 276, the third input of NOR 286 and the third input of NOR 288. Pad H is coupled to the output terminal of a transmission gate 298 and through protection circuit 300 as the fourth inputs of NOR's 270, 276, 286 and 288. Protection circuits 262, 268, 274, 280, 284, 292, 296 and 300 are all identical and will be shown subsequently in FIG. 10.

Transmission gates 260, 266, 272, 278, 282, 290, 294 and 298 are all of a P-N channel type requiring both high and low signals to be applied for switching an input signal to the output terminal. All of the positive control input terminals of the eight transmission gates are connected in parallel as are all of the negative or low control signals. The source of the application of the positive and inverted control signals will be described subsequently.

Input connector pad I is coupled to the drain electrode of an N channel MOS device 302 which has its source electrode coupled to ground. Pad I is also connected through protection circuit 304 to the output of a transmission gate 306, as the common inputs of a NAND 308, and as the first input of a NAND 310. NAND 310 is interconnected with NAND 312 to form an RS flip-flop. The output of NAND 308 is coupled as the second input of NAND 312 and the output of NAND 310 is coupled as the first input of a NAND 314. The output of NAND 314 is connected through an inverter 316 to the inverter clock terminal of a flip-flop 318 and directly to the normal clock input terminal. The clock input terminal of data flip-flop 318 is also connected through a capacitor 320 to ground.

The 50 kHz time base signal is applied through input terminal X and through protection circuit 320 to an inverter 322. The output of inverter 322 is connected as the input of an inverter 324, as the negative control input of a transmission gate 326 and as the positive control input of a transmission gate 328. The output of inverter 324 is connected as a first input of a NAND 330 and as the first input of a NAND 332. The output of inverter 324 is also connected as the negative control input of transmission gate 328 and as the positive control input of transmission gate 326. The output of transmission gates 326 and 328 are connected together as the first input of a NAND 334. The second input of NAND 334 is connected in common with the positive control terminals of transmission gates 260-298 as previously described. The output of NAND 334 is connected through an inverter 336 to the common input terminals of transmission gates 260-298 as previously described. The output of NAND 334 is also connected through an inverter 338 as the first input of a NOR 340. The output of NOR 340 is coupled to the gate of a P channel MOS device 302.

As may be seen from the drawings, a portion of automatic turn-off gates 204 must be described so that the detailed operation of input/output circuit 132 may be understood. In FIG. 8B, input pad W is coupled through protection circuit 342 as the second input of NAND 330 and through an inverter 344 as the second input of NAND 332. The output of NAND 330 is connected as the first input of NAND 346. The output of NAND 332 is coupled as the second input of NAND 346. The output of NAND 346 is connected through an inverter 348 to the clock terminal of toggle flip-flop $T_0$ of first counter 134. This same output is also connected through an inverter to the clock inverse terminal of the $T_0$ in first counter 134. Pad W is normally at a high level and putting a low logic level circuit on it enables the operation of the priority channel circuit and the battery saving circuit designated respectively 206 and 207, as shown in FIG. 5. It may be seen that the normal path for the 50 kHz clock signal is along pad X through inverters 322 and 324 through NAND 330 and 346 through inverter 348 to first counter 134. However, when pad W is at a low logic level, it disables NAND 330 so that the path to the counter is dependent upon priority channel circuit 206 through NAND 332. Thus the supply of the 50 kHz clock depends upon the status of the priority channel and/or battery saver generator 207 operations.

In the alternative, if pad W remains high the normal path for supplying the 50 kHz clock to the counter 134 is through NAND 330 which is responsive to that portion of input/output control circuit 132 through NAND 366 as shown in FIG. 8A which is ultimately responsive to the logic imposed by the operation of several of the stages of first counter 134. Thus, under normal operation, automatic turn-off gates 204 will respond after a sufficient time for the loading of the frequency information into the appropriate latches and disrupt the counting operation of first counter 134 since it is no longer necessary. In the event that battery saving or priority channel features are to be enabled in a particular unit however, the automatic disruption of the timing mechanism must be controlled by other factors such as the detection of a carrier signal in the priority circuit. The operation of this circuit will be described in detail later.

Continuing with the detailed description of input-/output control 132 and referring specifically to FIGS. 8B and E, the Q output terminal of toggle flip-flop $T_0$ is coupled as the first input of NAND 350, the first input of a NAND 352 and through inverter 354 to the signal input of a transmission gate 356. Transmission gate 356 has voltage $V_{DD}$ supplied to its positive control gate and voltage VSS (ground) supplied to its negative control gate. The output of transmission gate 356 is coupled as the first input of a NAND 358 and the first input of a NAND 360. The Q output of toggle flip-flop $T_1$ is connected as the second input of NAND 352, the second input of NAND 358. The $\overline{Q}$ output of flip-flop $T_1$ is coupled as the second input of NAND 360. The outputs of NANDs 358 and 360 are coupled to pulse control encoder 140 to provide suitable timing for that circuit. The Q output of toggle flip-flop $T_2$ is connected as the second input of NAND 350. The output of NAND 352 is connected as the third input of NAND 350. The clock terminal of a data flip-flop 362 is connected through an inverter 364 to its clock terminal. VDD is applied to the D terminal. The clock terminal of data flip-flop 362 is also connected as the first input of a NAND 366. The output of NAND 366 is connected as the third input of NAND 330 in automatic turn-off gate 204. The $\overline{Q}$ output of data flip-flop 362 is coupled as the fourth input to NAND 350. The output of NAND 350 is coupled through inverter 368 to the D terminal of data flip-flop 318, through inverter 370 to the positive control terminal of transmission gate 306. The output of inverter 370 is also connected through an inverter 372 to the negative control terminal of transmission gate 306. The output of protection circuit 304 is applied to the input terminal of transmission gate 306 and the output terminal of transmission gate 306 is connected through an inverter 374 as the second input of NAND 314 and as the positive control input to transmission gates 260, 266, 272, 278, 282, 290, 294, and 298 as previously described. The output of inverter 368 is coupled through an inverter 369 to the negative control terminals of transmission gates 260–298. The input of transmission gate 306 is also connected through a pair of inverters 376 and 378 as the second input to NOR 340 and to a portion of reset circuit 136. The output of NORs 264 and 288 are coupled as the first and second inputs of NAND 380 whose output is also coupled to reset circuit 136. The second input of NAND 366 receives a signal from first counter 134 and the third input is derived from another portion of the circuit relating to the time out timer circuit which will be described later.

Whenever frequency selector 200 is moved from one position to another, the resistors 241 to ground insure that a low signal is applied to pads A-H which is sensed by the inputs to NOR's 264 and 288. The outputs of NOR's 264 and 288 supply a signal to reset circuit 136 which causes a resetting of counter's 134 and 142. With the counters reset, first counter 134 can again provide a multiplicity of timing signals to actuate a series of transmission gates in a signal sampling operation and determine which of the eight pads has been connected and whether or not resistor 240 is present in the circuit to designate the selected frequency. Pad I serves as an I/O port to test for a direct or a resistive connection through switch selector 220. If the switch selector 220 is placed in the position of a direct connection then the most significant bit (MSB) of a four bits binary word will be set to a high logic level. This corresponds to a channel address from nine to sixteen. If switch selector 220 is connected to pads A-H through resistor 240, this allows for a delay path to inhibit the setting of the MSB to a high logic, hence this corresponds to a channel address from one to eight.

During the debouncing interval pad I behaves as an output for 7.5 clock periods and as an input for half of a clock period. The total period of clock pulses is repeated 32 times before PROM 60 is addressed and latches 56, 58 are enabled. The redundant sampling ensures the sensing of the proper path to avoid false addresses.

The function then of NORs 270, 276 and 286 are to decode which of the eight pads designated A through H are connected through frequency selector swtich 200. They constitute an eight line to three bit binary decoder to identify the selected terminal. As may be seen from FIGS. 8D, E, and F three lines are supplied to tristate buffers 138.

Capacitor 222 as shown in FIG. 6A is coupled to pad I. If there is one of resistors 240 in the circuit the line at pad I will take some time to build up. If however, there is no resistor 240 in the circuit there will be a high level signal at I within a sampling time window and this signal operates through the RS flip-flop composed of NANDS 310 and 312 to set data flip-flop 318. If the Q output of flip-flop 318 is high then a transition has been detected without a resistor. If a resistor is present flip-flop 318 is not set.

The Q output of flip-flop 318 adds the fourth or most significant bit of binary information concerning the position of frequency selector switch 200. In combination, connector pads A through I provide a 16 position to four bit binary decoder which employes only 9 interconnection pads to integrated circuit 130.

Figure 8G:
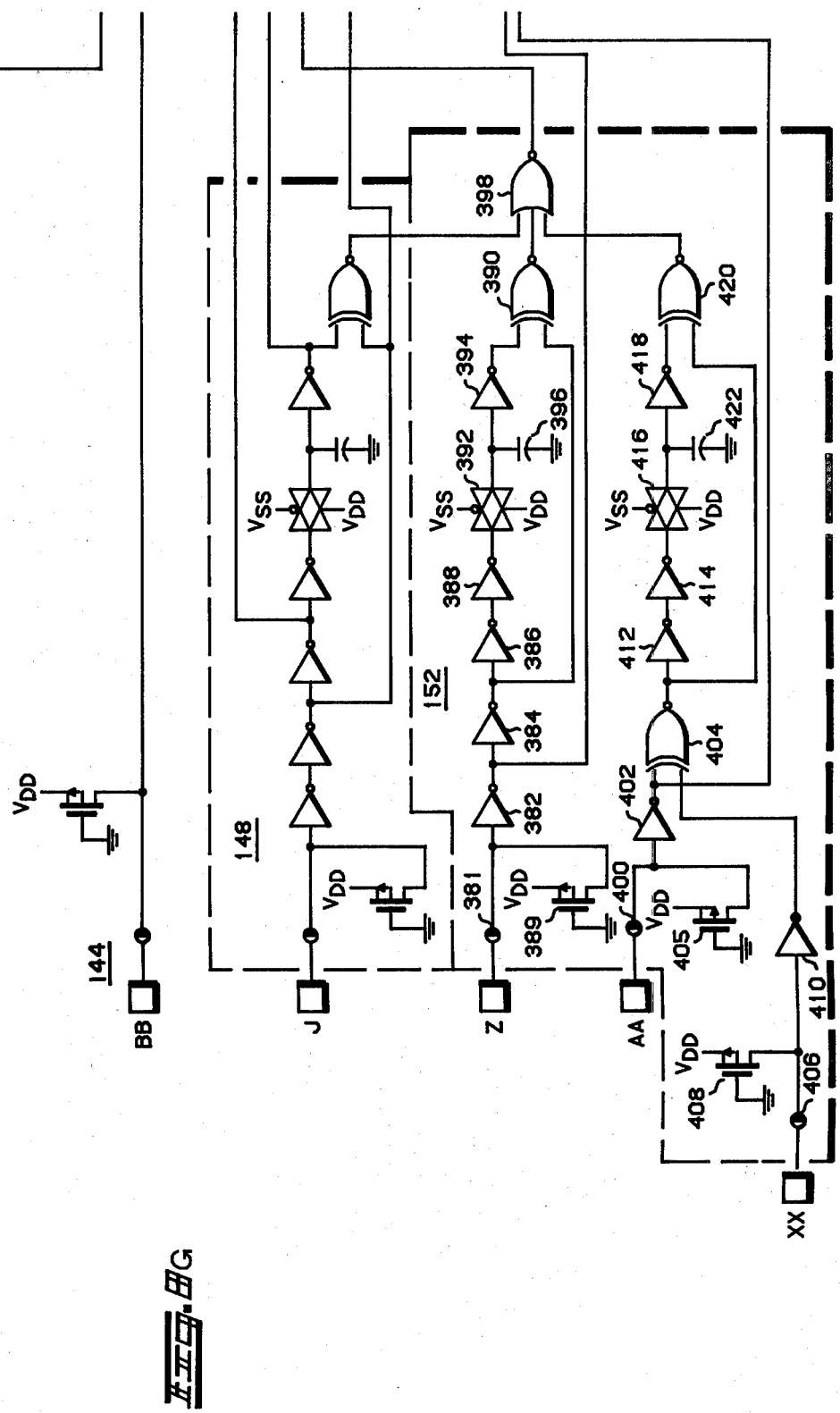

FIG. 8G shows a portion of time-out timer control gates 144, push-to-talk circuitry 148 and extended channels circuit 152. In extended channels 152, input terminal Z is coupled through protection circuit 381 to a series of inverters designated 382, 384, 386 and 388. A P-channel MOS device 389 has its drain electrode connected to the input of inverter 382, its gate electrode connected to ground and $V_{DD}$ applied to the source electrode. The output of inverter 382 is connected to the input of inverter 384 and to tristate buffers 138. The output of inverter 384 is connected to the input of inverter 386 and as the first input of an Exclusive NOR 390. The output of inverter 386 is connected as the input of inverter 388 and the output of inverter 388 is connected to the input terminal of a transmission gate 392. $V_{DD}$ is applied to positive control terminal of transmission gate 392 and VSS is applied to negative control terminal. The output of transmission gate 392 is connected to the input of an inverter 394 and through a capacitor 396 to ground. The output of inverter 394 is connected as the second input of Exclusive NOR 390. The output of Exclusive NOR 390 is connected as the first input of a NOR 398.

Input pad AA is connected through protection circuit 400 to the input of an inverter 402 whose output is connected as the first input of an Exclusive NOR 404. A P channel MOS device 405 has its drain electrode connected to the input terminal of inverter 402, its gate electrode connected to ground and $V_{DD}$ applied to its source electrode. Input terminal XX is connected through protection circuit 406 to the drain electrode of a P channel MOS device 408 and to the input of an inverter 410. The output of inverter 410 is coupled as the second input of Exclusive NOR 404. The output of inverter 402 is coupled to tristate buffers 138. The output of Exclusive NOR 404 is connected to the input of an inverter 412 whose output is connected through an inverter 414 to the input terminal of a transmission gate 416 having VSS applied to the negative control terminal and $V_{DD}$ applied to the positive control terminal. The output of transmission gate 416 is connected through inverter 418 as the first input of an Exclusive NOR 420. The output of transmission gate 416 is also connected through a capacitor 422 to ground. The output of Exclusive NOR 404 is coupled as the second input of Exclusive NOR 420. The output of Exclusive NOR 420 is connected as the second input of Exclusive NOR 398. The third input of NOR 398 comes from push-to-talk circuitry 148 which need not be described here. The output of the NOR 398 is connected to reset circuitry 136.

The operation of extended channel circuit 152 may be understood in conjunction with the description of zone selector switch 202 as shown in FIG. 7. The positioning of zone variable selector 242 in contact with the four possible terminals designated 244–247 produce a binary encoded output signal on terminals Z and AA. These output terminals correspond to the input terminals of integrated circuit 130 as shown as the input terminals to extended channel circuit 152 in FIG. 8G. This binary encoded information is transferred to tristate buffers 138 according to the outputs of inverter 382 and 402. Thus, the binary encoded information is inverted and supplied to tristate buffers 138 so that the corresponding locations in memory may be accessed. The push-to-talk switch provides a single pulse to reset circuit 136.

The operations of the push-to-talk switch, push-to-talk circuitry and time-out timer control gates have been described in general for the functional block diagram as shown in FIG. 5 and it is not necessary to discuss these circuits in complete detail. All of the interconnections are shown in the detailed description of the integrated circuit 130 as shown in FIGS. 8A–I. The time-out timer circuit 144 is enabled when Pad J is grounded through P-T-T switch 146. At this time a digital count sequence is started through counters 134 and 142 to provide a low output on Pad M (FIG. 8I) at the end of approximately 30 or 60 seconds from the time that Pad J was grounded. The selection of the time-out length is achieved by the logic level applied to pad EE. Normally with no connection to this pad the time-out length will be internally set to approximately 30 seconds; while a low at this input will change the length to approximately 60 seconds. These timings are derived from the 50 kHz present on pad X. Simultaneously with Pad M going low Pad CC is enabled to sink current from N channel MOS device 492 and therefore it unsquelches the receiver circuit. In addition, Pad DD generates an alert tone of 1562.6 Hz which is injected into the audio preamplifier to acknowledge the user that the transmitter had been disabled. The time-out-timer may be defeated by grounding Pad BB.

Referring now to FIG. 8B, a portion of priority channel circuit 206 is shown to contain a plurality of input/output pads. Connector Pad Y is connected through protection circuit 426 as the first input of a NAND 428 and to the drain electrode of a P channel MOS device 430. The source electrode of MOS device 430 is connected to the source electrode of a P channel MOS 432 and to Pad K. Pad L is connected to the gate electrodes of MOS devices 430, 432 and a P channel MOS device 434. Pad K is at VDD, the most positive potential, while Pad L is at VSS, the most negative potential, which in this case is ground. The source electrode of P channel MOS 434 is connected to Pad K. The drain electrode of MOS device 434 is connected to pad W. The drain electrode of MOS device 432 is connected through protection circuit 436 to pad U and to pulse control encoder circuit 140.

Figures 8C, 9:
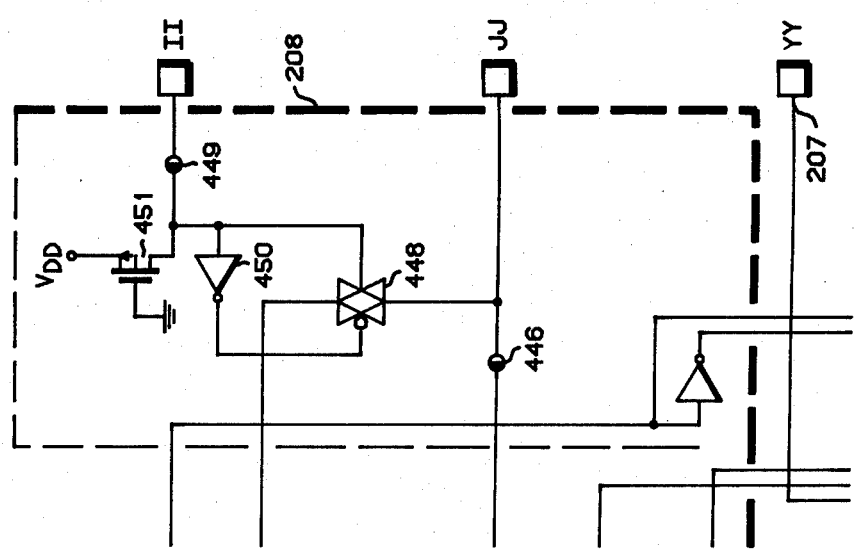

Continuing now with the portion of priority channel circuit 206 as shown in FIG. 8E, the output of inverter 344 as shown in FIG. 8B is coupled as the first input of a NAND 440. An output from push-to-talk circuitry 148 is coupled as the second input to NAND 440. The output of NAND 440 is coupled as a first input of NOR 442. The Q output from toggle flip-flop T14 in second counter 142 is coupled to the first input of a NOR 444. The second input to NOR 444 is derived from the output of protection circuit 446 as shown in the manufacturing test circuit 208 in FIG. 8C. It may be observed that the Q output of $T_9$, the last toggle flip-flop in first counter 134, is connected to the input terminal of the transmission gate 448 as shown in FIG. 8C. Pad II is connected through protection circuit 449 to the positive control terminal and through an inverter 450 to the negative control terminal of transmission gate 448.

With no connection to Pad II the P-channel MOS device 451 allows the signal from the tenth stage of first counter 134 to be clocked through transmission gate 448 to supply the input signal to NOR 444 in priority channel 206, as shown in FIG. 8E and to the input of second counter 142 as shown in FIG. 8H. Continuing with the description for FIG. 8E, the output of NOR 444 is coupled through an inverter 452 as the second input of NOR 442. The output of NOR 442 is connected as the second input of NAND 428 and through an inverter 454 to pad OO. The output of inverter 454 couples through protection circuit 456 and inverter 458 to pad V. The output of NAND 428 is coupled as the third input to NAND 332 in automatic turn-off gates 204 as shown in FIG. 8A.

Referring now to battery saver generator circuit 207 as shown in FIG. 8E, protection circuit 426 is coupled to the input of inverter 460 whose output is connected to the input of inverter 462 whose output is connected as the first input of NOR 464. The output of NAND 440 is connected as the second input of NOR 464 and the Q output terminal of toggle flip-flop T13 of second counter 142 is connected as the third input of NOR 464. The output of NOR 464 is connected through inverter 466 to the YY terminal as shown in FIG. 8C.

Referring now to FIG. 8B, it is advantageous to describe the portions of transmit security circuit 210 as shown in FIGS. 8B and 8H. Terminal LL is coupled to the drain electrode of an N channel MOS device 469 with its source coupled to ground and its gate electrode responsive to pulse control encoder 140, and through protection circuit 470 to the input of a NOR 472. Input terminal GG is coupled to the drain electrode of an N channel MOS device 473 with its source coupled to ground and its gate electrode responsive to pulse control encoder 140, and through protection circuit 474 to the second input of NOR 472. The output of NOR 472 is connected as the first input of a NAND 476. The output of inverter 324 in automatic turn-off gates 204 as shown in FIG. 8A is connected as the second input of NAND 476. The transmit security 210 provides an alert function when a request to provide transmission on a receive only channel has been received.

In FIG. 8H, the output of NAND 476 is coupled as a first input to a NAND 480. The second input is responsive to time-out timer circuit 144. The output of NAND 480 is coupled to the clock terminal and through an inverter 482 to the clock terminal of a data flip-flop 484. $V_{DD}$ is applied to the D terminal and the reset terminal is coupled to reset circuit 136. The Q output of flip-flop 484 is coupled as the first input of a NAND 486 whose second input is derived from push-to-talk circuit 148. The output of NAND 486 is coupled as the first input of a NOR 488 and through an inverter 490 to the gate electrode of an N channel MOS device 492 whose source is connected to ground. The drain electrode of MOS device 492 is connected to Pad CC. The $\overline{Q}$ output of toggle flip-flop $T_4$ in first counter 134 is coupled as the second input of NOR 488. The output of NOR 488 is coupled through an inverter 494 to Pad DD.

The Q output of data flip-flop 484 is coupled as the first input of a NOR 496 in time out timer circuit 144. The output of NOR 496 is coupled through an inverter 498 as the first input of a NAND 500. The output of NAND 500 is coupled as the third input of NAND 366 in automatic turn off gates 204.

FIG. 8C shows manufacturing test circuit 208. This circuit is therefore not involved in the present invention, and therefore it is not necessary to describe either its interconnection or its function. Manufacturing test circuit 208 may be used to accelerate the testing time for integrated circuit 130 through its connection to counter 142. Another section of integrated circuit 130 is shown in FIGS. 8F and 8I and comprises tristate buffers 138. Tristate buffers are well known in the art and consist of devices which have not only ones and logical zeroes but a third state which is characterized by high impedance. Such devices are generally connected in parallel and operate between a data system and a common data bus so that information may be transferred from the tristate devices to the common bus. During the high impedance state of the tristate buffers the other information on the bus will not disrupt the data which is stored in the tristate buffers.

As may be seen from FIGS. 8F and I, alternate combinations of NAND and NOR gates are coupled to pairs of N and P channel insulating gates which serve to provide the combined function of producing logical ones, logical zeroes or with the insulating gate appropriately switched the high impedance of the buffer operation. The output of tristate devices 138 are connected to nine pads which directly couple to PROM 60. Consistent with FIG. 5, the nine pads are designated $A_0-A_8$.

FIG. 9 shows the appropriate arrangement of the nine portions of FIGS. 8A–I. When they are suitably arranged, the entire electrical schematic for integrated circuit 130 will be shown.

FIG. 10 shows a protection circuit which is used throughout IC's 130 and 160. In particular, an input signal is applied to the anode of a diode 520 and to the first terminal of a resistor 522. The second terminal of resistor 522 is connected to the anodes of diodes 524 and 526 and to the cathode of a diode 528. The anodes of diodes 520, 524 and 526 are connected together and to a source of positive voltage designated $V_{DD}$. The cathode of diode 528 is connected to a terminal to indicate the output of the protected circuit. The anode of diode 528 is coupled to a source of voltage $V_{ss}$ which is connected to ground.

FIG. 11 shows the interconnection of the digital frequency synthesizer with the receiver section 72 and transmitter section 74 of the transceiver in a manner similar to that shown for FIG. 3. In addition, the interconnections between channel select control 54 and other portions of the transceiver are shown in greater detail. In particular, channel select control 54 is coupled to a voltage shifter circuit 550 through interconnection pad YY. Voltage shifters 550 supply voltage to several modules of receiver 72 and to prescaler 44. Channel select control 54 is also connected to isolation buffer gates 551 through adjustable delay 552 by means of interconnection pad 00. Isolation buffer gates 551 is interposed between VCO 42 and receiver 72 and transmitter 74; adjustable delay 552 is coupled to an alert device 553 which although not shown is preferably connected to speaker 94. Channel select control 54 is also connected to a channel element circuit 554 through adjustable delay 552 by means of interconnection pad V. The output of channel element 554 is connected to isolation buffer gate 551. An output from receiver 72 is coupled to adjustable delay 552 and back to channel select control 54 by means of interconnection pad Y. As stated earlier, channel select control 54 has the IC implementation 130 as shown in FIG. 4.

The normal functions of the blocks as shown in FIG. 11 are precisely as they were described in FIG. 3 but now the details of the transmitter and receiver sections have been omitted. One of the modifications to this diagram is the interfacing of isolation buffer gate 551 between the VCO and receiver 72. This isolation buffer gate and the inclusion of channel element 554 coupled to receiver 72 form part of the control path for the priority channel system. An additional element of the priority channel system is the interconnection of the squelch detect circuit in receiver 72 back to channel select control 54.

FIG. 11 also shows the basic block diagram for the battery saver generator 207 shown earlier in FIG. 5. In particular, voltage shifters 550 are coupled directly to channel select control 54 and supply voltage to prescaler 44 and to receiver 72. This voltage is based on a duty cycle as determined by channel select control 54. Thus, the total energy consumed by the various portions of the circuitry are under the control of the battery saver generator contained within integrated circuit 130.

To understand the operation of priority channel 206 and battery saver generator 207 it must be remembered that the basic configuration of integrated circuit 130 as shown in FIGS. 8A–I included automatic turn-off gates 204. These gates operate to shut down the application of the time base to the first and second counters 134 and 142 so that energy may be saved after information has been loaded into the latches 56 and 58 from memory. The inclusion of either the priority channel 206 and/or battery saver generator 207 disables the operation of automatic turn-off gates 204 so that the timing contained within either of these two is actuated. Since the digital frequency synthesizer is incorporated in the basic transceiver design to eliminate channel elements, the addition of a priority channel system which now includes a channel element is unique. The normal access time for tuning to a given selected channel through the digital frequency synthesizer system when compared with the turn-on time of a channel element is larger by a factor of approximately 20. Thus, the channel element can be accessed very quickly and this permits sampling at a rate that is much faster than the corresponding lock time of the digital frequency synthesizer. This enables one to monitor activity on a priority channel, utilizing channel element 554 sampled at some duty cycle to determine if there is activity on the channel. The priority channel monitoring system as described in this and in subsequent figures is implemented with a standard channel element 554 and isolation buffer gates 551. One isolation buffer gate serves to apply the synthesizer selected injection signal to the multiplier for receiver 72 during an off sample time for the channel element. It should be noted that isolation buffer gates 551 is coupled between the synthesizer and the receiver and that the logic to the channel element is operated in the alternative to the activation of the isolation buffer coupling the frequency synthesizer to the receiver. Using such an approach, the synthesized frequency is not disturbed during sampling for priority and it is not necessary to relock the phase locked loop for the selected channel in the synthesizer.

In operation, with no carrier present, the selected synthesizer frequency is sampled with a 50—50 duty cycle having a period of approximately 20 milliseconds for approximately 328 milliseconds. This means that channel element 554 or the synthesizer selected frequency are alternately supplied to receiver 72 for approximately 10 milliseconds. During the next 328 milliseconds, the synthesizer selected channel is continuously sampled. This operation is shown in FIG. 12 in the waveforms for interconnection pads 00 and V. This sequence is repeated until such time as a carrier frequency is detected. Once a carrier signal is detected during the synthesizer selected channel sample time then the sampling of the priority channel continues. To prevent a noise burst, the receiver audio is blanked during the priority channel sample time. This condition is shown in FIG. 12 from time $t_1$ to time $t_2$. Note that a high logic level on the waveform for Y shows the detection of a carrier in the squelch circuit of receiver 72.

In on the otherhand, the presence of a carrier is detected on the priority channel, the sampling stops and the receiver is continuously tuned to the priority channel. This is shown in FIG. 12 at time $t_3$. The sample pulse waveforms stop and the priority channel is fully monitored until the detected carrier disappears. At such time, the alternate sampling cycle for the predetermined periods resumes.

The battery saver system was designed to allow for a reduction of the current drain of the synthesized transceiver in a standby mode awaiting the detection of a carrier signal. Two distinct techniques for accomplishing the current drain savings were developed to achieve this. In the first, power is disrupted to selected modules in the phase locked loop without altering the injection frequency to the receiver 72. In the second, power is disrupted to all standby modules in the receiver and certain of the modules in the phase locked loop.

The switching duty cycle and period are preferably selected independently in accordance with each technique. The first technique requires a duty cycle smaller than the sample and hold capacitor leakage discharge time which will be described later. This technique would allow only a small frequency drift of the receiver during the off cycle. It should be observed that this technique permits continual monitoring of the receiver channel because the capacitor is holding the VCO frequency fixed. The duty cycle for the second technique was preferably chosen to be a 50—50 duty cycle for ease of implementation. As shown in FIG. 11, the battery saver circuit within channel select control 54 is connected to voltage shifters 550 through connectors YY. The voltage shifters serve to provide the different voltage levels of the various modules which are in standby operation. FIG. 12 shows the waveform for battery saver generator 207 at Pad YY. The period of the 50—50 duty cycle signal is approximately 328 milliseconds. It should be observed that the presence of a carrier signal can not be detected during the low logic level of the battery saver generator waveform on Pad YY. If however, a carrier is detected during a high logic level then the current high logic level is continued beyond its normal termination time as long as the carrier is present. This is shown during the interval $t_1$ to $t_2$ for waveforms Y, and YY in FIG. 12.

If a carrier is detected on the priority channel, adjustable delay 552 is enabled through pads V and OO. This delay will hold the channel element 554 turned on for an adjustable time period so that if the transceiver operator wishes to respond he can transmit on the priority channel. To confirm that the transmission is being made the priority channel alert device 553 is actuated to provide a signal. At the expiration of the adjustable time period normal operation resumes.

Because of the characteristics of transceivers which include a different multiplier to the injection signal in transmit and receive modes, a correcting multiplier is positioned between isolation buffer gate 551 and transmitter 74 to correct for this factor. In the alternative a separate transmit channel element may be added to the system to allow transmissions in the VHF band. It should be observed that the UHF and 800 MHz transceivers do not require this correction.

Referring now to FIG. 13, the basic electrical schematic of an isolation buffer gate contained in 551 is shown. It will be apparent to those skilled in the art that separate gates would be required for the VHF band to account for the different injection multipliers in transmit and receive modes. FIG. 13 shows the detailed interconnection for the receiver isolation buffer gate and the transmitter isolation buffer gate would be similarly interconnected. The input from VCO 42 is applied at an input terminal 555. A 4.6 volt voltage source is applied through an inductor 556 to input terminal 55 and to the anode of a pin diode 558. The cathode of pin diode 558 is coupled through a capacitor 560 to ground and to the anode of a pin diode 562. Input terminal 555 is coupled through a capacitor 564 to the anode of a pin diode 566. The control input signal is applied through an inductor 568 to the anode of pin diode 566. The cathodes of pin diodes 566 and 562 are coupled through a resistor 570 to ground. The cathodes of pin diodes 566 and 562 are also connected through a capacitor 572 to an output terminal 573. For the receiver isolation buffer gate. The output of channel element 554 is also connected to output terminal 573.

In operation, when the control input signal is at a low voltage level, the 4.6 volt source operating through inductor 556 in combination with pin diodes 558 and 562 operate to reverse bias pin diode 566 thereby preventing conduction between input terminal 555 and output terminal 573. However, when the control voltage increases and reaches a value of 4.6 volts, this forward biases pin diode 566 thus allowing conduction between the input and output terminals. Thus during this time the isolation buffer gate allows the signal from VCO 42 to pass to receiver 72.

FIG. 14, shows the electrical schematic for a voltage shifter 550 of the type utilized in FIG. 11. The objective of the battery saver circuit is to prolong the battery life in the digital frequency synthesized transceiver. The battery saving network is composed of three voltage shifting circuits which provide 4.6, 5.2 and 7.5 volts sources to various modules in receiver 72 and prescaler 44. Channel select control 54 provides a sampling waveform at pad YY through battery saver generator 207 which operates at a 50—50 duty cycle. During the on time, the radio receiver modules are turned on and channel select control 54 monitors the squelch output. In the event that a carrier is detected, the sampling waveform stays high and all of the standby receiver modules are fully turned on. During the off time, if no carrier is present the standby receiver modules are turned off and the current savings is accomplished. In addition, the voltage supplied to prescaler 44 is turned off during this period thus increase current savings is accomplished. The waveform on interconnection pad YY under various conditions is shown in FIG. 12.

Referring now more particularly to FIG. 14, the battery saver generator 207, the output signal on interconnection pad YY is applied through a resistor 580 to the base of an NPN transistor 582 whose emitter is connected to ground. B+ is applied through a resistor 584 to the collector of transistor 582 and through a resistor 586 to the base of a PNP transistor 588. B+ is also applied to the emitter electrode of transistor 588 and the selected voltage output is derived from the collector of transistor 588. Depending upon the choice of the values of resistors 580, 584 and 586, the 4.6, 5.2 and 7.5 switched output voltages may be supplied to the various modules in receiver 72 and to prescaler 44.

FIG. 15 shows the waveforms for the principal output signals of pulse control encoder 140. Pulse control encoder 140 supplies signals to the $N_A$ and $N_P$ latches through multiplexer 62 and ultimately to PROM 60 through IC 180. The sequence of loading information at an appropriate address in PROM 60 into the $N_A$ and $N_P$ latch is shown by the waveforms for LL and GG respectively. Pulse control encoder 140 operating through pulse regulator high current circuit 188 (FIG. 4) supplies power to PROM 60 through interconnection pad KK. FIG. 15 also shows the first bit address $A_0$ from tri-state buffers 138 to PROM 60. It may be observed that information is latched in $N_A$ latch 58 and $N_P$ latch 56 during the low and high logic levels respectively of the signal at $A_0$. It should be noted that at this time $A_1$ to $A_8$ contain the remaining bits comprising of the address for PROM 60 derived from the position of the channel selector switch 52.

FIG. 16 shows the basic addresses and location of the binary representations of the numerical divisors in PROM 60. Structurally, PROM 60 is divided into two sections, the lower section corresponding to receive channels and the upper section corresponding to transmitter channels. The PROM intended for use in this application may be a 256 by 8 bit off-the-shelf open collector type of device, since a device of this type would provide the memory capacity to store the information for 64 possible channels.

The first column on the left of FIG. 16 lists the hexadecimal PROM addresses from 00-FF which corresponds to 256 possible locations. Each designated row consists of eight columns with the most significant bit listed on the left proceeding to the least significant bit on the right. Concentrating now on PROM address locations 00 and 01, it may be seen that the $N_A$ divisor is stored in the first location with the corresponding $N_P$ divisor or rather the binary representation thereof is stored in the next location at the next higher hexadecimal address. The combination of the $N_A$ and $N_P$ corresponds to one channel as is designated in FIG. 16. In particular, the $N_P$ and $N_A$ shown loaded in the first received channel position correspond to one of the end points of the VHF frequency range described earlier in the specification.

As may be seen in FIG. 16, every 32 addresses are segregated resulting in four regions or zones of the receiving channel portion and four zones of the transmitter channel portion. It should be observed that each channel requires two address locations, one for the $N_A$ binary representation and the second address for the $N_P$ binary representation. Thus, for each 32 rows starting from the bottom row going up to the first division line on FIG. 16 correspond to the first 16 receiver channels. The next 32 rows correspond to the binary representations of the $N_A$ and $N_P$ divisors for channel 17-32. Similarly, the next 32 rows correspond to the divisors for channels 33-48 and the next 32 rows correspond to the binary representations of the divisors for channels 49-64. Zone A is shown to correspond to channel numbers 1-16; Zone B to channel numbers 17-32; Zone C to channel numbers 33-48; and Zone D to channel numbers 49-64. The transmitter section is similarly segregated with the switching of the address control from tristate buffers 138 being determined by the actuation of push-to-talk switch 146 operating through push-to-talk circuit 148. When this switch is actuated, interconnection terminal $A_7$ goes to a high level which causes the shifts in the address to the upper section of PROM 60.

As stated earlier, PROM 60 is preferably a 256 by 8 bit off-the-shelf open collector type of device. Such programmable read-only memories are normally supplied by the manufacturer with links which can be blown and the presence or absence of a link corresponds to a binary 1 or 0. The memories are normally provided with all of the links in place so that they may be blown in any required pattern. Because of this convenience and as will be described in greater detail for the subsequent circuitry, if a receive only channel is desired, code plug PROM 60 may be blown with the desired $N_A$ and $N_P$ divisors in the lower or receive only section of PROM 60. There are two possibilities for the corresponding address for the transmit chanel which depend upon whether the code plug is to secure against incorrect transmissions until it is further modified or is to prevent all transmissions on the channel. The corresponding address in the transmit section could be left as manufactured with all 1's which in the transmit channel address would allow for subsequent modification to remove the receive only limitation or blown in a pattern which will never allow transmission on that channel. A portion of the circuit to be later described will monitor one or more bits in the $N_P$ and $N_A$ information for the transmit conditions to determine whether or not this is a channel designated for receive only. At such time, the transmit security system as described for FIGS. 8A-I will actuate an alert tone to the user to indicate that he has attempted to transmit on a receive only channel.

As will be described in greater detail for the subsequent circuitry, various portions of the binary representation of the $N_P$ and $N_A$ divisors may be individually monitored to achieve various functions in the digital frequency synthesizer. As will be explained in greater detail for the range divider control, the inclusion of such circuitry reduces the complexity of the binary representation of $N_P$ and thus allows only eight bits to be used to clearly identify all of the necessary divisors for a predesignated radio. Moreover, since channel spacing may be different for the transmit and receive frequencies, another portion of the $N_A$ binary representation is monitored to determine the presence or absence of a predetermined binary configuration. This predetermined configuration modifies the value of the normally fixed divide ratio for the reference oscillator so that the channel spacing is appropriate to correspond to the communication channel which is being utilized.

The various aspects of the information contained in the memory are raised at this point but the circuitry which utilizes this information and its interaction with the remainder of the circuit will be described in detail later.

Figure 17:
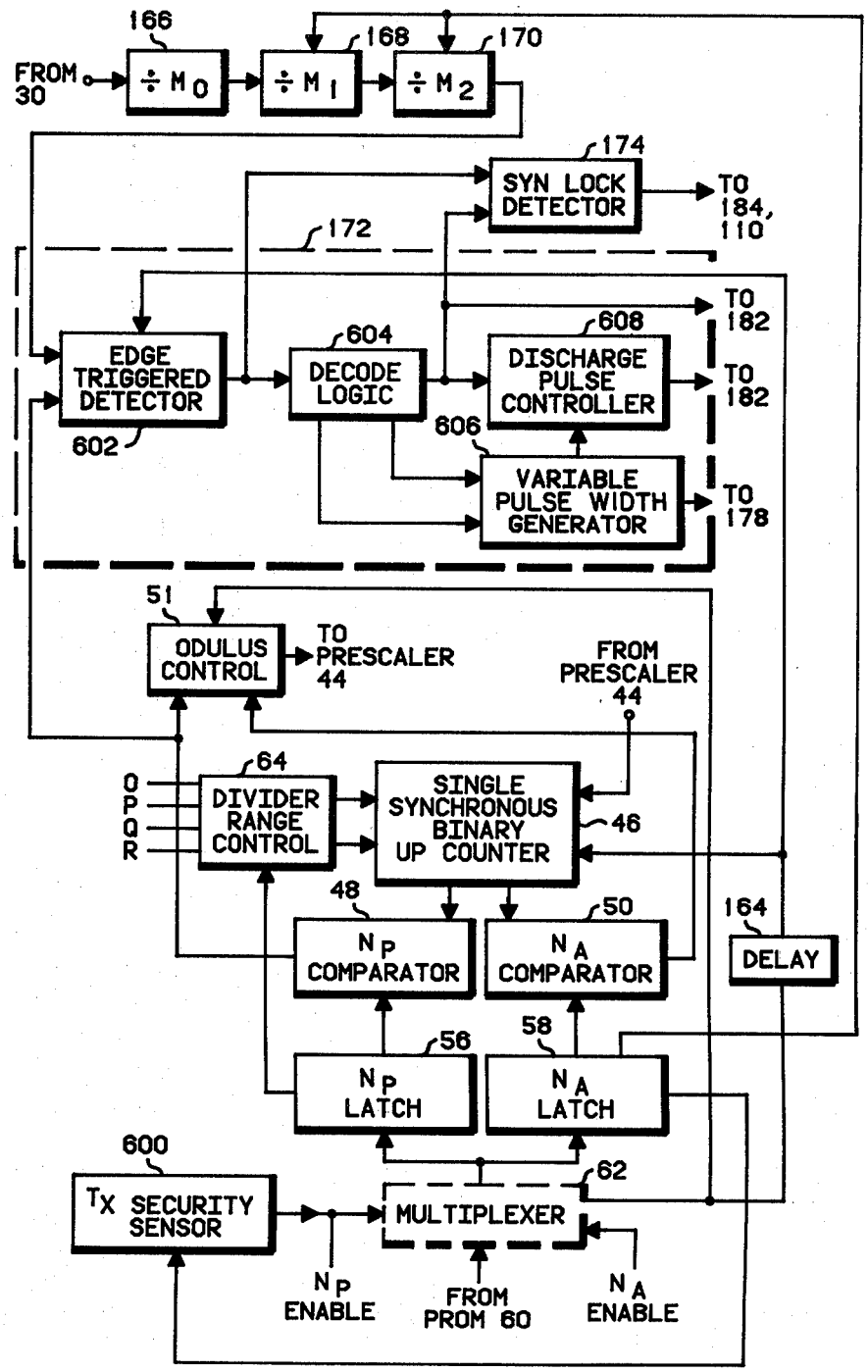
FIG. 17 is a detailed functional block diagram for the divisional portion and the phase detector for the frequency synthesis system of the present invention.

FIG. 17 is a detailed block diagram for integrated circuit 160. The outputs of PROM 60 are coupled to multiplexer 62 shown in phantom which in response to enable signals from pulse control encoder 140 (not shown) alternately supplies information to $N_P$ latch 56 and $N_A$ latch 58. Multiplexer 62 represents the operation of transferring information from PROM 60 to the actuated latches and in reality there exists no block between PROM 60 and latches 56 and 58. $N_P$ latch 56 is coupled to range divider control 64 which is coupled to synchronous binary counter 46. Range divider control 64 receives 4 input signals designated O, P, Q and R. $N_P$ latch 56 is also coupled to $N_P$ comparator 48. An output from $N_A$ latch 58 is coupled to dividing circuits 168 and 170. $N_A$ latch 58 is also coupled to $N_A$ comparator 50. The output of prescaler 44 is supplied to a synchronous binary counter 46. Two signal outputs of counter 46 are applied to an $N_P$ comparator 48 and an $N_A$ comparator 50. An output of $N_P$ comparator 48 and an output of $N_A$ comparator 50 are coupled to a modulus control circuit 51. The output of modulus control circuit 51 is coupled to prescaler 44. The $N_P$ enable signal passes through multiplexer 62 and is coupled to delay circuit 164. The output of delay circuit is coupled to counter 46. $N_A$ latch 58 is coupled to a transmit security sensor 600 whose output is coupled with the $N_P$ enable signal and supplied to multiplexer 62.

The output of reference oscillator 30 is supplied to a series of dividing circuits 166, 168 and 170. The output of dividing circuit 170 is coupled as the first input of an edge triggered detector 602. The output of $N_P$ comparator 48 which is supplied to modulus control 51 is supplied as the second input of detector 602. The output of delay circuit 164 is coupled as the third input of detector 602. A first output of detector 602 is coupled to synthesizer lock detector 174 and a second output is coupled to a decode logic circuit 604. Decode logic circuit 604 supplies two output signals to a variable width pulse generator 606 which has one output coupled to a discharge pulse controller 608 and a second output coupled to ramp generator 182. Decode logic circuit 604 supplies the same output to synthesizer lock detector 174, ramp generator 182 and discharge pulse controller 608. The output of discharge pulse controller 608 is also supplied to ramp generator 182. Functional blocks 602, 604, 606 and 608 are shown enclosed by a broken line to comprise digital detector 172.

FIG. 18 is a detailed electrical schematic of the frequency divisional circuitry for the digital frequency synthesizer. The interconnection for the various component parts of FIGS. 18A-L are shown in their proper arrangement in FIG. 19. However, for ease of explanation, the figures will be described of order to follow a natural input signal path for the digital frequency synthesizer.

FIG. 18L shows multiplexer 62 in conjunction with transmission security sensor 600. As described earlier, multiplexer 62 does not necessarily represent a physical device which is interposed between PROM 60 and the $N_A$ and $N_P$ latches, rather it is designed to show the signal application relationship so that the function of the latches in response to information from PROM 60 may be more fully understood. The signals from pulse control encoder 140 in integrated circuit 130, as shown in FIGS. 4 and 5, supply timing signals to multiplexer 62. Interconnection terminal LL is coupled through a protection circuit 620 to an inverter 622. The output of inverter 622 is designated as a signal NAE and this signal is also supplied to an inverter 624. The output of inverter 624 is a signal designated $\overline{NAE}$. Protection circuit 620 is connected to the drain electrode of a P channel MOS device 626 whose gate electrode is connected to ground. The source electrode of MOS device 626 is connected to the source electrode of a P channel MOS device 628 whose gate electrode is also connected to ground. Pulse control encoder 140 operating through interconnection pad GG is connected through a protection circuit 630 to the drain electrode of MOS device 628 and to the input of an inverter 632. The output of inverter 632 is a signal designated NPE and is also supplied to an inverter 634. The output of inverter 634 is a signal designated $\overline{NPE}$.

Multiplexer 62 functions to detect the $N_P$ and $N_A$ latching signals generated by pulse control encoder 140 and to create appropriate signals to cause the latching of the information from PROM 60 into the $N_P$ and $N_A$ latches. Multiplexer 62 serves to show the sequence of operation for loading information into the appropriate latch.

Because it is also shown in this figure, it is appropriate at this time to describe briefly the detailed electrical schematic for transmitter security sensor 600 whose operation was described in conjunction with the description of FIG. 17. As may be seen protection circuit 630 is connected to the drain electrode of an N channel MOS device 636 which is connected in series with a second N channel MOS device 638 whose source is connected to ground. The gate electrodes of MOS devices 636 and 638 receive signals which correspond to designated binary representation positions contained within the series of $N_A$ latches 58, as will be described in greater detail later.

When both signals to the gate electrodes of MOS devices 636 and 638 are high, then interconnection pad GG in pulse control encoder 140 is pulled to a low logic level, LL will also be at a low logic level. These low logic levels for GG and LL are decoded in IC 130 through OR 472 coupled to AND 476 and through NAND 480 to enable flip-flop 484 to produce an alert signal indicating that an attempted transmission has occurred on a receive only channel. The operation of flip-flop 484 also disables the relay interface 150 to prevent keying the transmitter circuit. Thus, there can be no transmission on a receive only channel.

It will be recalled that the binary representations of $N_A$ and $N_P$ were described in the description for FIG. 16. At that time, it was stated that a particular binary pattern would be used to designate receive only channels. Because of the choice of the VHF band for the preferred embodiment and the resultant frequency ranges, it has been determined that an $N_A$ will never exceed the value of 80 which is the modulus for the preferred embodiment. Therefore, those binary bits which would indicate an $N_A$ value greater than 80 are no necessary for tuning the digital frequency synthesizer and are thus available to indicate other information. In this particular case, the $2^5$ and $2^6$ binary positions of the $N_A$ word are monitored for high logic levels in both positions thus clearly indicating that the $N_A$ number exceeds 80. This serves as a marker for a receive only channel.

As has been described, when the $2^5$ and $2^6$ binary positions of the $N_A$ word are at a high logic level, a receive only channel is designated. As was described previously for PROM 60 FIG. 16, if the entire $N_A$ word contains 0's except for the $2^5$ and $2^6$ position, then PROM 60 contains a receive only channel that can never be subsequently modified for transmission. It would be clear to those skilled in the art that other patterns may be used to clearly designate receive only channel and that the choice here is arbitrary and selected in conjunction with the preferred embodiments use of a standard 256 by 8 bit memory.

Referring now to FIGS. 18J and K, the detailed electrical schematics for the $N_P$ latch 56 and $N_A$ latch 58 are shown. Each $N_P$ latch 56 and $N_A$ latch 58 is composed of eight separate binary latches which are coupled to the eight output lines of PROM 60 to accept he binary bit configuration of the corresponding $N_P$ and $N_A$ words and latch them into a temporary storage so that power to the PROM 60 may be disrupted. This serves to achieve an additional energy savings. The operation of the individual binary latch corresponding to the retention of one bit of information will be described in detail. It is this single bit latch which is then repeated 15 more times to produce the 16 bit total which is the sum of $N_P$ latch 56 and $N_A$ latch 58.

The binary representation of information stored in PROM 60 is shown in FIG. 18J. In particular, the $2^0$ output terminal of PROM 60 is coupled to the drain electrode of a P channel MOS device 640 whose source is connected to VDD and whose gate is connected to ground. MOS device 640 is a standard pull up device to hold the $2^0$ node high so that the open collector PROM 60 can input a high level logic signal into the latch. The $2^0$ terminal of PROM 60 is connected to the input terminal of a transmission gate 642 whose positive control terminal is coupled to signal NPE and whose negative control terminal is coupled to signal $\overline{NPE}$. The output terminal of transmission gate 642 is coupled to the input of an inverter 644 whose output is coupled to inverter 646. The output terminal of transmission gate 642 is also connected to the output terminal of a transmission gate 648 whose positive control terminal is connected to signal NPE and whose negative control terminal is connected to signal $\overline{NPE}$. The output of inverter 646 is connected to the input terminal of transmission gate 648. The output of inverter 646 is also supplied to $N_p$ comparator 48 as will be described in greater detail later.

In operation, a logic level imposed by PROM 60 on the B $2^0$ output terminal is sensed at transmission gate 642 which during a high logic level NPE signal transfers that information to inverters 644 and 646. When signal NPE goes to a low logic level, transmission gate 648 is opened and transmission gate 642 is closed thus locking a voltage level in the circuit corresponding to the value of the logic level applied at the $2^0$ terminal. Thus the logic level is stored in the circuit comprised by inverters 644, 646 and transmission gate 648. When the binary information is latched into the binary latching device, power may be disrupted to PROM 60. The output of the latch 56 is available for $N_p$ comparator 48 for subsequent comparison operations to the state of the binary counter 46.

Figure 18A:
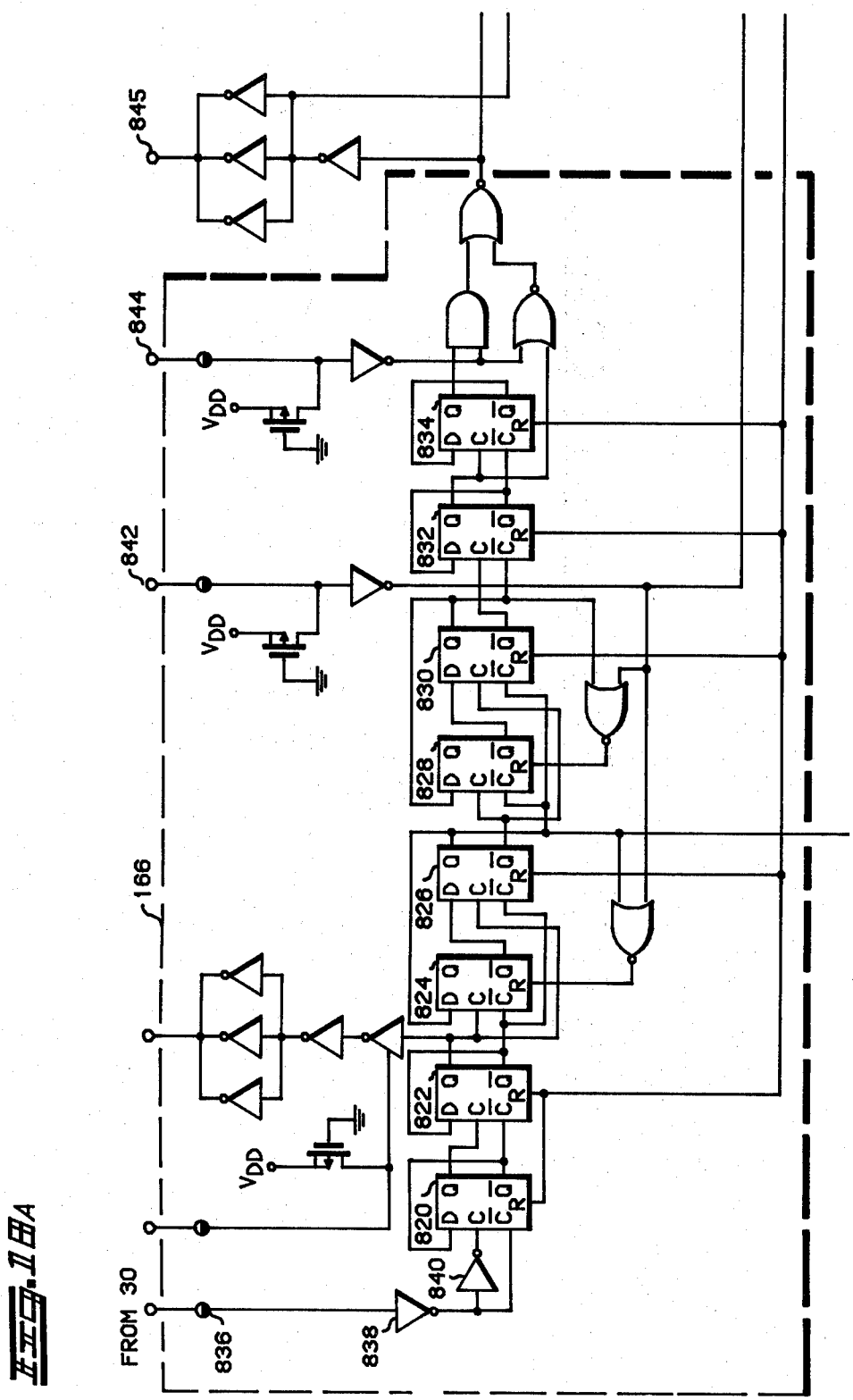

It should be observed that the $2^0$ output terminal of PROM 60 as shown in FIGS. 18J and K is also coupled to a similar $2^0$ latch position in $N_A$ latch 58. In a similar manner, a pair of transmission gates cooperates with a pair of inverters series to latch in the logic level corresponding to an individual binary position of the information contained in PROM 60. It should be noted that in FIG. 18J, the ordering of information is from least significant bit on the right to most significant bit on the left whereas the arrangement for $N_A$ latch 58 shown in FIG. 18K is from least significant bit on the left to the most significant bit on the right. Another slight difference between the operations of $N_P$ latch 56 and $N_A$ latch 58 is that the $N_A$ latch responds to the timing signals which are designated NAE and $\overline{NAE}$ while the $N_P$ latch responds to NPE and $\overline{NPE}$. The fundamental difference between the latches is that different portions of PROM 60 are accessed during different timing intervals and the corresponding latch is enabled during the appropriate timing interval. In this manner, so that the information in PROM 60 may be locked into the appropriate latch corresponding to which of the $N_A$ or $N_P$ information addresses has been accessed. In all other respects, the latches are identical and really serve only to latch information contained in PROM 60 into the IC 160 so that it may be used in the divisional operation of the frequency synthesizer.

Referring now to FIG. 18K, attention should be directed to the $2^5$ and $2^6$ individual binary latching devices shown in $N_A$ latch 58. In addition to supplying an output to $N_A$ comparator 50, as will be described later, outputs from the $2^5$ and $2^6$ binary positions of $N_A$ latch 58 are connected respectively to MOS devices 636 and 638. Thus, the $2^5$ and $2^6$ binary positions of the $N_A$ word are monitored with the presence of two high logic levels in these positons. When this occurs for the digital frequency system of the preferred embodiment, the presence of a receive only channel is indicated. Thus, when the $N_A$ information from PROM 60 is latched into $N_A$ latch 58, transmission security sensor 600 can detect this binary pattern and operating through pulse control encoder 140 to cause an alert signal when the transmission mode is selected by actuation of push-to-talk switch 146. This detection in no way affects normal receiver tuning to the channel designated by the combination of $N_P$ and $N_A$ words for the receive only channel, as that operation is in no way hindered by the sensing of these two bits. However, in conjunction with actuation of push-to-talk switch 146, as has been described earlier, the transmit function is disabled and an alert signal is produced.

FIG. 18I shows in greater detail range divider control 64. In particular, four logic input lines designated O, P, QQ and R, are supplied to this circuit. These lines may be hard wired or selectable by various functions in the transceiver. The operation of range divider control 64 is to select the appropriate range for the divisional operation contained in integrated circuit 160 which allows a reduction in the required size of the code plug memory 60. With the inclusion of range divider control 64, an ordinary off-the-shelf PROM device having the capability of containing 256 by 8 words will provide sufficient information to cause tuning to 64 separate transmit and receive communication channels. Range divider control 64 also operates in conjunction with activation of the push-to-talk switch 146 which actuates the transmit operation for the transceiver and provides any change in numerical range to tune to the transmission frequency. Indeed this is the case for the VHF frequencies and the detailed description of the $N_A$ and $N_P$ words which was described earlier. It will be recalled that for the VHF band, the transmit and receive frequencies are different. And further that for the transceiver of the preferred embodiment, there are different multipliers in both the transmit and receive modes. The combination of these two features, require that the range divider control respond to the actuation of the transmit mode of operation to alter the range so that the smaller PROM 60 may be utilized to supply all the information necessary to achieve transmit or receive tuning throughout the entire band.

Terminal O is connected to the drain electrode of a P channel MOS device 650 whose gate electrode is connected to ground and whose source electrode is connected to VDD. Terminal O is also connected to the input terminal of a transmission gate 652 whose positive control input terminal is coupled to signal NAE and whose negative input control terminal is coupled to signal $\overline{NAE}$. The output terminal of transmission gate 652 is coupled to a series arrangement of inverters 654 and 656. The output of inverter 656 is coupled to the input terminal of a transmission gate 658. The output of transmission gate 658 is coupled back to the output terminal of transmission gate 652 and to the input of inverter 654. The positive control input terminal of transmission gate 658 is responsive to signal $\overline{NAE}$ and the negative control input terminal is responsive to signal NAE. The combination of inverters 654, 656 and transmission gate 658 operate in conjunction with transmission gate 652 as a latching device which is substantially identical to the $N_P$ latch previously described.

The output terminal of transmission gate 652 is also connected to the negative control terminals of transmission gates 660 and 662 and to the input of inverter 654. The output of inverter 654 is coupled to the positive control terminals of transmission gate 660 and 662. An input from the output of the binary bit latch corresponding to the $2^7$ position in $N_P$ latch 56 is also coupled to the input terminal of transmission gate 662 and through an inverter 664 to the input terminal of a transmission gate 666. Input terminal QQ is connected through a protection circuit 668 to the output terminal of transmission gate 660 and, as will be described in detail later, is connected to the tenth stage of $N_P$ comparator 48 which corresponds to the B $2^9$ binary position. Input terminal P is connected through protection circuit 670 to the negative control terminal of transmission gate 666 and through an inverter 672 to its positive control terminal. Pad R is coupled through protection circuit 674 to the drain electrode of a P channel MOS circuit 676 whose gate is connected to ground and whose source is coupled to VDD. Input protection circuit 674 is also connected to the output terminal of transmission gate 666, to the output terminal of transmission gate 662, and through an inverter 678 to the input terminal of transmission gate 660.

For the selected receive frequency as shown contained in PROM 60 in FIG. 16 during the receive operation, the appropriate logic levels for interconnection terminals O, P, QQ, and R are respectively as follows: a logic level 1, a logic 0 achieved by connection of a resistor to ground, a logic 0 again achieved by the connection of a resistor to ground and no connection on terminal R which is then maintained at a high logic level because of the operation of the pull up device shown by the presence of P channel MOS device 676. It should be noted that while O, QQ and R remain the same for transmit, P changes because of the different fequency in the VHF band for transmission and reception.

Range control circuit 64 controls the range of counter 46 to cover all frequencies from VHF through the 800 MHz band. The combination of transmission gates and inverters shown in FIG. 18I provides the flexibility of programming all of the required ratios, which could not be covered exclusively with the eight programmable $N_P$ bits. The range control circuit acts on the two most significant bits of the $N_P$ word ($2^8$ and $2^9$, IC 160 pads R and QQ, respectively) by programming two hard wired control bits (IC 160 pads and P and 0) and interrogating the programmed logic level of the $2^7$ bit of the $N_P$ word stored in PROM 60. A truth table of the combinations of this circuit and the respectively $N_P$ divider ranges will be shown subsequently in FIG. 22.

Referring now to FIGS. 18F and G, synchronous binary counter 46 is shown along with $N_P$ comparator 48 and $N_A$ comparator 50. Counter 46 comprises a ten stage binary up counter which as shown in the figure has the least significant bit or first stage on the far left of FIG. 18F and the most significant bit or tenth stage on the right in FIG. 18G. Each of the stages of counter 46 is comprised of a data flip-flop coupled to appropriate logic gates. The data flip-flops, starting at the first stage and advancing to the tenth stage are designated 700, 702, 704, 706, 708, 710, 712, 714, 716 and 718. An input signal from prescaler 44 is applied through a protection circuit 720 to an inverter 722. The output of inverter 722 is connected to the clock terminal of flip-flops 700, 702, 704, 706, 708, 710, 712, 714, 716 and 718. In addition, the output of inverter 722 is connected to an inverter 724 whose output is connected to the clock input terminals of flip-flops 700, 702, 704, 706, 708, 710, 712, 714, 716 and 718. All of the reset terminals of flip-flops 700, 702, 704, 706, 708, 710, 712, 714, 716 and 718 are connected so that all stages may be rest simultaneously. This reset signal will ultimately be derived from $N_P$ comparator 48 (as shown in FIG. 18H).

For flip-flop 700 the $\overline{Q}$ output terminal is connected to the data input terminal. The Q output terminal is connected as the first input of an Exclusive NOR 730 and to the first input of AND gates 732, 734 and 736.

For flip-flop 702, the $\overline{Q}$ output is coupled as the second input of Exclusive NOR 730. The outut of Exclusive NOR 730 is connected to the data input terminal of flip-flop 702. The Q output terminal of flip-flop 702 is connected as the second input of AND's 732, 734 and 736. The output of AND 732 is connected as the first input of an Exclusive NOR 738. The $\overline{Q}$ output of flip-flop 704 is connected as the second input of Exclusive NOR 738. The output of Exclusive NOR 738 is connected to the data input terminal of flip-flop 704. The Q output terminal of flip-flop 704 is connected as the third inputs of AND 734 and AND 736.

The output of AND 734 is connected as the first input of an Exclusive NOR 740. The $\overline{Q}$ output terminal of flip-flop 706 is connected as the second input of Exclusive NOR 740. The output of Exclusive NOR 740 is connected to the data input terminal of flip-flop 706. The Q output terminal of flip-flop 706 is connected as the fourth input of AND 736. The output of AND 736 is connected as the first input of an Exclusive NOR 742. The $\overline{Q}$ output terminal of flip-flop 708 is connected as the second input of Exclusive NOR 742. The output of Exclusive NOR 742 is connected to the data input terminal of flip-flop 708.

The output of AND 736 is also connected as the first input to AND's 744, 746, 748, 750 and 752. The Q output of flip-flop 708 is connected as the second input of AND's 744, 746, 748, 750 and 752. The output of AND 744 is connected as the first input of an Exclusive NOR 754. The $\overline{Q}$ output terminal of flip-flop 710 is coupled as the second input of Exclusive NOR 754. The output of Exclusive NOR 754 is coupled to the data terminal of flip-flop 710. The Q output of flip-flop 710 is coupled as the third input of AND's 746, 748, 750 and 752. The output of AND 746 is coupled as the first input of an Exclusive NOR 756. The Q output terminal of flip-flop 712 is connected as the second input of Exclusive NOR 756. The output of Exclusive NOR 756 is coupled to the D input terminal of flip-flop 712. The Q output terminal of flip-flop 712 is coupled as the fourth input of AND's 748, 750 and 752. The output of AND 748 is connected as the first input of an Exclusive NOR 758. The $\overline{Q}$ output terminal of flip-flop 714 is coupled as the second input of Exclusive NOR 758. The output of Exclusive NOR 758 is connected to the D input terminal of flip-flop 714. The Q output terminal of flip-flop 714 is connected as the fifth input of AND's 750 and 752.

The output of AND 750 is connected as the first input of an Exclusive NOR 760. The $\overline{Q}$ output terminal of flip-flop 716 is connected as the second input of Exclusive NOR 760 and the output of Exclusive NOR 760 is connected to the D input terminal of flip-flop 716. The Q output terminal of flip-flop 716 is coupled as the sixth input of AND 752. The output of AND 752 is connected as the first input of an Exclusive NOR 762. The $\overline{Q}$ output terminal of flip-flop 718 is coupled as the second input of Exclusive NOR 762 and the output of Exclusive NOR 762 is coupled to the D input terminal of flip-flop 718. The $\overline{Q}$ output terminal of flip-flop 718 is also connected as the first input of a NAND 764. The clock terminal of flip-flop 718 is connected through a fuffer gate 766, which comprises four inverters in series. The output of buffer 766 is coupled as the second input of NAND 764. The $\overline{Q}$ output of flip-flop 716 is coupled as the third input of NAND 764 and the $\overline{Q}$ output of NAND 714 is coupled as the fourth input of NAND 764.

As has been described, a ten stage binary counter is suitably interconnected to provide synchronous binary counting. The various stages are interconnected with their reset terminals so that upon a determination by other logic gates in the circuit the entire counter may be reset. In effect the Exclusive NOR's of the bit comparators are programmed by the $N_P$ word to tell the counter when to reset. It is significant to note that the ten stage counter provides sufficent counting for both the $N_A$ and $N_P$ and indeed only one single synchronous binary counter is utilized for this purpose. The use of a single synchronous binary counter to achieve the counting operation for the digital frequency synthesizer is dependent upon its unique design. In the prior art, pulse swallowing is a high speed counting technique which is achieved by using a two-modulus prescaler controlled by a "swallow counter" operating in parallel with a program counter. Both counters are designed to be preset with a desired preset count and to down count to zero. This can provide an early decode feature for the counting operation.

The prescaler can be controlled to divide by either a lower modulus P or an upper modulus P+1. In operation, the prescaler initially divides by the upper modulus. At a predetermined count, the swallow counter feeds back a control signal to the prescaler that causes it to divide by the lower modulus. Although the program counter has not been changed, increasing the swallow counter by one results in the overall divide ratio being increased by one. The prescaler has effectively "swallowed" an extra pulse, hence the name for the technique.

A careful analysis of the prior art operation shows that the swallow counter counts P+1 pulses from a prescaler $N_1$ times while the program counter counts P pulses ($N_2$–$N_1$) times. It has been discovered that a single synchronous up counter may be utilized to achieve both of these counts.

The $N_A$ and $N_P$ single counter 46 is designed as a synchronous up counter to minimize phase jitter of the flip-flops. The decoding of the $N_A$ and $N_P$ words is achieved through a dual decoding technique using Exclusive NOR gates to compare the state of the counter and the programmed binary word stored in the $N_A$ and $N_P$ latches. With the single synchronous counter $N_1$ and $N_2$ may be identified with $N_A$ and $N_P$ respectively. The single counter counts (P+1) pulses from prescaler 44 $N_A$ times. When the modulus changes, the count in counter 46 is $N_A$. Counter 46 continues counting now P pulses ($N_P$–$N_A$) times and the final count in the counter is $N_P$. Thus the counter itself is used to remember the $N_A$ word so that the $N_P$–$N_A$ count can be determined. The implementation of this unique design avoided the need for the separate $N_A$ counter chain generally used in all conventional swallow counter. As a result a size reduction of more than 25% was accomplished on the area of the chip occupied by the counting function.

Upon every channel change, counter 46 is reset and the modulus control 51 is set to a low logic state which forces the prescaler to divide on the P+1 mode. Hence, the VCO output frequency is divided down by P+1 in prescaler 44, counter 46 advances on the negative going edge of the prescaler output pulses. For every P+1 pulse into programmable counter 46, both the $N_A$ and $N_P$ counts are incremented by one. Prescaler 44 divides by P, a total of $N_P$–$N_A$ pulses, until the $N_P$ count equals the $N_P$ programmed word at this time the system resets and the cycle repeats.

Continuing now with the description for FIG. 18G, $N_A$ comparator 50 comprises seven Exclusive NOR gates which are appropriately interconnected between counter 46 and $N_A$ latch 58. The binary representation in the order of least significant bit, to most significant bit for the latch information at the $2^0$–$2^7$ $N_A$ latches is applied respectively to the first input of Exclusive NOR gates 767, 768, 770, 772, 774, 776 and 778. The Q output of flip-flop 700 is connected as the second input of Exclusive NOR 767. The Q output of flip-flop 702 is connected as the second input of Exclusive NOR 768, the Q output of flip-flop 704 is connected as the second input of Exclusive NOR 770, the Q output of flip-flop 706 is connected as the second input of Exclusive NOR 772, the Q output of flip-flop 708 is connected as the second input of Exclusive NOR 774, the Q output of flip-flop 701 is coupled as the second input of Exclusive NOR 776 and the Q output of flip-flop 712 is coupled as the second input of Exclusive NOR 778.

The output of buffer 766 is coupled as the first input of a NAND 780. The outputs of Exclusive NOR's 767, 768, 770, 772, 774 are connected as the remaining inputs of NAND 780. The output of Exclusive NOR's 776 and 778 are coupled as inputs of NAND 764. The output of NAND 780 is connected as the first input of a NOR 782 and the output of NAND 764 is connected as the second input of NOR 782.

$N_A$ comparator 50 is a relatively simple design which employs Exclusive NOR's as comparators. A Exclusive NOR gate provides a high logic level output when the inputs are the same. Thus, when the $2^0$–$2^6$ binary representation of the $N_A$ word loaded into $N_A$ latch 58 is the same as the binary representation of the first seven stages of counter 46, $N_A$ comparator 50 indicates that the counter has reached the $N_A$ word.

Referring now to $N_P$ comparator 48, as shown more clearly on FIGS. 18F and G, it may be seen that $N_P$ comparator 48 comprises ten Exclusive NOR gates designated as 784, 786, 788, 790, 792, 794, 796, 798, 800 and 802 each of which has one input connected to the Q output of a corresponding stage of counter 46. Thus, for example, the Q output terminal of flip-flop 700 is connected as the first input of Exclusive NOR 784. It will be recalled in the discussion for $N_P$ latch 56, that the eight outputs were listed in highest to lowest order in going from left to right. Therefore, the $2^0$ output from $N_P$ latch 56 is coupled as the second input to Exclusive NOR 784. Each of NOR's 784, 786, 788, 790, 792, 794, 796, and 798 receive a corresponding binary representation output from $N_P$ latch 56. The $2^7$ output from $N_P$ latch 56 is connected as the second input terminal of Exclusive NOR 798. Terminal R coupled through protection circuit 674 is connected as the second input of Exclusive NOR 800 and terminal QQ operating through protection circuit 668 is coupled as the second input to Exclusive NOR 802. Thus, we see that the range divider circuit 64 is coupled to the $N_P$ comparator to designate and control the comparison operation for the ninth and tenth stages of the synchronous binary counter 46.

Continuing with the interconnection for $N_P$ comparator 48, the output of buffer 766 is connected as the first inputs of NAND's 804 and 806. The remaining five inputs of NAND 804 are the outputs respectively of Exclusive NOR's 794, 796, 798, 800 and 802. Similarly, the five remaining inputs of NAND 806 are coupled to the outputs of Exclusive NOR's 784, 786, 788, 790 and 792. The output of NAND's 806 and 804 are coupled as the inputs of a NOR 808.

As was stated in the description for FIG. 17, the outputs from $N_P$ comparator 48 and $N_A$ comparator 50 are supplied to modulus control circuit 51. Referring now to FIG. 18H, modulus control 51 circuit comprises a series of flip-flops which provide a signal to prescaler 44 to cause actuation of the modulus change. The output of NOR 808 is supplied as the first input of an OR gate 810 whose second input is derived from delay circuit 164, as will be described in more detail later. THe output of OR 810 is supplied to the reset terminals of the ten stages of counter 46. The outputs from inverter's 722 and 724 which are applied respectively to the clock and $\overline{\text{clock}}$ terminals of the ten stages of counter 46 are applied to the clock and $\overline{\text{clock}}$ terminals of data flip-flops 812 and 814 contained in modulus control circuit 51. The outputs from flip-flops 814 and 812 are coupled to RS latches comprised of NOR gates which serve to lengthen the output pulse from counter 46. The outputs of the corresponding RS latches ae coupled to a further latch which is then coupled to the output supplied to prescaler 44.

The function of modulus control 51 is to cause the modulus of the prescaler 44 to change at a time when the first seven stages of counter 46 correspond to the predetermined binary pattern for the $N_A$ word. At that time, prescaler 44 changes modulus and continues counting in the same single synchronous binary counter 46. Counter 46 then continuous counting until it reaches $N_P$ and there it resets.

Figure 18E:
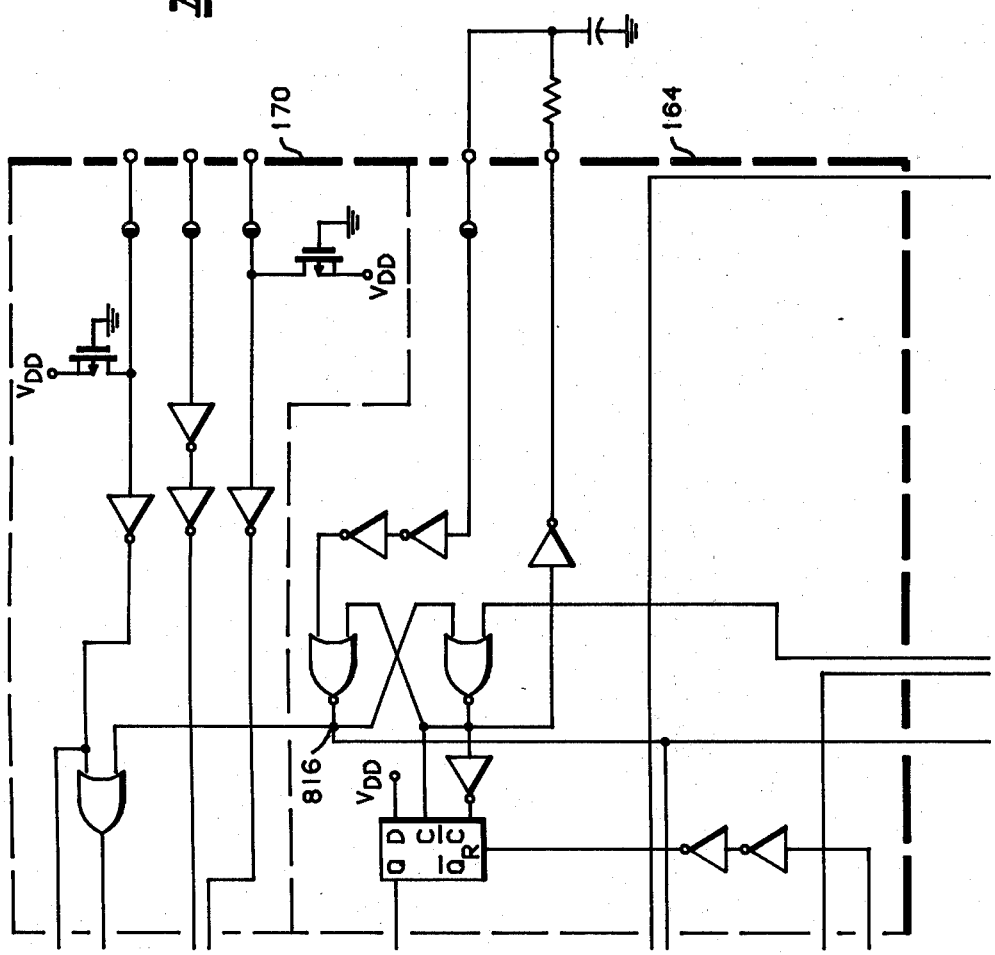
Figure 18H:
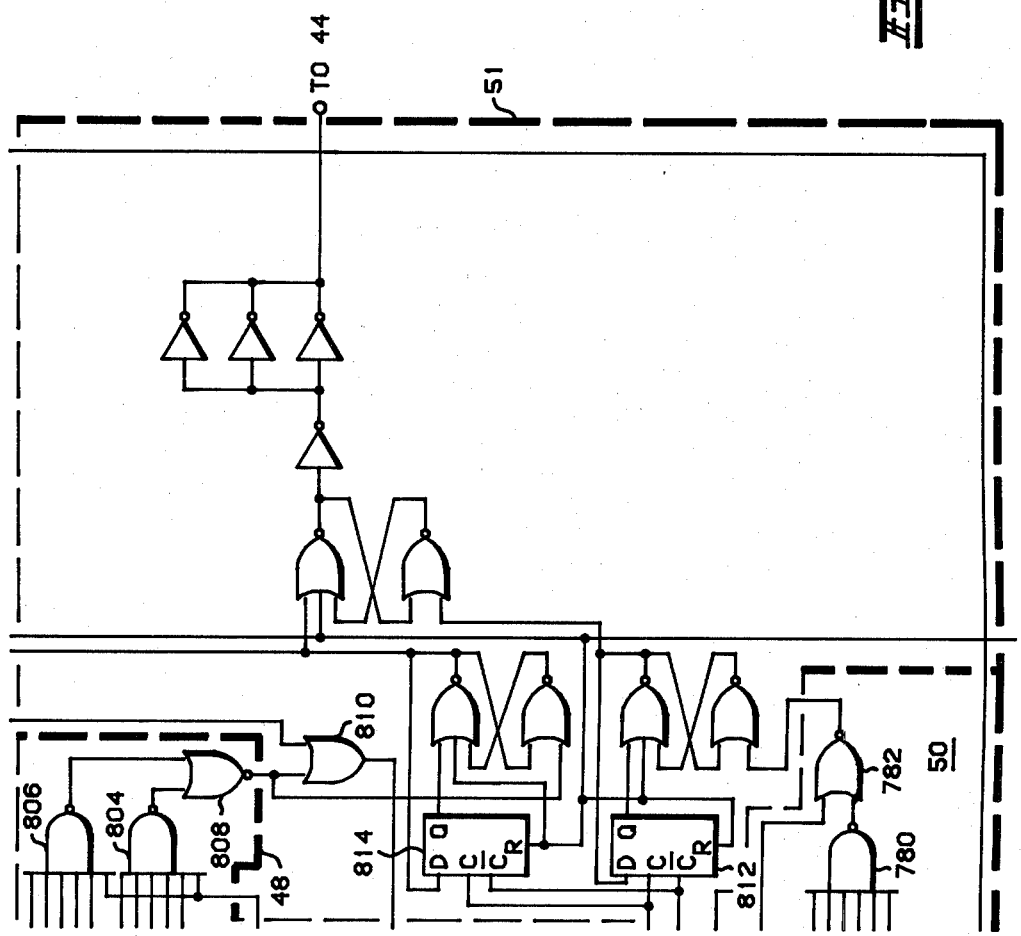
Figure 181:
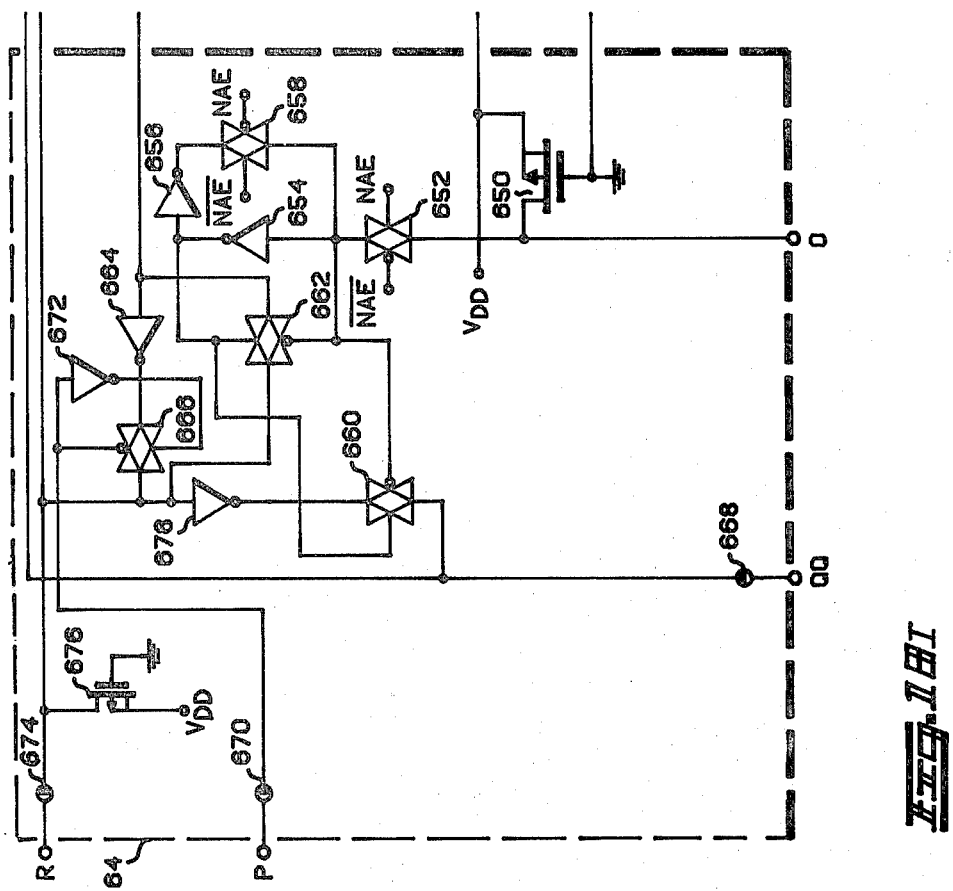
Figure 18K:
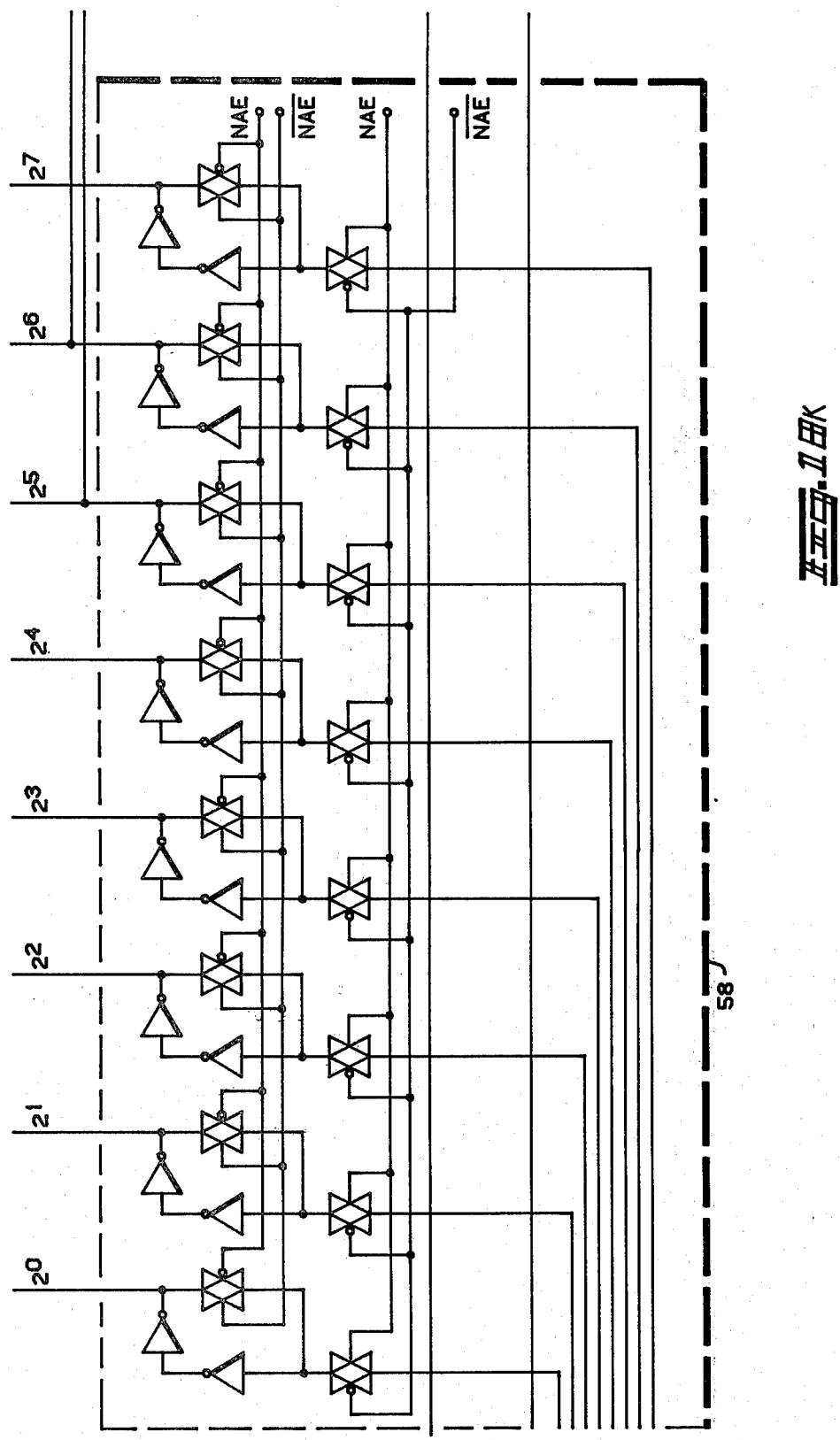

Referring now to FIG. 18E, delay circuit 164 is shown to comprise a series of logic signals which are suitably inverted and latched to provide a time delay for the operation of the digital portion of the frequency synthesizer. In particular, time delay 164 lengthens the initial pulse corresponding to the reset for the ten stages of counter 46 and enables an initialization in sample and hold phase detector 34 as will be more particularly described later.

Referring now to FIGS. 18A, B and D, divider 166 which is shown as divider $M_0$ in FIG. 17 consists of a series of data flip-flops suitably interconnected to provide binary division. In particular, the eight data flip-flops which comprise $M_0$ divider 166 are designated 820, 822, 824, 826, 828, 830, 832 and 834. An output from reference oscillator 30 is coupled through a protection circuit 836 to inverter 838. The output of inverter 838 is applied to the $\overline{\text{clock}}$ terminal of flip-flop 820. The output of inverter 838 is also connected through an inverter 840 to the clock terminal of flip-flop 820. Sufficient logic connections are shown in $M_0$ divider circuit 166 to provide variable division of the input reference frequency. In particular, the combinations of flip-flops 820 and 822 provide a divide by four operation. The combination of flip-flops 824, 826, 828 and 830 can provide a divide by nine or 16 operation depending upon the logic level at input terminal 842. Flip-flops 832 and 834 provide either a divide by two or divide by four operation depending upon the logic level of input terminal 844.

The output of $M_0$ divider 166 is suplied at output pad 845 as the 50 kHz time base signal shown as the input to automatic turn-off gates 204 in FIG. 5. It will be appreciated by those skilled in the art that the time base for the operation of the debounce circuit and automatic turn-off gates is dependent upon the selection of the choice of possible divider ratios in $M_0$ divider 166. However, the actual frequency of the time base may vary as long as the corresponding timing of the circuit is dependent upon a divided down frequency signal from the reference oscillator.

As shown in FIG. 18B, the output of $M_0$ divider 166 is supplied to $M_1$ divider 168. $M_1$ divider 168 comprises a series of four flip-flops designated 850, 852, 854 and 856. The function of $M_1$ divider 168 is to provide division ratios which are responsive to the $2^7$ position of $N_A$ in conjunction with the logic levels imposed on input terminal 842 of $M_0$ divider 166. The fundamental operation, however, is straight binary division of an input frequency while keeping the total output frequency in synchronization with the input signal. In addition, this divider is also responsive to one more input as shown in FIG. 18B to be part of $M_1$ divider 168.

Referring now to FIG. 18D, $M_2$ divider 170 comprises three stages of binary division which provides synchronous dividing. In particular, the dividing flip-flops are designated 860, 862 and 864. This provides a binary division of up to eight depending upon the $2^7$ position of the $N_A$ word and other programmable inputs which are shown to be part of the $M_2$ divider 170. The final output of all of the division operations is shown in FIG. 18D which is the output of AND gate 868. This output is supplied to digital detector 172 as shown in FIG. 17.

It should be noted that the programmable nature of the $M_1$ and $M_2$ dividers have been designed into the system to allow appropriate division to achieve the required channel spacing for various communication systems. The subsequent divided down reference frequency is then provided to the sample and hold circuit to provide the phase detector operation of the frequency synthesizer.

In FIG. 18C, digitial detector 172 includes edge triggered detector 602 shown enclosed by a broken line. An output from reference divider $M_2$ designated 170 is applied to the clock input terminal of flip-flops 870 and 872. This input is also coupled through inverter 874 to the $\overline{\text{clock}}$ input terminals of flip-flops 872 and 870. Voltage VDD is applied to the data input terminal of flip-flop's 870 and 875. An output from counter 46, operating through NOR 808 in cooperation with an RS flip-flop in delay circuit 51 to provide wave shaping, is applied to the input of a pair of series connected inverters 876 and 878 to the clock input of flip-flop 875 and through an inverter 880 to the $\overline{\text{clock}}$ input of flip-flop 875. An output from an RS latch in delay circuit 164 is coupled to the set terminal of flip-flop 875. The clock terminal of flip-flop 875 is coupled as the first input of a NOR 884. The $\overline{Q}$ output of flip-flop 875 is coupled through a buffer gate 886 as the first input of a NOR 888 and a NAND 890, the first input of a NAND 892 and the second input of NOR 884. The $\overline{Q}$ output of flip-flop 870 is coupled as the second input of NOR 888 whose output is coupled to the reset terminals of flip-flop 870 and 875. The Q output terminal of flip-flop 870 is coupled as the second input of NAND 890 and as the third input of NOR 884. The Q output of flip-flop 872 is connected as the second input of NAND 892.

Edge triggered detector 602 comprises three flip-flops 870, 872 and 875 which are interconnected such that two of the flip-flops 870 and 872 are responsive to the $M_2$ reference divider circuit 170. The third flip-flop 875 is interconnected to an output of the single synchronous binary counter 46.

Decoding logic 604 is shown enclosed by a broken line. The output of NOR 884 is connected as the first input of a NOR 894 which is interconnected with a NOR 896 to form an RS flip-flop. The output of NAND 892 is connected as the first input of a NAND 898 and the output of NAND 890 is connected as the second input of NAND 898. The output of NAND 898 is connected through a pair of series connected inverters 900 and 902 as the first input of an AND gate 904. The Q output terminal from flip-flop 875 is connected as the second input of AND 904. The output of NAND 898 is also connected as the first input of a NOR gate 906 which is connected with a NOR gate 908 in the form of an RS flip-flop. The output of NAND 898 is also connected as the first input of a NOR 910 and as the second input of NOR 896.

The output of NAND 898 is also connected through a pair of series connected inverters 912 and 914 to ramp generator 182. These inverters are shown enclosed by a broken line and designated as part of decode logic 604.

Decoding logic 604 may be seen to comprise a series of logic gates interconnected to an RS flip-flop. The decoding logic acts on the output of the positive edge triggered flip-flops contained in edge triggered detectors 602 to determine a phase or frequency mode of operation for the digital sample and hold phase detector.

The phase mode is a condition for the digital phase detector in which the output signal from the voltage control oscillator through counter 46 and the signal from the last of the reference dividers 170 are at the same frequency. As has been described earlier, considering the digital waveforms conceptually phase mode then constitutes a condition in which the variable pulse from counter 46 is always interleved in one period of the divided down reference frequency from $M_2$ divider 170.

During the phase mode of operation the phase difference between the output of counter 46 and the reference frequency are compared and a ramp signal is generated whose final voltage will be proportional to the phase difference. In the event that the signal from the voltage control oscillator as counted in counter 46 tends to decrease, a ramp enable pulse will remain on for a longer time to make the correction for the error introduced. Similarly, the ramp enable pulse will be shorter if the VCO frequency operating through counter 46 momentarily increases. This operation will be described in greater detail later.

For the frequency mode of operation, the two input signals from the last $M_2$ divider 170 and the signal from VCO 42 operating through counter 46 are at different frequencies. The operation of this circuit in the frequency mode determines whether the VCO is lower or higher in frequency compared to the reference signal and causes a control voltage to be applied to the VCO to steer it in the proper direction so that the correspondence between the frequencies may be achieved. In this operation, the circuit functions much as an ordinary frequency detector.

In FIG. 18C variable pulse width generator 606 is shown enclosed by a broken line. The output of NOR 896 is connected as the first input of a NOR 916 and as the first input to NOR 918 which together with NOR 920 are connected in the form of an RS flip-flop. The Q output terminal of flip-flop 872 in edge triggered detector 602 is connected as the second input of NOR 916 and as the second input of NOR 918. The output of NOR 910 is connected as the third input of NOR 916 and through a series combination of inverters 922 and 924 to resistor and capacitor coupled to ground to provide a delay in the signal. This generates the sample pulse width and the delayed signal is connected through a protection circuit 926 and a series combination of inverters 928 and 930 back to the second input of NOR 908 contained in variable pulse width generator 606.

Variable pulse width generator 606 contains two logic gates in addition to a pair of NOR's connected as an RS flip-flop. The circuit operates to generate a sample pulse whose duration is variable depending upon external resistance and capacitive components. This sample pulse is applied to the OTA 178 as shown in FIG. 4 to transfer the ramp voltage to the loop filter and then onto voltage control oscillator 42 so that tuning may be achieved.

The output from reference divider 170 which was applied to flip-flops 870 and 872 is also applied through a series combination of inverters 932 and 934 to provide a signal back to another portion of delay circuit 164.

Synthesizer lock detector 174 is shown enclosed by a broken line. The output of NOR 920 which is connected with NOR 918 in the form of an RS flip-flop is also connected to the inputs of a parallel combination of inverters 936 and 938 whose outputs are commonly connected to an interconnection pad for integrated circuit 160. An external circuit comprising a parallel arrangement of a resistor and diode is connected to a capacitor coupled to ground and through a protection circuit 940. The external connection of the resistor, diode and capacitor to ground provides a spike filter for the operation of the synthesizer lock detector 174. The output of protection circit 940 is connected to a series combination of inverters 942 and 944. The output of 944 is connected to the transmitter phase locked loop interface 110 (shown in FIG. 4). The output of inverter 944 is also connected to an inverter 946 whose output is connected to OTA 184 (shown in FIG. 4).

The RS flip-flop comprised of NOR's 918 and 920 with additional logic gates are shown in synthesizer lock detector 174. The function of the synthesizer lock detector 174 is to monitor the phase mode of the sample and hold detector and to indicate a locked condition during the phase mode. Thus, it gives an indication that proper tuning has been achieved by the digital frequency synthesizer. It may be observed that in the phase mode the synthesizer lock detector 174 will not produce an out of lock indication due to a minor slip in phase because the closed loop operation of the digital frequency synthesizer will compensate for the source of error. However, if the frequency mode is in operation the capacitor contained in the external spike filter will be discharged immediately thus indicating an out of lock condition for synthesizer lock detector 174.

Another portion of variable pulse width generator 606 is shown enclosed in the broken line. The output of NOR 916 is coupled through an inverter 950. The output of inverter 950 is supplied to OTA 178 as shown in FIG. 4.

Discharge pulse controller 69 is shown enclosed by a broken line in FIG. 18C. The Q output from flip-flop 826 in $M_O$ divider 166 is applied through an inverter 952 to the $\overline{clock}$ terminal of flip-flops 954 and 956 and through an inverter 958 to the clock input terminals of flip-flops 954 and 956. The output of NOR 906 in variable pulse width generator 606 is connected to the data terminal of flip-flop 954 and through an inverter 960 to the reset terminals of flip-flops 954 and 956. The Q output terminal of flip-flop 954 is coupled to the D input terminal of flip-flop 956. The Q output terminal of flip-flop 956 is coupled through an inverter 96 to an output terminal which is supplied to ramp generator 182 as shown in FIG. 4.

Discharge pulse controller 608 functions to provide the logic to discharge the ramp capacitor in ramp generator 182 as will be more particularly described later. Controller 608 provides a digital delay which is dependent upon the reference oscillator frequency. This may be seen by the interconnection to the Q output of flip-flop 826 which is contained in $M_0$ divider 166. The delay is actuated after the sample pulse has been completed in order to decrease the reference signal feed through on the system. These features will be described in greater detail later. At that time, the detailed operation of the sample and hold phase detector which includes both digital and analog sections will be described.

Referring now to FIG. 20, reference oscillator 30 is shown in detail. Reference oscillator 30 is shown to contain a tank oscillator circuit 970 which is preferably crystal controlled. Tank resonator circuit 970 includes a varactor diode 972 whose voltage is controlled by a temperature compensating circuit 974. Temperature compensating circuit 974 is fully disclosed in U.S. Pat. No. 4,254,382 entitled "Crystal Oscillator Temperature Compensation Circuit", assigned to the common assignee of the present invention, and is hereby incorporated by reference.

A modulation circuit 976 is shown coupled to tank resonator circuit 970 which allows for inclusion of a digital private line (DPL) or voice security option for the communication channels. This inclusion of a modulation input circuit to a reference oscillator is known in the art and has been accomplished in previous Motorola MX300 Series radios. The modulation input for the DPL and voice security systems are also applied through a compensation network 70 (shown in FIG. 3) to the voltage controlled oscillator 42. This compensation network comprises a variable resistive network to adjust the modulation input level so that it is appropriate for the voltage controlled oscillator as will be described in greater detail later. Tank resonator circuit 970 is also coupled to output stage 978 which operating from a 4.6 regulated voltage source provides an output signal to IC 160 through protection circuit 836.

In operation reference oscillator 30 is a standard crystal controlled oscillator which is capable of being modulated. It serves as the basic reference frequency for the operation of the digital frequency synthesizer system. Because a highly stable crystal oscillator is chosen for the reference oscillator many additional stable frequencies can be derived. In addition by operating through $M_0$ divider 166, reference oscillator 30 provides a very stable time base signal at terminal 845 as shown in FIG. 18A which is supplied to IC 130.

FIG. 21 shows a simplification of the several gates which constitute range divider control circuit 64. In particular, the $2^7$ binary position of the $N_P$ word is coupled through inverter 664 to the input terminal of a transmission gate 666. The P interconnection pad is coupled to the negative control input of transmission gate 666. The $2^7$ binary position of the $N_P$ word is coupled to the input terminal of a transmission gate 662 and to the eighth stage of $N_P$ comparator 48 corresponding to the $2^7$ binary position. The output of transmission gate 662 is connected through inverter 678 to an input terminal of transmission gate 660. The output of transmission gate 662 is also connected to the ninth stage of $N_P$ comparator 48 corresponding to the $2^8$ binary position. The R input is connected to the output of transmission gate 666 and to the $2^8$ binary position of $N_P$ comparator 48. The O' terminal, although not directly connected to the O terminal as represented in FIG. 17, is always maintained at the same logic level as that present on the O terminal. The signal at the O' terminal is supplied through inverter 654 to supply the positive control inputs of transmission gates 660 and 662. The QQ input terminal is connected to the output terminal of transmission gate 660 and directly to the tenth stage of $N_P$ comparator 48 which corresponds to the $2^9$ binary position.

FIG. 21 shows the principal connections for a portion of the circuit already shown in detail in FIG. 18I. However for the purpose of understanding the operation of the range divider control circuit, certain gates and MOS devices providing the pull up or pull down operation have been deleted so that its function may be more readily seen. For a full understanding of the operation of range divider control circuit 64 as shown in FIG. 21 reference should be made to FIG. 22 which is the truth table corresponding to the various input conditions for input terminals O', P, QQ and R. It should be noted at this point that the $2^7$ position of the $N_P$ word can cause an alteration in the selected range in that it can choose either a first portion or a second portion of an overall range. However, to keep the information in the table down to a reasonable magnitude the precise details are not deemed necessary since the circuits are shown in detail in FIG. 18I. Range divider control circuit 64 operates to control the range of the variable dividing operation corresponding to the counting of the $N_A$ and $N_P$ words in counter 46. The combination of the transmission gates interconnected with inverters shown in FIG. 21 provides a flexibility in programming for all of the required division ratios for frequencies from the VHF band, to the 800 MHz band. The inclusion of the range divider control circuit 64 allows division ratios which could not be accessed exclusively by eight programmable $N_P$ bits. Thus, with the inclusion of the range divider control circuit 64 a standard code plug memory 60 having an eight bit word position may be used for the frequency synthesizer system.

The frequency range control circuit acts on the two most significant bits of the $N_P$ word located in the ninth and tenth stages of $N_P$ comparator 48. The operation is achieved by programming two hard wired control bits which are designated interconnection pads P and O′ and by interrogating the logic level of the $2^7$ bit in the $N_P$ word. It will be recalled that this $2^7$ bit may be stored within the operational range of the eight bit code plug memory 60. The truth table for the combinations of the O′, P, QQ and R bits are shown in FIG. 22. It is most convenient not to include the 1 or 0 logic states for the $2^7$ bit of the $N_P$ word but rather to show the overall ranges which may be hard wired programmed for the operation of the digital frequency synthesizer for several communication frequency bands.

As may be seen by the table, the various combinations of 1 and 0 levels at interconnection pads R, QQ, P and O′ produce $N_P$ numerical divider ranges listed in the table. Several design features may be demonstrated by the use of this circuit, in particular if only the $2^8$ or $2^9$ bits were hard wired all of the frequencies in the required bands could not be synthesized. The arrangement of the various combination of bits in the truth tables as shown in FIG. 22 has also been optimized to allow the digital frequency synthesizer system to change the channel range limits within a selected frequency band with only varying one bit of information. This is the most significant bit of the $N_A$ word ($2^7$) as was described earlier for PROM 60.

In particular, the reader's attention is directed to the second and third row of the truth table in FIG. 22. The range of $N_P$ numerical divisors of 128–383 and from 256–511 allow for full tuning in the VHF band which is consistent with the example cited earlier. However, again, it should be realized that the digital frequency synthesizer and its range divider control operation are in no way restricted to the VHF band and thus the entire table shows tuning over a much wider range of communication frequencies.

The informaation on rows 2 and 3 shows that the P input terminal changes from a low logic level to a high logic level for the different ranges. It will be recalled in the description of the VHF band example described earlier, that the injection signal to the multiplier in the transmitter section of the preferred embodiment had a different ratio compared to the multiplier for the receiver section. The column for the P interconnection pad for rows 2 and 3 shows this difference in that the 0 logic level and the 128–383 numerical range for $N_P$ corresponds to receive channels while the 1 logic level and the 256 511 numerical range for $N_P$ corresponds to the transmit channels. While other bands will operate differently, the table shows the accessibility by the digital frequency synthesizer of a great variety ranges for communication frequencies and in addition allows different transmit and receive frequencies to be handled by the digital frequency synthesizer with ease.

FIG. 23 shows a functional block diagram of the analog portion of the frequency synthesizer system of the present invention. Voltage regulator 186 is shown by itself and it will be recalled that this voltage regulator supplies power to all of the various modules in the digital frequency synthesizer and, therefore, its detailed interconnections are not shown on this block diagram. Also shown in FIG. 23 is ramp generator 182 whose output is connected to an operational transconductance amplifier 178. OTA 178 receives a signal from digital detector 172 (FIGS. 4 and 17). OTA 178 is also connected to unity gain buffer 1000. The output of OTA 178 is connected to an acquisition OTA 184. An output from OTA 178 and acquisition OTA 184 are supplied to loop filter 40.

Transmitter PLL interface 110 is shown as receiving signal inputs from the transmitter lock detector 108 in FIG. 3 which is contained in transmitter section 74 of the transceiver and input from synthesizer lock detector 174 as shown in FIG. 4 and 17. The output of transmitter PLL interface 110 is supplied to transmitter gate circuit 118, as shown in FIG. 3. Pulse regulator for high current 188 is shown by itself and from FIG. 4 it may be seen that it receives an input from pulse control encoder 140 and supplies an output signal to code plug PROM 60.

Figure 24A:
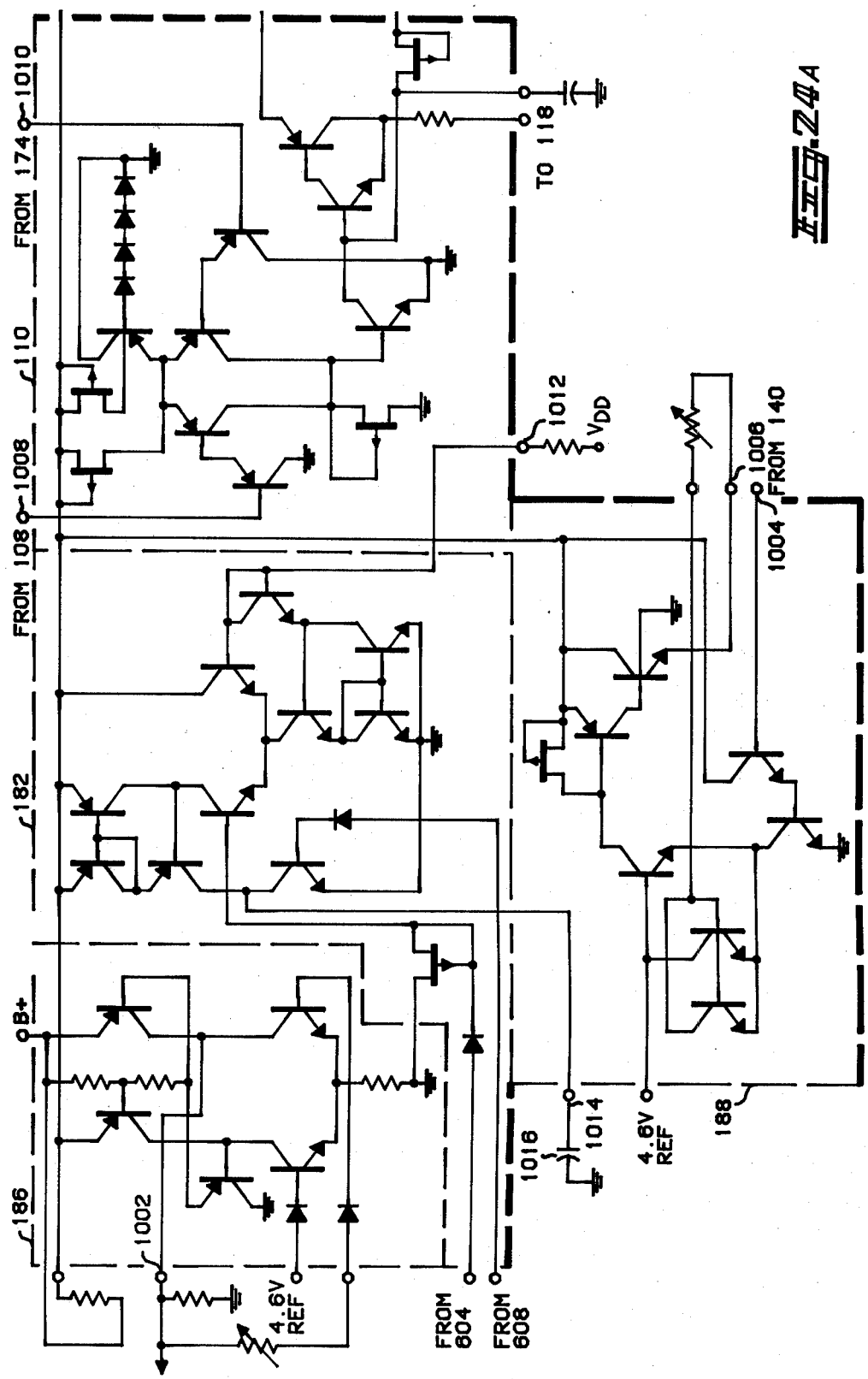
FIGS. 24A and B show an electrical schematic for the analog portion of the frequency synthesis system.

FIG. 24A and B are the detailed electrical schematics corresponding to FIG. 23. Voltage regulator 186 is shown enclosed in broken line and comprises a standard regulation circuit which includes a short circuit current protection to detect the presence of an external short to shut down its operation. It provides a 5.2 volt output based on a stable 4.6 volt input reference voltage which for the preferred embodiment is provided by the transceiver. In particular, for the preferred embodiment there is available a 4.6 stable reference voltage source. The output terminal of voltage regulator 186 is designated 1002 and is supplied to the various other modules in the digital frequency synthesizer including IC's 130, 160 and prescaler 44.

Pulse regulator high current circuit 188 shown enclosed by a broken line is a high current regulator which is capable of supplying sufficient regulated voltage and current to access the information in PROM 60. It is operated on a pulse basis to save energy in the entire system. This circuit functions to apply power to PROM 60 to access and transfer the $N_A$ and $N_P$ words into the digital frequency synthesizer to cause proper tuning. It operates with respect to the same stable reference 4.6 voltage source as does voltage regulator 186. Pulse control encoder circuit 140 as shown in FIG. 8 controls the operation of this circuit through input terminal 1004. The output to PROM 60 is supplied at output terminal 1006.

Transmitter PLL interface circuit 110 shown enclosed by a broken line accepts a signal from transmitter lock detector 108 at a terminal designated 1008 and a signal from synthesizer lock detector 174 at a terminal designated 1010 to perform the logic equivalent of an AND function while providing the proper interface output to transmitter gate 118 as shown in FIG. 3.

Ramp generator 182 shown enclosed by a broken line receives two signals, one from decode logic 604 contained within digital detector 172 as shown in FIG. 17 and the second from discharge pulse controller 608 also shown in FIG. 17. Voltage VDD is applied through terminal 1012 to set the output current of the ramp generator circuit. The output of ramp generator circuit 182 is connected through terminal 1014 to the external ramp capacitor 1016 which provides the ramp signal to OTA 178.

Referring now to FIG. 24B, operational transconductance amplifier 178 and acquisition OTA 184 are shown in detail along with unity gain buffer 1000 all are shown enclosed by broken lines. The functions of both operational transconductance amplifiers are similar in that this type of circuit monitors the input signal and depending upon the bias current at the gain control input it produces a voltage output signal having a current capability which is a multiple of the sampling current. An output of OTA 178 designated 1020 is coupled to a capacitor which in turn is connected to ground to provide the hold operation for maintaining voltage controlled oscillator 42 at a constant frequency during the sampling operation of the digital frequency synthesizer. Unity gain buffer 1000 provides a buffer function to prevent the external loading from the loop filter 40 to be coupled back to affect the voltage on hold capacitor 1022.

OTA 178 is a combination of bipolar and junction field effect transistors (JFET). This combination offers a very high input impedance at the inverting and non-inverting inputs of the amplifier to minimize the loading effects on the ramp and hold capacitor voltages, thus providing a high performance sample and hold phase detector. While preferred embodiment utilizes JFET'S on the input terminals of the OTA, the sample and hold phase detector could be implemented by using standard OTA's such as the 3080 series manufactured by RCA.

Acquisition OTA 184 functions in a manner that is very similar with OTA 178 except that it is utilized by the sample and hold circuit for a different operation. It has the capability of providing more current output than does OTA 178 so that it can quickly change the voltage applied to VCO. This is particularly important during the frequency mode of the digital and analog sample and hold phase detector as will be described in greater detail later.

FIG. 25 shows a combined block diagram and electrical schematic for the digital and analog sample and hold phase detector 34 for the frequency synthesizer. An input signal from the output of $M_2$ divider 170 is applied to the input of the digital section 36 of the sample and hold phase detector. The detailed circuit is shown in FIG. 18C. An input from single synchronous binary counter 46 is applied as a second input to the digital section 36 of the sample and hold phase detector. An output from the decode logic circuit 604 is applied through a resistor 1030 to one input of ramp generator 182. An output from discharge pulse controller 608 is coupled through a resistor 1032 to a second input of ramp generator 182 which is coupled through a resistor 1034 to ground. $V_{DD}$ is supplied through a resistor 1036 to a third input of ramp generator 182.

The output of ramp generator 182 is coupled through a capacitor 1016 to ground and through a resistor 1038 to the noninverting input of OTA 178. An output from variable pulse width generator 606 is coupled through a resistor 1040 to a control input of OTA 178 which is coupled through a resistor 1042 to ground. The output of OTA 178 is coupled through a capacitor 1022 to ground. Capacitor 1016 is the ramp capacitor for ramp generator 182 while capacitor 1022 is a hold capacitor which holds the VCO on frequency. The output of OTA 178 is coupled through unity gain buffer 1000 to provide an output to loop filter 40. The output of unity gain buffer 1000 is also coupled through resistor 1044 to the non-inverting input of acquisition OTA 184. The output of acquisition OTA 184 is supplied to loop filter 40 and is also interconnected to its inverting input terminal. An output from the synthesizer lock detector 174 is coupled through a resistor 1046 to a control input of acquisition OTA 184 and through a resistor 1048 to ground. The output of unity gain buffer 1000 is also connected through a resistor 1045 to the inverting input of OTA 178.

It will be recalled that the digital section 36 of the sample and hold phase detector 34 compares the digital pulses from the divided down reference frequency. This results in dividing the reference oscillator by $M_0$, $M_1$ and $M_2$ with the appropriate signal from single synchronous binary counter 46 which monitors the output of voltage control oscillator 42. The digital section of the phase detector as described earlier has two modes of operation. In the first mode it seeks to correct a frequency difference between the reference frequency and the counted VCO frequency. When these frequencies are equivalent, the digital section operates in a phase mode for its secondary mode of operation. The choice of this type of digital and analog phase detector was based on its ability to offer maximum reference signal attenuation along with precise tuning for the digital frequency synthesis system.

The operation of the digital and analog sections of sample and hold phase detector 34 may best be understood by referring to FIG. 26 which shows the waveforms for the digital and analog sections of the detector. In particular, the first waveform in FIG. 26, shows the output from the $M_2$ divider 170 which is supplied to sample and hold phase detector 34. The second waveform shows the output of single synchronous binary counter 46 operating through NOR 808. The third waveform shows the output of decode logic 604 and the fourth waveform shows the output of the variable pulse generator 606. The fifth waveform shows the output of discharge pulse controller 608, and the sixth waveform shows the output from the synthesizer lock detector which is applied to transmitter PLL interface 110. The seventh waveform shows the voltage as a function of time at junction 1020 which is at the output terminal of ramp generator 182 coupling to ramp capacitor 1016.

FIG. 26 shows the different modes of operation of the sample and hold phase detector. Time $t_0'$ is an arbitrary time where the VCO frequency momentarily increased after a normal phase mode period. This condition is chosen to demonstrate the full capability of the sample and hold phase detector. It may be observed that the waveform for $M_2$ divider 170 shows a repetitive pulse pattern through out FIG. 26. In addition, between time $t_0'$ and time $t_4$ the output from single synchronous binary counter 46 operating through NOR 808 shows two pulses interleaved in a reference period defined by the waveform for $M_0$ divider 170. These pulse train configurations are indicative of the fact that the VCO frequency as determined through counter 46 is much higher than the reference frequency from divider 170. It may also be observed at a time somewhat after $t_0'$ that the leading edge of the output from variable pulse width generator 606 is shown to occur at the same time as the leading edge of the pulse from counter 46. The pulse output from variable pulse width generator 606 is now supplied to OTA 178 through resistor 1040 to transfer the ramp voltage to the loop filter and thus to steer the VCO to reduce the frequency.

It should be observed that during the time interval $t_0'-t_4$ junction 1020 has a low logic level signal which functions to reduce the control voltage supplied to the VCO and hence its frequency. The effect of this low logic level at junction 1020 may be observed in the waveform for the pulses from counter 46. It will be observed that the distance between the first five pulses for counter 46 as shown in FIG. 26 are decreasing in time which is indicative of the fact that the frequency of the VCO is being raised.

It may also be observed that during the time period immediately prior and including $t_4$ two reference pulses from $M_2$ divider 170 were received by the phase detector without a corresponding pulse being detected from counter 46. Therefore, at time $t_4$, at the leading edge of the second reference pulse from 170 without a corresponding pulse from counter 46, decode logic 604 generates a high logic level pulse which begins charging the ramp capacitor 1016. The effect may be observed as a ramp increase in voltage at junction 1020 as shown in the seventh waveform in FIG. 26. At time $t_5$ the first pulse from the VCO through counter 46 is detected thus terminating the signal from decode logic 604 and establishing the first sample pulse from variable width pulse generator 606. Also, at time $t_5$, the voltage at junction 1020 may be observed to begin a constant voltage level which is indicative of maintaining capacitor 1016 without additional charge.

At time $t_6$, the sample pulse from variable pulse width generator 606 terminates and this is shown to correspond to an intermediate level of the constant voltage on the ramp capacitor as shown for the waveform for junction 1020. At time $t_7$, the discharge pulse controller 608 produces a high logic level signal which corresponds to discharge of ramp capacitor 1016. This is observed as a pulse termination of the voltage at junction 1020 on its corresponding waveform. The time interval between $t_6$ and $t_7$ is a digital delay built into the digital phase detector by discharge pulse controller 608 which is dependent ultimately upon the reference frequency as indicated by $M_0$ divider 166. The purpose of this delay is to minimize the amount of reference frequency feedthrough which can reach the loop filter.

At time $t_8$, which is determined by the leading edge of the reference frequency pulse received from $M_2$ divider 170, we begin looking for the corresponding pulse from the VCO operating through single synchronous binary counter 46. The arrival of the leading edge of the reference pulse from $M_2$ divider 170 coincides with the production of the ramp enable signal from decode logic 604 and the termination of the output of discharge pulse controller 608. At this time, due to the ramp enable signal, as may be seen from the voltage waveform for junction 1020, the voltage is increased until it encounters a divided VCO frequency pulse. If no VCO frequency pulse from counter 46 is detected during this time interval, the ramp is increased to a maximum level and remains on until the next timing event. At time $t_9$, the leading edge of the next reference frequency pulse of divider 170 establishes the leading edge of a sample pulse from variable pulse width generator 606 which transfers to the VCO the voltage waveform for junction 1020 at its maximum level.

It should be observed that during the time interval $t_0'-t_8$, the VCO frequency was greatly reduced so that it could more properly correspond to the reference frequency from $M_2$ divider 170. Between timing intervals $t_9$ and $t_{10}$ the first pulse from counter 46, which is indicative of the VCO frequency, is detected between occurrences of a reference frequency pulse. It is during this period that the ramp generator will apply a suitable correcting voltage to the VCO through the OTAs which operates through the loop filter 40 to bring the frequency of the voltage control oscillator into correspondence with that of the reference frequency signal from $M_2$ divider 170. The interval $t_0-t_{10}$ corresponds to the frequency mode.

At time $t_{10}$, which is determined by the leading edge of pulse from reference divider 170, the sample pulse from variable pulse width generator 606 is terminated, and it may be seen from the voltage waveform for junction 1020 that this corresponds to a continuance of the signal applied to ramp capacitor 1016.

During the interval time $t_{10}-t_{11}$, the detection of the pulse from the voltage control oscillator operating through counter 46 triggers the termination of the pulse from decode logic 604 and the initiation of a sample pulse from variable pulse width generator 606. The purpose of this is to sample the voltage as shown by the waveform for junction 1020 to begin the process of bringing the VCO frequency into phase with the reference frequency from $M_2$ divider 170. It may also be observed that the waveform from discharge pulse controller 608 shows a relatively short period pulse to cause discharging of the ramp capacitor 1016.

After time $t_{11}$ since the VCO pulse as detected through counter 46 is now interleved between two reference pulses from $M_2$ divider 170 the sample and hold phase detector now enters its phase mode of operation. The waveforms during the interval just previous to $t_{10}$ and after $t_{11}$ are indicative of the fact that the frequency of the VCO starts approaching the frequency of the reference frequency from $M_2$ divider 170.

During time interval $t_{11}-t_{12}$, observing the waveform from decode logic 604, the pulse shown is proportional to the phase difference between the reference signal from $M_2$ divider 170 and the detected VCO pulse from counter 46. This may be seen in the waveform for junction 1020 as the period during which a ramp up signal is applied to ramp capacitor 1016. The DC level on the signal for junction 1020 at time $t_{12}$ will be proportional to the phase difference between the two input signals.

During the time interval $t_{12}-t_{12}$, the DC level which exists at junction 1020 is sampled by means of the pulse produced by variable pulse width generator 606. The DC level is transferred to the operational transconductance amplifier and supplied to loop filter 40 for application to the voltage control oscillator. During the time period between $t_{13}$ and $t_{14}$ is, again, a repeat of the time delay to minimize the feed through of the reference frequency into the loop filter 40. This time delay is similar to the time delay which is built into the system and as shown earlier between $t_6$ and $t_7$.

At $t_{14}$, the discharge pulse controller 608 waveform leading edge corresponds to the discharge of the voltage at junction 1020 which is indicative of discharging the ramp capacitor 1016. During this time and to the end of the diagram the sample and hold phase detector is in regular phase mode operation.

The phase detector continues to monitor in a phase mode any phase difference between the reference signal and the VCO signal. During this interval, the ramp is applied up to a voltage level which corresponds to the detected phase difference. By this means, the sample and hold phase detector can steer the VCO to maintain the correct phase relationship between the input signals. Thus, the phase detector is operating in a manner that is similar to prior art phase detectors in that the phase between two signals is detected and the voltage control oscillator is adjusted so as to maintain the relaionship in phase.

At time $t_{15}$, it should be observed that the waveform for the synthesizer lock detector 174 goes to a high level indicating that both the frequency and phase have been detected and locked. This takes more than one sample of detection of the phase mode due to the time delay built into the operation of the spike filter circuit connected to synthesizer lock detector 174 as described in FIG. 18C.

Considering now the overall operation of the digital and analog portions of phase detector 34 it will be seen that the digital portion operates in one of two possible modes to first determine the difference in frequency between the reference signal and the VCO signal and when the frequencies are brought into equality to switch to a phase operation so that the VCO may be controlled to any detected phase difference.

One feature of the digital and analog sample and hold phase detector is that it operates to minimize the noise utput if any random microphonic signals are encountered. Because the peferred embodiment is a portable unit it is subject to rapid motion and shock and vibration and it is imperative that the digital frequency synthesizer be insensitive to such conditions. Moreover, the voltage change or slew rate of the ramp capacitor for the digital phase detector is adjusted to obtain an optimum gain in order to reach the desired frequency in optimum time. This is designed so that the sample and hold digital and analog phase detector will lock to a frequency in a very fast or minimum time. This feature cooperates with the operation of the loop filter as will be described in greater detail later to allow fast lock.

In addition, the operation of the analog section of the sample and hold phase detector is such that the operational transconductance amplifier provides one current output which corresponds to the normal phase operation while the acquisition operational transconductance amplifier provides a much greater current output to provide minimum acquisition time during a frequency change. At the time that both the frequency and phase have been detected and locked, the operation of the acquisition OTA is terminated while the OTA 178 continues to update the VCO frequency while in the phase mode. Thus the digital sample and hold phase detector provides digital sampling in both a frequency and phase modes and provides appropriate analog signal to drive the voltage control oscillator through the loop filter to the correct frequency in a minimum time. In addition, the operating characteristics of both the OTA and the acquisition OTA change the loop filter configuration so that the amount of filtering encountered during the acquisition mode of the loop is minimized. Thus, not only is the acquisition OTA capable of producing a much greater current but the path through which is operates namely the loop filter in contact with the VCO is reconfigured so that the greater current capability of the acquisition OTA may cause tuning at a faster rate. Subsequently, when operational transconductance amplifier 178 becomes dominant during the phase mode the loop filter as will be described in greater detail provides the appropriate filtering to prevent the passage of spurious and other signals into the voltage control oscillator.

When a frequency change condition occurs delay circuit 164 in IC 160 is triggered via the timing pulse from pulse encoder 140 in IC 130. Delay circuit 164 resets the single synchronous binary counter 46; the reference dividers 168, 170; and sets flip-flop 875 in digital phase detector 172. The length of the delay is determined by the external resistive and capacitive components shown in FIG. 18E as part of delay 164.

The output of RS flip-flop at mode 816 in delay circuit 164 goes to a high logic level, it establishes the frequency mode with the simulated condition for which the VCO frequency is higher than the reference signal. Thus, the output of variable pulse width generator 606 and the discharge pulse controller 608 produced a high logic level signal. This sequence corresponds to the complete discharge of the hold capacitor voltage by sampling continuously the zero potential at junction 1020.

At the termination of the timing delay of delay circuit 164, both the reference dividers 168 and 170, and the single synchronous binary counter 46 begin their dividing operations. The Q output of the data flip-flop in delay circuit 164 goes to a high logic level to clock data flip-flops 870 and 872 of edge trigger detector 602. The Q output of the data flip-flop in delay circuit 164 also propagates through inverters 932 and 934, and two additional inverters to reset itself. This sequence resets the digital section of the phase detector to begin searching for the phase mode.

Since the VCO frequency will be lower than the reference signal, the first pulse that the phase detector can detect is one from $M_0$ divider 170 which sets up a condition similar to that shown for time $t_4$ in FIG. 26. In operation, this means that the phase detector has been forced to start in the phase mode so that if the phase detector has optimum gain, a lock condition could be achieved during the first few samples. This is achieved by always driving the VCO to its lowest frequency upon a frequency change and thus tuning is always from the same initial frequency and thus improve acquisition time.

Figure 27:
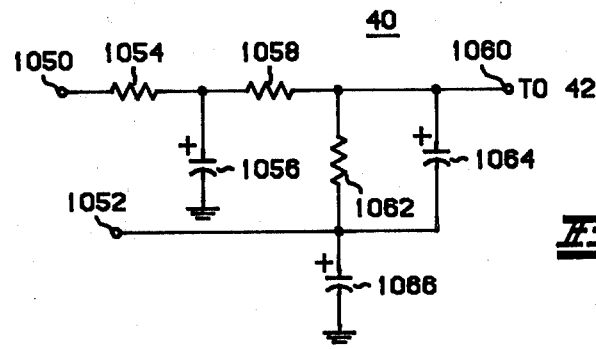
FIG. 27 is an electrical schematic of the loop filter circuit for the frequency synthesizer invention.

FIG. 27 shows the detailed electrical schematic for loop filter 40 as shown in FIGS. 2 and 4. The output terminal carrying the signal from OTA 178 and designated 1050 is coupled through a resistor 1054 in series with a capacitor 1056 to ground. Resistor 1054 is also connected through a resistor 1058 to the output terminal 1060 of loop filter 40. Resistor 1058 is also connected through a resistor 1062 to input terminal 1052 which corresponds to the output terminal of acquisition OTA 184. Output terminal 1060 is also connected through a capacitor 1064 in parallel to resistor 1062 to input terminal 1052. Terminal 1052 is also connected through a capacitor 1066 to ground.

Loop filter 40 is a low pass filter whose function is to provide relative stability for the loop and filtering between the output of the sample and hold digital and analog phase detector and voltage controlled oscillator 42. A principle function is to prevent reference frequency signals and harmonics coming from any of the variable frequency dividers 166, 168 or 170 from passing through and adversely effecting the control of voltage control oscillator 42. A secondary feature of loop filter 40 is to provide a filtering operation to prevent the passage of spurious and low frequency signals from reaching the voltage control oscillator to achieve goom FM hum and noise performance.

Because of the presence in the preferred embodiment of different multipliers for the injection frequency in both the receive and transmit sections of the transceiver, it is necessary that we use a low reference frequency for comparison. Because of the presence of possible spurious signals related to the reference signal frequency and the fact that there would ordinarily be no protection in the audio circuits against them, the loop filter of necessity requires a very narrow bandwidth to insure that these frequencies will not pass to either disrupt the operation of the VCO or other parameters of the system. The combination of resistor 1054 and capacitor 1056 provides the additional attenuation required to prevent the passage of spurious frequencies derived from the reference frequency into the voltage control oscillator. The remaining four components, resistors 1058, 1062 and capacitors 1064 and 1066 constitute a low-pass filter which provide the proper stability for the operation of the phase locked loop.

It should be observed that input/output terminal 1050 which predominantly carries the output signal from OTA 178 is applied through both filter sections while the output of acquisition OTA 184 is applied at terminal 1052 which bypasses most of the resistive elements and operates through resistor 1062 which connects with output terminal 1060 to provide the unattenuated signal to VCO 42. This means that the output of acquisition OTA 184 can be supplied to the voltage control oscillator 42 to cause rapid advancement to have the frequency of the voltage control oscillator correspond to that of the reference frequency.

FIG. 28 shows the detailed electrical schematic for a VHF voltage control oscillator for the frequency synthesizer system. While voltage controlled oscillators are known and used in the prior art, this design includes certain features which will be described in detail. Voltage control oscillator 42 has been designed for low sideband noise to provide high spectral purity for the digital frequency synthesizer. The various segments of the circuit are enclosed by broken lines.

Loop filter 40 is shown having output terminal 1060 coupled to a resonating tank circuit which is labelled 1070. Tank circuit 1070 oscillates at a frequency determined by the DC level at the output of loop filter 40 in conjunction with the voltage supplied through terminal 1072 which is derived from voltage generator 171. The tank circuit includes varactor diodes coupled with suitable circuitry to provide the appropriate resonance to achieve tuning. As is shown, a 7.5 volt source which is actuated during the transmit mode is applied along with the B+ battery voltage which is typically 7.5 v. Also shown coupled to tank circuit 1070 is an input from the PL and DPL input and an audio input. The audio input and PL and DPL inputs were discussed earlier in the description of the modulation input for FIG. 4. Such private line and digital private line along with voice security or audio function are well known in the art and exist on the present Motorola MX 300 series radios.

The preferred embodiment uses a two port modulation technique in which the first port is at the reference oscillator 30 and the second is at VCO 42. The modulation compensation network 70 compensates for the different gains at reference oscillator 30 and VCO 42. The two port modulation technique provides a flat modulation response. The compensation network has been found to be advantageous for the modulation of digital signals since the phase locked loop acts as a high pass filter when voltage control oscillator 42 is modulated and it acts as a low pass filter when modulating the loop at the reference oscillator port. This modulation scheme provides a flat frequency response avoiding distortion of the low frequency signals. It should be observed that for receive the transmit 7.5 volt lines is inactive and that the tank circuit 1070 is determined to be appropriate for the receive operation. However, when the transmitter is actuated, the 7.5 volt source applies a signal through the TX 7.5 volt input terminal to alter the resonant frequency of the tank circuit.

The output of the tank circuit is supplied to switched tank circuit 1074. For the transmit mode switch tank circuit 1074 operates in conjunction with the activation of the transmit 7.5 voltage source to cause the signal output from tank circuit 1070 to be applied to the transmitter output terminal designated 1076. Similarly, during receive mode, switch tank circuit 1074 operates to supply the output to receiver output terminal 1078. Both switched output terminals 1076 and 1078 are shown enclosed in a block designated 1080 and labelled output and power matching circuit.

Switched tank circuit 1074 is a cascode arrangement which allows direction of the injection signal along either separate path depending on either the receiver or the transmit mode of operation. Both the transmitter and receiver outputs are variable through a variable resistor to match desired output signal levels. In the Motorola MX300 series transceivers for the UHF and 800 MHz bands do not have the different multiplication stages in the transmitter and receiver sections. Therefore, switched tank circuit 1074 would not be necessary.

Linearizing network 1082 is shown enclosed by a broken line. For audio transmissions, it is necessary to keep a constant modulation deviation for the audio signal over the entire tuning band. The function of linearizing network 1082 is to provide a linear correction so that regardless of the frequency at which the transmitter section is operated, as controlled by the main varactor diode, the modulation deviation remains constant. This linearizing network in combination with the modulation varactor diode and the main varactor diode adds a feature to the voltage control oscillator that is unique.

B+ is applied through a resistor 1084 to the emitter of a PNP transistor 1086. B+ is also applied through a resistor 1088 to the emitter of a PNP transistor 1090. The collector of transistor 1090 is coupled to its base and to the base of transistor 1086. The collector of transistor 1090 is also connected to the collector of a transistor 1092. The base of transistor 1092 is connected into loop filter 40 at junction 1060 to monitor the control voltage. The collector of transistor 1086 is connected through resistor 1094 to a regulated source of 4.6 volts. The collector of transistor 1086 is also connected through an inductor 1096 to a capacitor 1098 connected to ground. The interconnection of capacitor 1098 and inductor 1096 are connected to the cathode of the modulation varactor diode 1099. Varactor diode 1099 has a tuning sensitivity on the order of 1/1000th the sensitivity of the main varactor diode.

Also shown connected to tank circuit 1070 is prescaler buffer 1100. This prevents any spurious signals from prescaler 44 from entering tank circuit 1070 and disrupting the information contained therein. The output terminal is designated 1102.

Concentrating on tank circuit 1070, many of the tuning circuits for voltage control oscillators are known in the prior art. However, the interconnections for tank circuit 1070 are designed to cooperate with the various features in a frequency synthesized radio of the preferred embodiment. The transmitter 7.5 voltage source is applied through a resistor 1104 to the base of an NPN transistor 1106. The base of transistor 1106 is connected through a parallel combination of a resistor and capacitor to ground. The emitter of transistor 1106 is also connected to ground. B+ voltage, (battery voltage), is applied through a resistor 1108 to the collector of transistor 1106 which is also connected through a capacitor 1110 to ground and to the cathode of a pin diode 1112. The transmitter 7.5 voltage source is also applied through a resistor 1114 and an inductor 1116 to the anode of pin diode 1112. Also coupled to the anode of pin diode 1112, are a parallel combination of a variable capacitor 1118 and a fixed capacitor 1120 whose second common point is a junction 1122. Junction 1122 is coupled through a capacitive network to prescaler buffer 1100.

Junction 1122 is also connected through a capacitor 1124 to the cathode of a main varactor diode 1126. The anode of diode 1126 is coupled through a capacitor 1128 to ground and through a resistor 1130 in series with a resistor 1132 to terminal 1072 at which is applied the voltage from voltage generator 171. The junction between resistors 1130 and 1132 is also coupled through a bypass capacitor to ground. The cathode of varactor diode 1126 is coupled through an inductor 1134 to junction 1060 in loop filter 40. Junction 1060 is also coupled through a bypass capacitor to ground.

Junction 1122 is also coupled through a capacitor 1136 to the cathode of modulation varactor diode 1099. The anode of diode 1099 is also coupled through a capacitor 1138 to ground. The collector of transistor 1106 is coupled through a resistor 1140 to the base of NPN transistor 1142. The emitter of transistor 1142 is coupled to ground and the collector is coupled to the anode of varactor diode 1099 and through a resistor to the PL and DPL modulation input circuit. The audio modulation input terminal is also coupled through a voltage dividing network to the anode of varactor diode 1099. The cathode of varactor diode 1099 is coupled to inductor 1096 in linearizing network 1082.

The junction 1122 is also coupled to a variable inductor 1144 shown in two portions. The variable wiper portion of inductor 1144 is coupled through a variable resistor 1146 to the source electrode of an N channel JFET 1148. Capacitor 1150 is in parallel with variable resistor 1146. Junction 1122 is also connected to the gate electrode of JFET 1148. The drain electrode o JFET 1148 is coupled through a bypass capacitor to ground and is coupled to switch tank circuit 1074 to provide the path for the output signals from tank circuit 1070 so that they may be then directed towards either the receiver section or the transmitter section of the transceiver.

In the receive mode, the parallel arrangement of capacitors 1118 and 1120 are effectively out of the circuit and tuning is achieved through the main varactor diode 1126. The control voltage from loop filter 40 operating through junction 1060 drives the cathode of main varactor diode 1126 while the voltage from voltage generator 171 operates through series resistors 1130 and 1132 to establish the voltage at the anode of varactor diode 1126. Thus, the reverse bias voltage between the signal from loop filter 40 on the cathode and the voltage applied through the series resistor combinations to the anode allows the varactor to operate in its linear region. The capacitance change as a function of the control voltage from loop filter 40 causes tank circuit 1070 to resonate at a different frequency so that proper tuning may be achieved for the receiver mode. It should also be observed that during the receiver mode the anode of modulating diode 1099 is grounded through transistor 1142.

When, however, the transmitter is actuated through the push-to-talk switch, the transmitter 7.5 voltage source line goes high thus turning on transistor 1106. This establishes conduction through pin diode 1112 thereby coupling the parallel arrangement of capacitors 1118 and 1120 to the main varactor diode 1126 by means of junction 1122. In the transmit mode, the capacitance produced by varactor diode 1126, under the conditions of the control signal from loop filter 40, applied through junction 1060 is combined with voltage on the anode of varactor diode 1126 from voltage generator 171. To this is added the capacitive effect of the parallel combination of capacitors 1118 and 1120. This establishes the tuning frequency for the VCO which may then be suitably combined with the multiplier in the transmit section 74 of the transceiver and thus produce correct tuning of the transmitter portion of the transceiver.

It should be observed that in either receive or transmit modes, it is the voltage applied at junction 1060 to main varactor diode 1126 in combination with the voltage at its anode operating through the series resistor circuit to terminal 1072 which determine the overall linear operating range for main varactor diode 1126. It may be seen that by altering the DC level of the voltage at junction 1072 the varactor diode range, as determined by the reverse bias voltage imposed across it, may be altered.

It may also be seen that modulation varactor diode 1099 is connected to a common junction with main tuning diode 1126 and operates in a similar manner. The audio and PL and DPL inputs are applied to the anode of this modulating varactor diode 1099. Preferably, varactor diode 1099 is considerably less sensitive than is the main tuning diode. In either transmit or receive modes, the capacitance of main varactor diode 1126 in combination with the additional capacitive parallel arrangement and without it respectively, are coupled to the tank circuit. The combined circuit elements resonate in a known fashion and provide the output to switch tank circuit 1074. JFET 1148 supplies the amplification and phase inversion which enables the oscillatory state to provide resonance in the tank circuit.

During the receive mode, to ensure that there is no modulation from either the audio input or the PL and DPL inputs, the anode of modulation varactor diode 1099 is effectively grounded through the collector to the emitter of transistor 1142. In the transmit mode, however, the operation of transistor 1106 is such that it disables transistor 1142 to allow modulation through modulation varactor diode 1099.

Figure 29:
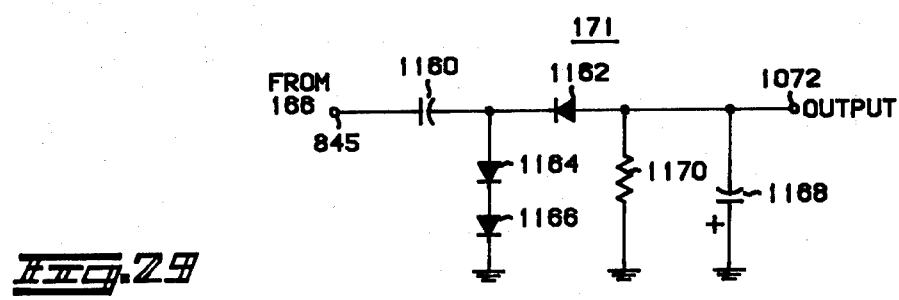
FIG. 29 is an electrical schematic of a dc voltage conversion circuit for the voltage controlled oscillator.

FIG. 29 shows the detailed electrical schematic for voltage generator 171. The divided reference signal from terminal 845 in $M_0$ divider 166 is applied through a capacitor 1160 to the cathode of a diode 1162 to output terminal 1072. The cathode of diode 1162 is coupled to the anode of a series combination of diodes 1164 and 1166. The cathode of 1166 is coupled to ground. The anode of diode 1162 is also coupled through a capacitor 1168 and a resistor 1170 in parallel to ground. Voltage generator 171 receives the 50 KHz signal from M₀ divider 166 at terminal 845 which is capacitively coupled to the anode of 1164 in series with diode 1166. These diodes clip the signal at approximately two diode voltage drops above ground. Diode 1162 rectifies the negative component of the clipped signal whose voltage is stored in capacitor 1168. Capacitor 1168 filters out any remaining ripple and produces a negative voltage at output terminal 1072.

Figure 30:
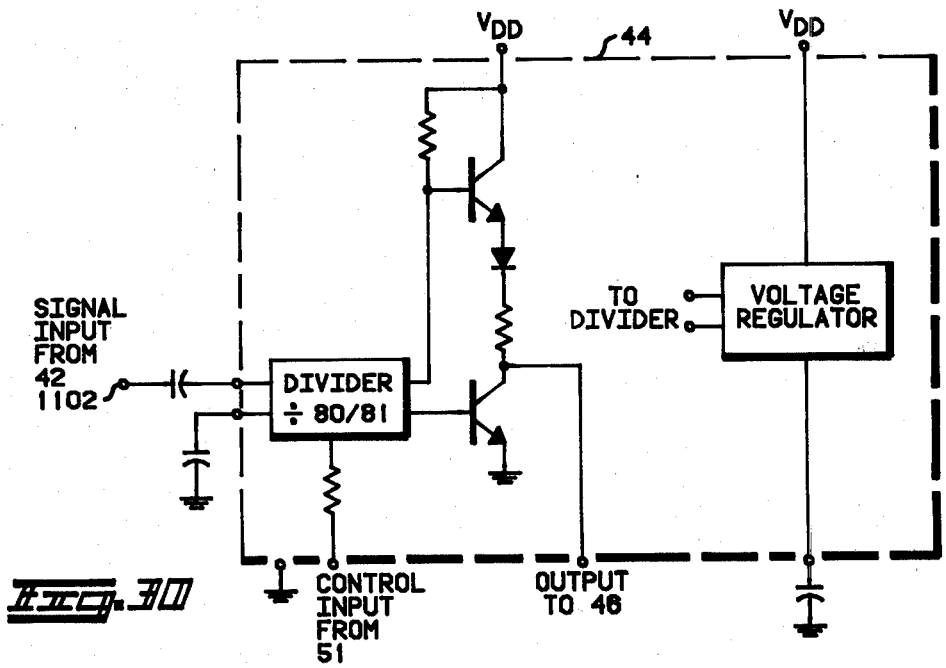
FIG. 30 is an electrical schematic for a frequency prescaler circuit employed in the frequency synthesizer invention.

FIG. 30 shows a combination block and electrical schematic for prescaler 44. The combination diagram is that shown for an SP8792 programmable divider as manufactured by Plessey Semiconductor. The signal input from voltage control oscillator 42 is applied at input terminal 1102 which is coupled through a capacitor to the divider portion of prescaler 44. $V_{DD}$ is variously applied at input terminals as shown in the diagram. The control input signal from modulus control circuit 51 is applied to the divider portion of prescaler 44. The output from prescaler 44 is applied to single synchronous binary counter 46. Various other connections for the integrated circuit are shown tied to various points as is suggested in the data sheet for this IC.

When prescaler 44 is coupled back to counter 46, the phase locked loop for the digital frequency synthesizer is completed. Thus, the digital frequency synthesizer may operate to cause tuning to any of the selected frequencies whose numerical divisors are stored in PROM 60.

While a specific embodiment of this invention has been shown and described, further modifications and improvements will occur to those skilled in the art. All modifications which retain the basic underlying principles and claimed herein are within the scope of this invention.

What is claimed is:

1. In a radio transceiver including a digital frequency synthesizer and a multiposition switch, addressing frequency channel information stored at a plurality of locations in a memory, for causing the frequency synthesizer to tune to various communication channels, a zone selecting apparatus comprising:

zone selecting means coupled to said memory and establishing at least two distinct and contiguous zones of addressable locations in said memory, all of the locations in a selected zone being addressable by a corresponding number of positions on said multiposition switch, said zone selecting means operating to alter the correspondence for each successive zone between the positions on said multiposition switch and the corresponding addresses of the memory locations, whereby predetermined channel frequency information may be arbitrarily grouped and stored in any zone of said memory.

2. The zone selecting apparatus of claim 1 wherein said transceiver further includes means to binary encode the selection of the position of said multiposition switch.

3. The zone selecting apparatus of claim 2 wherein said memory is a programmable read-only memory containing information for the tuning of the plurality of communication channels and said transceiver further includes means converting the binary coded selected position of the multiposition switch to correspond to an address in said programmable read-only memory.

4. The zone selecting apparatus of claim 3 wherein said zone selecting means comprises a zone selecting switch and wherein said transceiver further includes means for identifying the selected position of said zone selecting switch with a binary encoded signal and means responsive to the binary encoded signal of said selecting switch to alter addressable locations of said read-only memory corresponding to the binary encoded selectable positions of the multiposition switch may be directed to different zones in said memory.

5. The zone selecting switch of claim 4 wherein the channel information stored in said memory zone corresponding to a position of said zone selecting switch comprises a predetermined arbitrary grouping of said communication channels.

6. The zone selecting apparatus of claim 5 wherein said predetermined grouping of said communication channels is based upon geographic location.

7. The zone selecting apparatus of claim 5 wherein said predetermined grouping of communication channels corresponds to a public service organization constituting the primary users of the communication channels.

* * * * *